United States Patent
Laurent et al.

(10) Patent No.: US 11,152,039 B2
(45) Date of Patent: Oct. 19, 2021

(54) INPUT/OUTPUT LINE SHARING FOR MEMORY ARRAYS

(71) Applicant: Micron Technology, Inc., Boise, ID (US)

(72) Inventors: Christophe Vincent Antoine Laurent, Agrate Brianza (IT); Andrea Martinelli, Bergamo (IT)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 16/508,753

(22) Filed: Jul. 11, 2019

(65) Prior Publication Data

US 2021/0012817 A1    Jan. 14, 2021

(51) Int. Cl.
| | |
|---|---|
| *G06F 13/00* | (2006.01) |
| *G11C 7/08* | (2006.01) |
| *G06F 13/16* | (2006.01) |
| *G06F 3/06* | (2006.01) |
| *G11C 7/10* | (2006.01) |
| *G11C 8/10* | (2006.01) |
| *G11C 5/14* | (2006.01) |

(Continued)

(52) U.S. Cl.
CPC .............. *G11C 7/08* (2013.01); *G06F 3/0659* (2013.01); *G06F 3/0688* (2013.01); *G06F 13/1657* (2013.01); *G06F 13/1663* (2013.01); *G06F 13/1694* (2013.01); *G11C 5/147* (2013.01); *G11C 7/109* (2013.01); *G11C 7/1063* (2013.01); *G11C 7/1069* (2013.01); *G11C 7/1096* (2013.01); *G11C 7/12* (2013.01); *G11C 8/08* (2013.01); *G11C 8/10* (2013.01)

(58) Field of Classification Search
None
See application file for complete search history.

(56) References Cited

U.S. PATENT DOCUMENTS

| | | |
|---|---|---|
| 6,574,135 B1 | 6/2003 | Komatsuzaki |
| 9,921,777 B2 | 3/2018 | La Fratta et al. |

(Continued)

FOREIGN PATENT DOCUMENTS

WO    2017142826 A1    8/2017

OTHER PUBLICATIONS

Taiwan Intellectual Property Office, "Office Action," issued in connection with ROC (Taiwan) Patent Application No. 109119175, dated Jan. 27, 2021 (5 pages).

(Continued)

*Primary Examiner* — Midys Rojas
(74) *Attorney, Agent, or Firm* — Holland & Hart LLP

(57) ABSTRACT

Methods, systems, and devices for input/output line sharing for memory subarrays are described. I/O lines may be shared across subarrays, which may correspond to separate memory tiles. The sharing of I/O lines may allow an I/O line to carry data from one subarray in response to access commands associated with one address range, and to carry data from another subarray in response to access commands associated with another address range. In some cases, sense amplifiers and other components may also be shared across subarrays, including across subarrays in different banks. The sharing of I/O lines may, in some cases, support activating only a subset of subarrays in a bank when accessing data stored in the bank, which may provide power savings.

25 Claims, 19 Drawing Sheets

(51) Int. Cl.
*G11C 7/12* (2006.01)
*G11C 8/08* (2006.01)

(56) References Cited

U.S. PATENT DOCUMENTS

| | | |
|---|---|---|
| 10,127,955 B2* | 11/2018 | Xiao .................. G11C 8/16 |
| 2006/0158954 A1* | 7/2006 | Brox .................. G11C 7/1045 |
| | | 365/193 |
| 2008/0080280 A1 | 4/2008 | Jeong et al. |
| 2008/0205177 A1 | 8/2008 | Kim et al. |
| 2015/0332744 A1 | 11/2015 | Kim |
| 2018/0197595 A1 | 7/2018 | Saito et al. |

OTHER PUBLICATIONS

ISA/KR, International Search Report and Written Opinion of the International Searching Authority, Int'l Appl. No. PCT/US2020/035893, Sep. 25, 2020, Korean Intellectual Property Office, Seo-gu, Daejeon, Republic of Korea, 13 pgs.

* cited by examiner

INPUT/OUTPUT LINE SHARING FOR MEMORY ARRAYS

BACKGROUND

The following relates generally to a system that includes at least one memory device and more specifically to input/output line sharing for memory subarrays within a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

A memory device may include a memory array, which may further include multiple subarrays. In some cases, input/output (I/O) lines may be used to transfer data to and from a memory array, including to and from one or more subarrays within the memory array.

DETAILED DESCRIPTION

Figure 1:
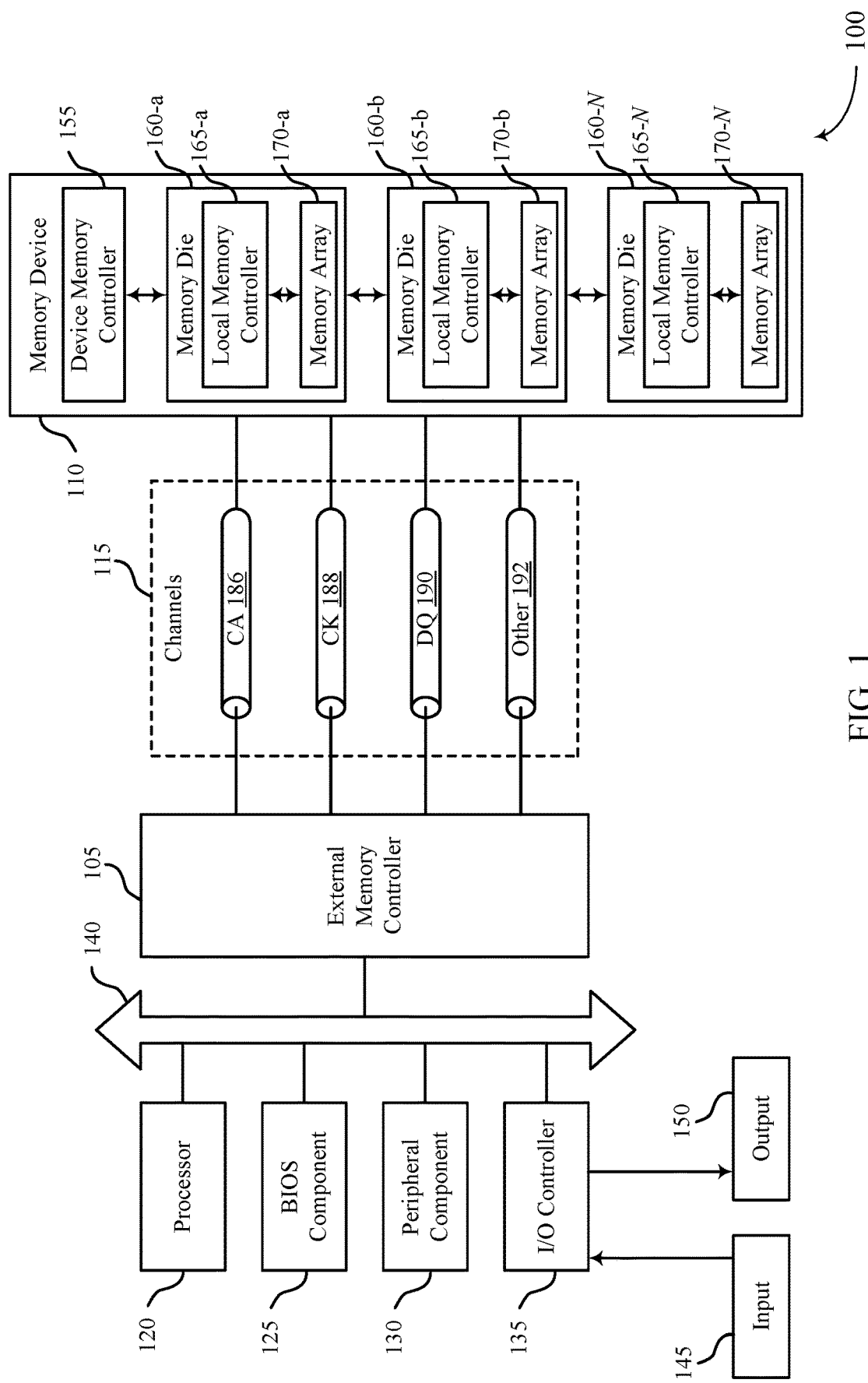
FIG. 1 illustrates an example of a system that supports input/output line sharing for memory subarrays in accordance with examples as disclosed herein.

A memory device may include a memory array, which may further include multiple subarrays. In some cases, a subarray may be referred to, and may correspond to or otherwise be included in, a memory tile or memory patch. In some cases, the subarrays of a memory array may be grouped into multiple groups, and a group of subarrays may be referred to as a memory bank or memory section. For example, the subarrays may be arranged into columns and rows (e.g., of a quilt array), and a row of subarrays may be a bank.

An access operation may access memory cells (e.g., a row of memory cells) in one or more subarrays. For example, an access operation may access memory cells in one or more subarrays of a same bank. A set of memory cells available for access (e.g., an activated row of memory cells, which may be coupled with an activated word line) may be referred to as a page of memory cells, and the number of memory cells included in the page (or an amount of data stored thereby) may be referred to as a page size. A subarray may include or be associated with (e.g., may be included in a same tile as) some number of sense amplifiers, which may be support access operations (e.g., read or write operations) for memory cells of the subarray.

Input/output (I/O) lines may be used to transfer data to and from a memory array, including to and from one or more subarrays within the memory array. As used herein, an I/O line may refer to a signal path or bus of a memory device configured to convey one or more bits of information associated with an access operation. I/O lines may include main I/O lines, which may traverse (e.g., at least partially cross, be coupled or couplable with, support transferring data for) multiple subarrays. I/O lines may also include local I/O lines, which may be configured to transfer data between a subarray and a main I/O line. In some cases, a local I/O line may be dedicated to the subarray, and, in some cases, may not cross subarray boundaries (e.g., may not extend past the edges of the subarray) or cross over or under more than one subarray.

In some cases, however, as described herein, at least some local I/O lines may be configured to transfer data to or from a selected one of at least two subarrays. That is, at least some local I/O lines may be shared (e.g., borrowed or borrowable) between two or more subarrays. Some such local I/O lines may traverse at least one subarray boundary and at least two subarrays. Additionally or alternatively, at least some local I/O lines may be configured to transfer data to or from a selected one of at least two main I/O lines.

In some cases, as described herein, a memory device may utilize multiple page modes, which may respectively correspond to multiple different page sizes. The different page sizes may, for example, be supported by the I/O line sharing techniques and configurations described herein. In some cases, a full page may refer to a page that includes memory cells (e.g., a row of memory cells) in all subarrays of a bank, and a reduced page may refer to a page that includes memory cells (e.g., a row of memory cells) in only some subarrays of the bank (e.g., in only a subset of subarrays of the bank).

In some cases, information (e.g., bits) for only a subset of the memory cells in an open (e.g., activated) page may be transferred into or out of the memory device (e.g., into or out of the array). For example, subarrays may include memory cells organized into rows and columns, and a column mask—which may alternatively be referred to as or be indicated by a column select or column address—may be included in or otherwise associated with an access command (e.g., a read or write command) and may specify only a subset of memory cells (e.g., selected memory cells, selected columns) in an activated row for reading or writing into or out of the array or device. Unselected memory cells in the page may be accessible and, in some cases, may be sensed (e.g., read) (e.g., for write-back or refresh purposes), but corresponding data may not be transferred into or out of the array or device (e.g., may not be carried by an main I/O lines). The quantity of information transferred into or out of the memory device in association with (e.g., as a result of, to perform or execute) one access operation may be referred to as a data packet, a data burst, or a codeword.

Thus, in comes cases, for all pages sizes supported by a memory device (e.g., a full page size or a reduced page size), the codeword for an access operation may be of a same size (e.g., smaller than the operative page size), and thus a same quantity of information (e.g., bits) may be transferred into or out of a memory array (e.g., into or out of a bank of the memory array), even though a different number of memory cells may be included in the open page depending on the page size. Thus, in some cases, for all page sizes supported by the memory device, an access operation may cause a same quantity of information (e.g., bits) to be carried by the main I/O lines for the memory device or a bank thereof.

In some cases, a reduced page mode may be used to reduce the amount of power used by the memory device. For example, when the device has been placed in the reduced page mode, which may alternative be referred to as a low or reduced power mode, a command (e.g., an activation command) may indicate only a subset of the subarrays within a bank for activation (e.g., by indicating a range of column addresses, where different subarrays within a bank are associated with different ranges of column addresses), and only those subarrays indicated for activation may be activated—other tiles subarrays within the bank may be left deactivated. Thus, in some cases, power consumption may be reduced by reducing the number of activated subarrays within an activated bank, and thus the number of memory cells included in the open page. For example, one or more aspects of circuitry associated with subarrays that remain deactivated may remain deactivated. Additionally or alternatively, no memory cells in the subarrays that remain deactivated may be sensed, which may, over time, reduce the number of times individual memory cells are accessed and thus may further improve the efficiency and lifetime of the memory device. One of ordinary skill in the art may appreciate these and other benefits.

Some memory devices may enable the activation of only a subset of the subarrays in an activated bank by implementing one or more shunts between pairs or other sets of subarrays within a bank. For example, two subarrays within the bank may be configured such that, when the memory array is operating in the reduced page mode, one of the two subarrays is to remain deactivated when the other activated. A shunt may be implemented to combine or otherwise couple a first local I/O line associated with one of the two subarrays with a second local I/O line associated with the other of the two subarrays (e.g., may short together individual traces or other structures within the first local I/O line with corresponding traces or other structures in the second local I/O line). In such cases, one of the two subarrays may correspond to (e.g., be addressable using) half of the column address space (e.g., range), and the other of the two subarrays may correspond to (e.g., be addressable using) the other half of the column address space. The shunt may include a data path that may be configured to carry data from the first subarray to a second main I/O line associated with (e.g., traversing, underlying) the second subarray when the second subarray is accessed, and to carry data from the second subarray to a first main I/O line associated with (e.g., traversing, underlying) the first subarray when the first subarray is accessed. The shunt may so operate even when both subarrays are activated, but may also support deactivating an unaccessed one of the two subarrays when the reduced page mode is used.

Though certain examples herein may be provided in the context of ferroelectric memory devices, the teachings herein may be applied to a wide range of memory devices. For example, structures and techniques as described herein may be used in ferroelectric or other memory devices in which logic or other circuitry may be placed below or above memory cells of the memory array (e.g., closer to, or farther from a substrate than the memory cells of memory array, overlapping the array in area). For example, main and local I/O lines and other structures described herein may be placed above or below the subarray, along with circuitry related to operating the I/O lines, such as one or more drivers. As another example, structures and techniques as described herein may be used in ferroelectric or other memory devices that sense a greater number of memory cells than the number of bits included in a codeword. These along with other applications and benefits will be appreciate by one of ordinary skill in the art.

Features of the disclosure are initially described in the context of a memory system and memory die as described with reference to FIGS. 1-3. Features of the disclosure are described in the context of example memory arrays as described with reference to FIGS. 4-16. These and other features of the disclosure are further illustrated by and described with reference to an apparatus diagram and flowcharts that relate to input/output line sharing for memory subarrays as described with references to FIGS. 18 and 19.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card. In some cases, the host device may transmit, to the memory device 110, an access command associated with data for a first memory section. The first memory section may include a respective set of subarrays (e.g., tiles, patches) of the memory device 110. The first memory section may be located between a second memory section and a third memory section. A first set of circuitry shared by the first memory section and the second memory section may be operated using drivers associated with the first memory section and drivers associated with the second memory section. A second set of circuitry shared by the first memory section and the third memory section may be operated using drivers associated with the first memory section and drivers associated with the third memory section. An access operation may be performed on the first memory section based on operating the first set of circuitry and the second set of circuitry. Such a pattern of sections, shared circuitry, and driver borrowing may be repeated across any number of memory sections. The host device may receive the data for the first subarray or tile based on coupling a first sense component, or portion thereof, with a first I/O line or bus and a second sense component, or portion thereof, with a second I/O line or bus.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some cases, the components of the system 100 (e.g., a memory device 110) may include sense components, I/O buses or lines, drivers, or shunts, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may include multiple memory sections and memory tiles as described herein. A memory array 170 may be a collection (e.g., a grid) of memory cells, with each memory cell being configured to store at least one bit of digital data. Features of memory arrays 170 and/or memory cells are described in more detail below, including with reference to FIG. 2.

In various examples, a device memory controller 155 of a memory device 110, or one or more local memory controllers 165 of a memory device 110, may be considered as or perform operations associated with an input/output component of the memory device 110 (e.g., for communication of information associated with access commands). In some examples, the memory device 110 may receive an access command associated with data of the memory device 110. In some cases, the memory device 110 may receive (e.g., prior to receiving the access command) an activation command that indicates an address range (e.g., a range of column addresses) for the access command as corresponding to only a subset of subarrays within a bank of the memory device. In some cases, the memory device 110 may also receive (e.g., prior to receiving the activation command) a command to operate the memory device 110 according to a power mode or configuration, such as a reduced power mode. When operating in the reduced power mode, the memory device 110 may be configured to activate only the indicated subset of the subarrays within the target bank (and to leave deactivated other subarrays within the target bank). The memory device 110 may thus, while executing the access operation on one portion of the target bank, place in or otherwise maintain in a deactivated mode other portions of the target bank, thereby conserving power, among other benefits.

In some examples, the memory device 110 may receive an access command associated a first memory section of the memory device 110. The first memory section may be located between a second memory section and a third memory section. The device memory controller 155 may be coupled with sets of drivers and provide control signals to each set of drivers for sets of shared circuitry common to respective memory sections. For example, a first set of circuitry may be shared by the first memory section and the second memory section using drivers associated with the first memory section and drivers associated with the second memory section. A second set of circuitry shared by the first memory section and the third memory section using drivers associated with the first memory section and drivers associated with the third memory section. An access operation may be performed associated with data for the first section based at least in part on operating the first set of circuitry and operating the second set of circuitry.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, or software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

The components of the system 100 may exchange information with the memory device 110 using a plurality of channels 115. In some examples, the channels 115 may enable communications between the external memory controller 105 and the memory device 110. Each channel 115 may include one or more signal paths or transmission media (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (e.g., including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any number of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, a memory die 160 may include one or memory arrays 170, and a memory array 170 may include a plurality of memory tiles. In some cases, memory tiles within a memory array 170 may be organized into groups for concurrent access, and such groups may be referred to as banks or sections. In some cases, memory tiles may be organized into rows and columns within the memory array 170, which may, in some cases, be referred to as a quilt architecture, and a row of the memory array 170 may be a section. Each of the memory tiles may include an array layer and a circuit layer. For each memory tile, the array layer may include a plurality of memory cells (e.g., a subarray, a portion of a memory array 170) and the circuit layer may include circuitry corresponding to (e.g., dedicated to, specific to, primarily assigned to) the plurality of memory cells of the array layer, such as decoding circuitry, multiplexing circuitry, driver circuitry, sensing circuitry, or other circuitry that is specific to the memory tile (though, in some cases, circuitry that is specific to the memory tile may be accessible by one or more neighboring tiles via multiplexing or other switching circuitry, along with one or more interconnections). The memory device may also include data path circuitry that is shared by the plurality of memory tiles (e.g., corresponding to operating the bank of memory tiles, corresponding to data exchange between the bank of memory tiles and a local memory controller 165, available to multiple memory tiles and selectively used for one or more of the multiple memory tiles at a time), and is distributed across the circuit layer of two or more memory tiles of the plurality of memory tiles (e.g., the circuit layers of all of the plurality of memory tiles, the circuit layers of a subset of the plurality of memory tiles). In some cases, sets of shared circuitry may include sets of data path circuitry configured to transfer information associated with access operations for memory cells in a respective first memory section and for memory cells in a respective second memory section. Thus, in some examples, a memory die 160 may include various types of circuitry that are distributed across circuit layers of a plurality of memory tiles, where tile-specific circuitry is included in the circuit layer of a corresponding memory tile, and data path circuitry (e.g., bank-specific circuitry) is distributed across remaining space of the circuit layer of the memory tiles (e.g., in spaces of the circuit layers not occupied by tile-specific circuitry). In some examples, one or more local I/O lines may be shared between memory tiles, which may support various techniques for selectively activating and deactivating (e.g., maintaining as deactivated) subsets of memory tiles to support various page size modes or reduced power modes.

Figure 2:
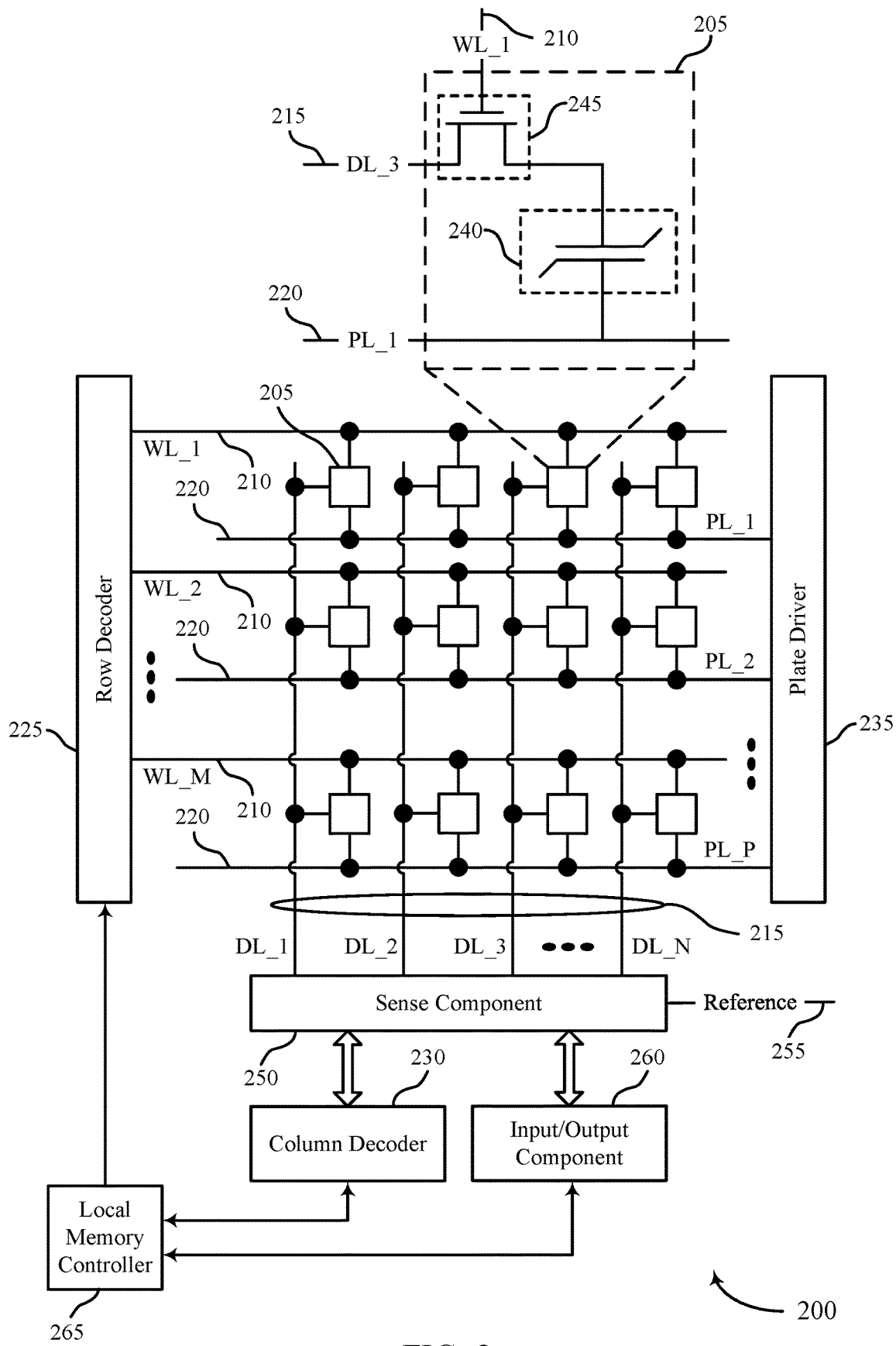
FIG. 2 illustrates an example of a memory die that supports input/output line sharing for memory subarrays in accordance with examples as disclosed herein.

FIG. 2 illustrates an example of aspects of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of information at a time (e.g., a logic 0 and a logic 1). In some cases, a single memory cell 205 (e.g., a multi-level memory cell) may be configured to store more than one bit of information at a time (e.g., a logic 00, logic 01, logic 10, or a logic 11). In some examples, the memory cells 205 of the memory die 200 may include a plurality of memory sections, where each of the sections includes or otherwise corresponds to a plurality of tiles or patches.

A memory cell 205 may store a state (e.g., polarization state or dielectric charge) that represents digital data. In FeRAM architectures, the memory cell 205 may include a capacitor 240 that includes a ferroelectric material to store a charge and/or a polarization representative of the programmable state. In DRAM architectures, the memory cell 205 may include a capacitor 240 that includes a dielectric material to store a charge representative of the programmable state. In other memory architectures, a memory die 200 in accordance with the described techniques may implement other types of memory elements or storage elements. For example, a memory die 200 may include memory cells 205 with a configurable material memory element (e.g., in place of the illustrated capacitor 240) that stores a logic state as a material property of the material memory element. Such material properties may include a programmable resistance (e.g., for a phase change material memory element that can be programmed with different resistances, in a PCRAM application), a programmable threshold voltage (e.g., for a material memory element that can be programmed with different threshold voltages, such as by write operations with different current pulse duration, amplitude, or polarity), and other characteristics that can be selectively programmed to store a logic state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

A memory device that includes the memory die 200 may receive an access command (e.g., from a host device). In some cases, an access command may indicate an address range for the access command as corresponding to a first subarray of the memory die 200. In such cases, the access command may be associated with data for the first subarray. The sense component 250, or portions thereof, may be coupled with components of the memory die 200 based on receiving the access command and sense logic states stored by memory cells 205.

In some cases, an access command may indicate an address range for the access command as corresponding to one or more subarrays of the memory die 200 (e.g., as corresponding to a memory section of the memory die 200). In such cases, the access command may be associated with data for the memory section. A host device may transmit an access command associated with data for a first memory section. The first memory section may be located between a second memory section and a third memory section. A first set of circuitry shared by the first memory section and the second memory section may be operated using drivers associated with the first memory section and drivers associated with the second memory section. A second set of circuitry shared by the first memory section and the third memory section may be operated using drivers associated with the first memory section and drivers associated with the third memory section. An access operation may be performed based on operating the first set and the second set of circuitry. The sense component 250, or portions thereof, may be coupled with the first set of circuitry and the second set of circuitry based on receiving the access command and sense logic states stored by memory cells.

The memory cell 205 may include a logic storage component, such as capacitor 240 or other storage element or memory element (e.g., a configurable material), and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. However, in various examples, memory architectures that support the described techniques may or may not include a switching component 245 as part of, or otherwise associated with a respective memory cell 205. In some cases, plate lines 220 may be coupled with a cell plate reference voltage, such as Vpl, or may be a ground or chassis ground voltage, such as Vss. In some cases, plate lines 220 may refer to a plate or electrical node that is common to all of the memory cells 205, or a plate or electrical node that is common to a subset of the memory cells 205 or a subset of plate lines, or another electrical node coupled with a plate line driver.

Selecting or deselecting the memory cell 205 may be accomplished by activating or deactivating the switching component 245, or otherwise activating relevant access lines. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation may be controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be relatively small, in some cases. As such, the sense component 250 may include one or more sense amplifiers to amplify the signal output of the memory cell 205. The sense amplifiers may detect small changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output component 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

The sense component 250 may include any number of sense amplifiers. A sense amplifier may be configured to sense data from a respective memory tile as well as one or more neighbor memory tile. For example, the sense amplifier may be included in a circuit layer of the respective memory tile, and may be configured to be coupled with memory cells in an array layer of the respective memory tile, but (e.g., via multiplexing or other switching circuitry or interconnections) may also be configured to be coupled with memory cells included in an adjacent memory tile, where the adjacent memory tile may be in the same section or a different section than the respective memory tile. For example, the sense component 250, or a portion thereof, may be configured to sense data from a first subarray of the memory die 200 or a second subarray of the memory die 200 based on an activation command that indicates an address range for the access command as corresponding to the first subarray or the second subarray. In such cases, the sense component 250 may be activated. In some cases, the sense component 250 may be deactivated based on the access command corresponding to the first subarray or the second subarray of the memory die 200.

The detected logic state of the memory cell 205 may be provided as an output of the sense component 250 (e.g., to an input/output component 260), which may be used to indicate the detected logic state to another component of a memory device 110 that includes the memory die 200, such as a device memory controller 155 (e.g., directly or using the local memory controller 265). The input/output component 260, or other component between the sense component 250 and the input/output component 260, may include various components or circuitry that support the communication of information between memory cells 205 (e.g., by way of the sense component 250, sense amplifiers of the sense component 250) and the local memory controller 265. Such components or circuitry may be referred to as data path circuitry, and may support operations such as signal amplification, redundancy, error detection, error correction, and other operations.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform or control a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform or control a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 (e.g., a sense amplifier of the sense component 250) may amplify the signal. The local memory controller 265 may fire the sense component 250 (e.g., latch a sense amplifier of the sense component 250) and thereby compare the signal received from the memory cell 205 to the reference signal 255. Based on that comparison, the sense component 250 may determine a logic state that is stored on the memory cell 205. In some examples, the local memory controller 265 may communicate the logic state stored on the memory cell 205 to an external memory controller 105 or a device memory controller 155 as part of the read operation. In some examples, other operations may be performed between sensing a logic state of a memory cell 205 and communicating information to or from an external memory controller 105 or device memory controller 155 (e.g., by the input/output component 260), such as signal amplification, redundancy operations, or error correction operations.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

In some examples, the memory die 200 may include a plurality of memory tiles or patches, where each of the memory tiles of the memory die 200 includes an array layer and a circuit layer. For each memory tile, the array layer may include a plurality of memory cells 205 and the circuit layer may include circuitry corresponding to (e.g., dedicated to, specific to, primarily assigned to) the plurality of memory cells of the array layer, such as decoding circuitry, sensing circuitry, or other circuitry that is specific to the memory tile (e.g., of a row decoder 225, of a column decoder 230, of a sense component 250). The memory device may also include data path circuitry (e.g., of an input/output component 260, of a local memory controller 265) that is shared by the plurality of memory tiles and is distributed across the circuit layer of two or more memory tiles of the plurality of memory tiles. Thus, in some examples, the memory die 200 may include various types of circuitry that are distributed across circuit layers of a plurality of memory tiles, where tile-specific circuitry is included in the circuit layer of a corresponding memory tile, and data path circuitry (e.g., bank-specific circuitry) is distributed across the memory tiles (e.g., in space of the circuit layer not occupied by tile-specific circuitry).

Figure 3:
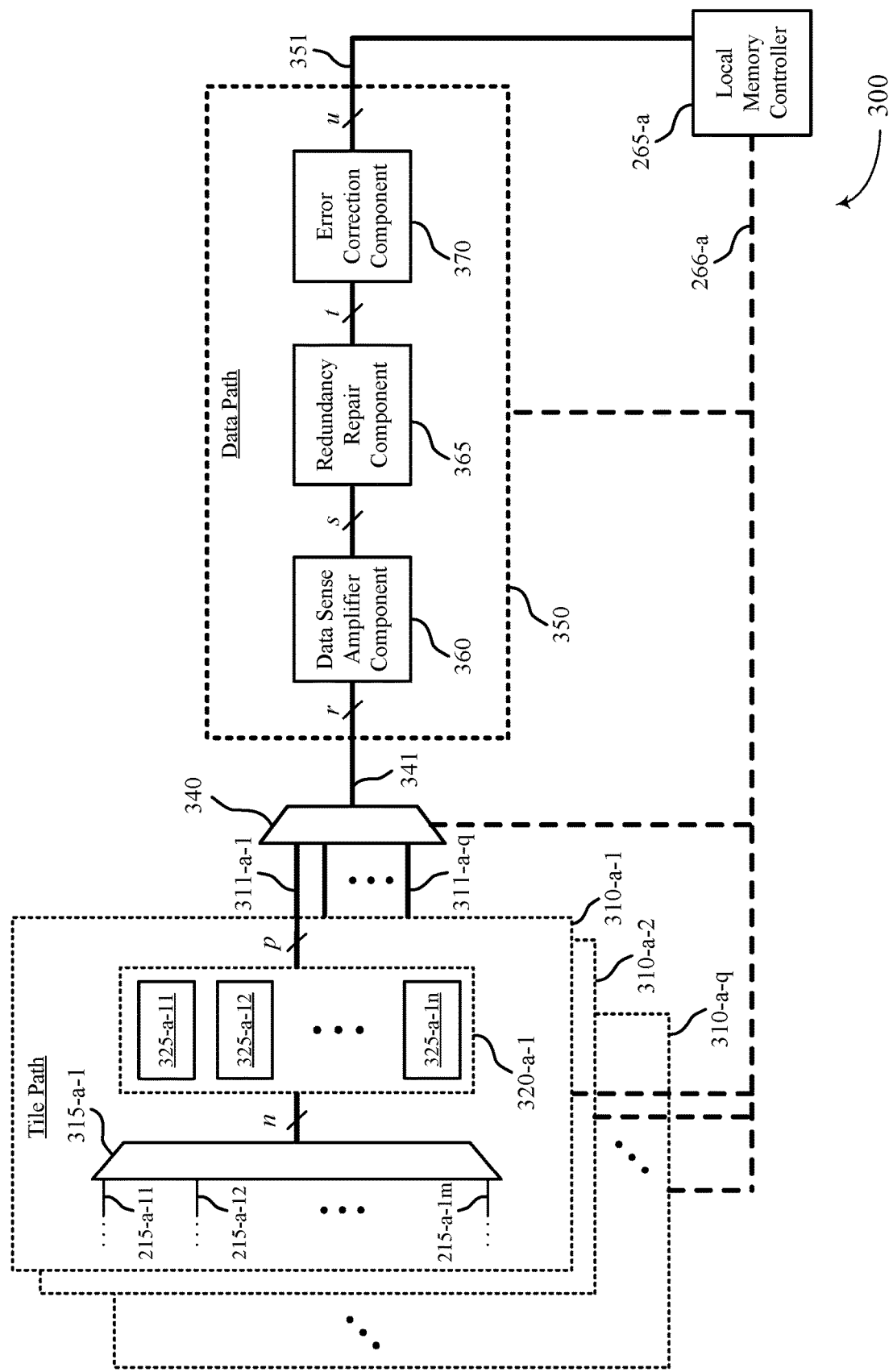
FIG. 3 illustrates an example of a memory layout that that supports input/output line sharing for memory subarrays in accordance with examples as disclosed herein.

FIG. 3 illustrates an example of a memory layout 300 that supports input/output line sharing for memory subarrays in accordance with examples as disclosed herein. The memory layout 300 may be included in or otherwise illustrate aspects of a memory die, such as a memory die 160 described with reference to FIG. 1 or a memory die 200 described with reference to FIG. 2. The memory layout 300 illustrates an example where a set of tile paths 310 (e.g., tile paths 310-*a*-1 through 310-*a*-*q*) may be selectively coupled with a data path 350 using a tile multiplexer 340.

The data path 350 may be communicatively coupled with a local memory controller 265-*a* over a data path bus 351 (e.g., a data bus) to support various access operations described herein (e.g., read operations, write operations, rewrite operations, refresh operations, exchanging data or information with a host of a memory device that includes the memory layout 300). In some examples, the data path 350, the tile multiplexer 340, or both may be considered to be included in an input/output component (e.g., an input/output component 260 described with reference to FIG. 2), or the data path 350 may be considered to be in communication between an array of memory cells 205 and an input/output component. In some examples, circuitry or operations related to information transfer with a memory array may be associated with the local memory controller 265-*a*, and the data path 350 may be an example of circuitry configured to process data or information communicated between the memory array and the local memory controller 265-*a* (e.g., where the local memory controller 265-*a* is part of, or otherwise performs functions related to an input/output of a memory device). In some examples, the local memory controller 265-*a* may be configured to control timing (e.g., timing of sense amplifier arrays 320-*a*, timing of sense amplifiers 325-*a*) or triggering of various operations or components of the tile paths 310, tile multiplexer 340, and the data path 350, which may include control signaling conveyed over a control bus 266-*a*, having one or more signal paths, that is shared or otherwise corresponds to all of the tile paths 310-*a*-1 through 310-*a*-*q* and the data path 350 (e.g., shared by a memory section or memory bank associated with the tile paths 310-*a*-1 through 310-*a*-*q*).

In the example of memory layout 300, interconnections between components are illustrated by buses (e.g., data buses, control buses) that may support multiple bits of information transfer. For example, the data path bus 351 may be associated with u bits of data transfer between the data path 350 and the local memory controller 265-*a*. In some examples, a quantity of bits of data transfer associated with a bus of the memory layout 300 may correspond to a number of discrete conductive signal paths (e.g., traces, wires, lines). For example, the data path bus 351 may be associated with u individual conductors or conductive traces between the data path 350 and the local memory controller 265-*a*. In other examples, components that communicate over a bus in the memory layout 300 may support a multi-level communication scheme, a multi-symbol communication scheme, a burst communication scheme, or some other signal modulation scheme that supports a particular quantity of bits of data transfer. For example, when the data path 350 and the local memory controller 265-*s* support a multi-symbol modulation scheme (e.g., a PAM3 scheme, a PAM4 scheme), the data path bus 351 may have fewer than u discrete signal paths to support the communication of u bits of data transfer. Although aspects of the buses of the memory layout 300 may be described with reference to a read operation or a write operation, buses of the memory layout 300 may be bidirectional buses that, in some examples, support both read operations and write operations. Accordingly, each end of a given bus of the memory layout 300 may be configured with a signal receiver, or a signal driver, or both a signal receiver and a signal driver.

The tile paths 310-*a* may be illustrative of circuit paths that support conveying, multiplexing, modifying, or otherwise processing signals between memory cells 205 (not shown) of a particular memory tile and the data path 350. In some examples, each of the tile paths 310-*a* may include or otherwise be associated with a unique or dedicated array of memory cells 205 that correspond to the respective tile path 310 or memory tile (e.g., a subarray of memory cells 205, memory cells 205 located in an array layer of the memory tile). Each of the tile paths 310-*a* may also be associated with a corresponding tile bus 311-*a* that is configured to convey one or more signals (e.g., carrying p bits of information) between the respective tile path 310-*a* and the tile multiplexer 340. In various examples, a tile bus 311 may be referred to as a local I/O bus or line of a memory tile or tile path 310-*a* or may refer to a set of more than one local I/O bus or line of a memory tile or tile path (e.g., where the respective tile bus 311-*a* is subdivided for various multiplexing or routing operations). Although certain details are illustrated with reference to the tile path 310-*a*-1, such details may be repeated in each of tile paths 310-*a*-2 through 310-*a*-*q*.

In the example of memory layout 300, each of the tile paths 310-*a* may include or otherwise correspond to a set of digit lines 215-*a* (e.g., digit lines 215-*a*-11 through 215-*a*-1*m* of tile path 310-*a*-1, a set of m digit lines 215-*a*), which may be examples of the digit lines 215 described with reference to FIG. 2. For example, each of the digit lines 215-*a* of the tile path 310-*a*-1 may be coupled with a respective switching component 245 of each of a set of memory cells 205 (e.g., a column of memory cells 205 of or corresponding to the tile path 310-*a*-1), where the respective switching component 245 may be configured to selectively couple a storage element of the memory cell 205 (e.g., a capacitor 240, a material memory element, another type of memory storage element) with the digit line 215-*a*. Accordingly, each of the memory cells 205 of or corresponding to the tile path 310-*a*-1 may be coupled with one of the digit lines 215-*a*-11 through 215-*a*-1*m*. In various examples, such a coupling between memory cells 205 and a digit line 215-*a* may be a direct coupling (e.g., directly along a conductive path or access line), or an indirect coupling (e.g., via circuit components or signal processing circuitry). For example, a digit line 215-*a* may include or otherwise be associated with signal development circuitry such as an amplifier, a cascode, a charge transfer sensing amplifier (CTSA), an amplification capacitor, and others.

For each of the tile paths 310-*a*, a row of memory cells 205 of the tile path 310-*a* may be selected or selectively activated by activating a word line 210 (not shown) that is included in the tile path 310-*a*, or otherwise corresponds to the tile path 310-*a* (e.g., is included in the memory tile corresponding to the tile path 310-*a*). For example, activating a word line 210 of or corresponding to the tile path 310-*a*-1 may couple a row or page of capacitors 240, material memory elements, or other type of memory storage elements, of respective memory cells 205 with a respective one of the digit lines 215-*a*-11 through 215-*a*-1*m*. In various examples, tile paths 310 may or may not include drivers, buffers, or multiplexers (e.g., a row decoder 225, or portion thereof, as described with reference to FIG. 2) to selectively activate word lines 210 or other selection lines.

For each of the tile paths 310-*a*, various ones of the set of m digit lines 215-*a* may be selectively coupled with or routed to a respective sense amplifier array 320-*a* of the tile path 310-*a* using a digit line multiplexer 315-*a*. For example, tile path 310-*a*-1 may include a sense amplifier array 320-*a*-1 having n sense amplifiers 325-*a* (e.g., sense amplifiers 325-*a*-11 through 325-*a*-1*n*). Thus, the digit line multiplexer 315-*a*-1 may be configured for selective coupling or mapping between m signal paths associated with digit lines 215-*a*-11 through 215-*a*-1*m* and *n* signal paths associated with the sense amplifier array 320-*a*-1 (e.g., n sense amplifiers 325-*a*). In some examples, the sense amplifier arrays 320-*a* may be considered to be included in, or otherwise refer to functions or circuitry of a sense component 250 described with reference to FIG. 2.

The sense amplifiers 325-*a* may include circuitry configured to latch a signal indicative of a logic state stored by a memory cell 205, such as sets of cross-coupled transistors that latch an output based on a comparison of a read signal from the memory cell 205 with a reference signal. In some examples, the sense amplifiers 325-*a* or some other portion of the sense amplifier array 320-*a* may include circuitry configured to generate or develop such read signals (e.g., based at least in part on a selective coupling with a memory cell 205) or generate or develop such reference signals. In some examples, the sense amplifiers 325-*a* may also be configured to generate or develop write signals to a digit line 215-*a* or a memory cell 205 (e.g., based at least in part on a write command of the local memory controller 265-*a*).

The digit line multiplexers 315-a, the sense amplifier arrays 320-a, and other circuitry corresponding to a given memory tile may be located in a circuit layer or level of a memory tile (e.g., a circuit level 450 of the memory tile 400, described with reference to FIG. 4), and the corresponding memory cells 205 of the memory tile may be located in an array layer or level of the memory tile (e.g., an array level 410 of the memory tile 400, described with reference to FIG. 4). In some cases, a circuit layer or level may be below (e.g., nearer to a substrate than) an array layer or level of the memory tile. In some cases, aspects of a line or bus as described herein (e.g., all or portions of a line or bus) may be located in a circuit layer or level of one or more memory tiles, a routing layer or level of one or more memory tiles (e.g., one or more metallization layers), a routing layer or level of a memory section or bank, or various combinations thereof. In various examples, an array layer or level may be between the circuit layer or level and one or more routing layers or levels. In some examples, one or more sockets (e.g., vias, conductive plugs) may provide interconnections between components at different layers or levels of a memory tile or memory bank. In some cases, sockets may be located between memory tiles within an array (e.g., in gaps between different memory tiles).

Control signal drivers that output control signals and control the timing signals of the sense amplifiers 325-a may also be located below an array level or layer of the memory tile (e.g., in a circuit level). In some cases, the control bus 266 or local memory controller 265 may provide inputs to one or more control signal drivers. In some cases, a set of drivers may be common to or otherwise correspond to a respective memory section of memory tiles and coupled to a set of shared circuitry by conductors. (e.g., conductive lines, sockets). In some cases, the set of drivers may include drivers of a first type (e.g., configured to generate a first type or set of control signals) and drivers of a second type (e.g., configured to generate a second type or set of control signals). The drivers of the first type may be coupled with a first set of shared circuitry that is common to the respective memory section and a second memory section. The drivers of the second type may be coupled with a second set of shared circuitry that is common to the respective memory section and a third memory section. In some cases, the first set of shared circuitry includes a first set of sense amplifiers 325-a. A first subset of the first set of sense amplifiers 325-a underlies memory tiles of the respective memory section and a second subset of the first set of sense amplifiers 325-a underlies memory tiles of the second memory section. A second set of shared circuitry may include a second set of sense amplifiers 325-a. A first subset of the second set of sense amplifiers 325-a underlies memory tiles of the respective memory section and a second subset of the second set of sense amplifiers 325-a underlies memory tiles of the third memory section. Additionally or alternatively, the first set of shared circuitry may include data path circuitry shared by (borrowed between) memory tiles of the respective memory section and memory tiles of the second. memory section, and the second set of shared circuitry may include data path circuitry shared by (borrowed between) memory tiles of the respective memory section and memory tiles of the third memory section.

Each of the sense amplifiers 325-a may be configured to receive a signal from a respective memory cell 205 over a respective digit line 215-a according to a particular selection, mapping, or other configuration of the respective digit line multiplexer 315-a. For example, when the digit line multiplexer 315-a-1 is configured for coupling the sense amplifier array 320-a-1 with a subset of the digit lines 215-a-11 through 215-a-1m (e.g., a portion or subset of a row, a portion or subset of a page, when n<m), the digit line multiplexer 315-a-1 may receive a signal (e.g., from the local memory controller 265-a, over the control bus 266-a) to couple a particular subset of the digit lines 215-a-11 through 215-a-1m according to a particular access operation. In some examples, a memory layout may include a sense amplifier 325 for each of the digit lines 215 in a tile path 310 (e.g., where n=m), in which case a digit line multiplexer 315 may be omitted from the tile path 310.

The sense amplifier arrays 320-a (e.g., each of the sense amplifiers 325-a) may output signals indicative of the logic state stored by respective memory cells 205 (e.g., when performing functions of a read operation). In some examples, the output of a sense amplifier 325-a when reading a set of logic states that may be stored by the memory cells 205 may be associated with a relatively narrow or small voltage swing (e.g., a relatively small range of voltages for indicating the set of logic states, compared to a voltage swing used in a portion of or at an output of the data path 350). Using a relatively narrow voltage swing at the sense amplifiers 325-a may mitigate the risk of signal disturbance (e.g., due to capacitive or other cross-coupling or crosstalk) of concurrently transmitted signals or of data states stored in memory cells 205, and may also support corresponding components or circuitry occupying a relatively small area, or relatively thin dielectric separation between components or conductors of a tile path 310-a (e.g., between sense amplifiers 325-a, between conductive lines of a bus to or from a tile path 310-a, between memory cells 205), or relatively low charge accumulation or signal attenuation (e.g., related to capacitive loading such as intrinsic capacitance of access lines between a memory cell 205 and the data path 350), or relatively low charge leakage or power consumption in a tile path 310-a (e.g., related to charge leakage between components of the memory layout 300, related to charge leakage across portions meant to be electrically isolated by a dielectric portion, related to powering voltage sources or drivers for operating the memory layout 300).

In some examples, a sense amplifier array 320 may additionally include a sense amplifier selection component or multiplexer (not shown) which may be configured to select, enable, activate, latch, or route signals from a subset (e.g., fewer than all) of the sense amplifiers 325 of the sense amplifier array 320 (e.g., based on a column address associated with an access command). For example, such a selection component or multiplexer may select or activate half of the sense amplifiers 325 of the sense amplifier array 320, a quarter of the sense amplifiers 325 of the sense amplifier array 320, and so on (e.g., in response to signaling received from the control bus 266-a). When supporting read operations, for example, the output of such a sense amplifier array 320 may accordingly be configured to output fewer bits of data transfer than a number of sense amplifiers 325 in the sense amplifier array 320.

In some examples, a sense amplifier array 320 of one tile path 310, or a portion thereof, may be configured for a selective coupling with another tile path 310. In a partially-powered or partially-operational mode of a memory device, for example, the memory layout 300 may support a selective activation, deactivation, or idling of certain memory tiles or tile paths 310. In such examples, a sense amplifier array 320 or portion thereof (e.g., a subset of sense amplifiers 325) of a deactivated or idled memory tile may be shared, shunted, or otherwise coupled with an activated memory tile (e.g., an array of memory cells 205 of an activated memory tile, a sense amplifier array 320 of an activated memory tile). Thus, in some examples, a sense amplifier array 320 or a set of sense amplifiers 325 may be primarily dedicated to a certain memory tile or tile path 310, but, in some cases (e.g., certain operational modes), a sense amplifier array 320 or a set of sense amplifier 325 may be shared with another memory tile or tile path 310 (e.g., an adjacent memory tile or tile path 310). In other examples, a sense amplifier array 320 may be included in, or otherwise considered to be a part of a data path 350.

In some examples, a sense amplifier array 320, or another portion of a tile path 310, may include buffering functions or circuitry (e.g., a row buffer, a page buffer, a prefetch buffer). To support aspects of a read operation, for example, such a buffer may be configured to maintain or store signals corresponding to detected logic states that are not passed to the tile multiplexer 340 in a given operation (e.g., a subset of a row, a subset of a page). In various examples, such a buffering function may be configured to pass the stored signals to the tile multiplexer 340 at a later time or use such stored signals to support a write-back or rewrite command (e.g., rewriting a detected logic state to a memory cell 205).

Accordingly, in some examples, the side of a sense amplifier array 320 that is electrically coupled towards a data path 350 (e.g., coupled with a respective tile bus 311-*a*) may be configured to support a smaller number of bits of data transfer than the side of the sense amplifier array 320 that is electrically coupled towards digit lines 215 or memory cells 205 of a corresponding memory array (e.g., where p<n). In other examples, such a selection component or multiplexer may be omitted, and the side of a sense amplifier array 320 that is electrically coupled towards a data path 350 may be configured to support a same number of bits of data transfer as the side of the sense amplifier array 320 that is electrically coupled towards digit lines 215 or memory cells 205 of a corresponding memory array (e.g., where p=n).

The set of tile paths 310-*a* (e.g., the sense amplifier arrays 320-*a*), or various portions thereof, may be selectively coupled with the data path 350 using a tile multiplexer 340. In the example of memory layout 300, the tile multiplexer 340 is coupled with the respective tile bus 311-*a* for each of the tile paths 310-*a* (e.g., tile buses 311-*a*-1 through 311-*a*-*q*, a set of local I/O buses or lines), where each of the tile buses 311-*a* may be configured to carry p bits of information. Accordingly, where each of the p bits of information are carried on distinct signal paths, the tile multiplexer 340 may be configured for selective coupling or mapping of (p×q) signal paths on the array side of the tile multiplexer 340. On the data path side, the tile multiplexer 340 may be configured to carry r bits of information (e.g., corresponding to r digit lines 215-*a*, corresponding to r memory cells 205), and where each of the r bits of information are carried on distinct signal paths, the tile multiplexer 340 may be configured for selective coupling or mapping of r signal paths. In other words, the tile multiplexer 340 may be configured for selective coupling or mapping between (p×q) signal paths associated with tile buses 311-*a* and *r* signal paths associated with the data path 350 (e.g., a tile multiplexer bus 341). In some examples, the circuit path between the tile paths 310-*a* and the data path 350 (e.g., the circuit between sense amplifier arrays 320-*a* and a data sense amplifier component 360, including the tile buses 311-*a*, the tile multiplexer 340, and the tile multiplexer bus 341) may be referred to as a column path circuit.

In various examples, the tile multiplexer 340 may receive a signal (e.g., from a local memory controller 265) to couple the data path 350 with a particular tile path 310-*a*, or with portions of more than one tile path 310-*a*, according to a particular access operation. In one example, the tile multiplexer 340 may be configured to access memory tiles one-at-a-time, such that the data path 350 is coupled with r signal paths from a single memory tile (e.g., from r digit lines 215-*a* of a single tile bus 311-*a*). In another example, the tile multiplexer 340 may be configured to multiple access memory tiles at a time, such that the data path 350 is coupled a subset of r signals from a one memory tile (e.g., a first tile bus 311-*a*) and another subset of r signals from another memory tile (e.g., a second tile bus 311-*a*). For example, the tile multiplexer bus 341 may refer to a collection of main I/O lines, where one or more of the main I/O lines may be shared across a set of memory tiles or tile paths 310-*a* (e.g., a column of memory tiles, a row of memory tiles), and main I/O lines may be selectively coupled (e.g., by a portion of the tile multiplexer 340) with a local I/O line corresponding to one or more of the set of memory tiles or tile paths 310-*a*. In some examples, the tile multiplexer 340 may support accessing memory tiles one-at-a-time and many-at-a-time, and a selection between the two may be made at a local memory controller 265 for supporting a particular access operation, a particular mode of operation, or a particular configuration in a given application or installation.

Although the tile multiplexer 340 is illustrated as a single component, in some examples, various functions or subcomponents of the tile multiplexer 340 may be distributed in different portions of the memory layout 300 (e.g., as a distributed transistor network or selector network). For example, selective coupling, mapping, or routing at a first granularity or regularity may be accomplished by a first set of subcomponents, which may be part of the data path 350, and selective coupling, mapping, or routing at a second granularity or regularity may be accomplished by a second set of subcomponents, which may be distributed across the tile paths 310-*a*-1 through 310-*a*-*q*. Accordingly, the tile paths 310-*a* may include various circuitry that is dedicated to, or otherwise corresponds to operating respective memory tiles of a set of memory tiles, the data path 350 may include various circuitry that is dedicated to, or otherwise corresponds to operating all of the set of memory tiles, and various portions of the tile multiplexer 340 may or may not be considered to be part of the tile paths 310-*a*-1 through 310-*a*-*q* or the data path 350.

The data path 350 may illustrate an example of circuitry, corresponding to a plurality of memory tiles (e.g., all of the tile paths 310-*a*-1 through 310-*a*-*q*), that is configured to transfer information or provide various management of information associated with access operations for the plurality of memory tiles. In accordance with the described techniques for circuit partitioning, the components of the data path 350 may be located in the circuit layer or level of two or more memory tiles of the plurality of memory tiles. In the example of memory layout 300, the data path 350 includes a data sense amplifier component 360, a redundancy repair component 365, and an error correction component 370. In other examples of a memory layout, a data path 350 may include more or fewer components, or components that are divided into various other subcomponents or subfunctions. Moreover, although the data path 350 illustrates a single path between a tile multiplexer bus 341 and a data path bus 351, other examples of a data path 350 may have more than one path between a tile multiplexer bus 341 and a data path bus 351 (e.g., a read path and a write path). Thus, in some examples, the data path 350 may include circuitry configured to multiplex read or write pipelines of the memory layout 300.

The data sense amplifier component 360 may be referred to as a "front end" of the data path 350 and may include circuitry configured to amplify signals received at the data path 350 over the tile multiplexer bus 341. For example, to support various read operations, signals conveyed from one or more tile paths 310-a through the tile multiplexer 340 may have a first voltage swing (e.g., a partial swing or low swing, corresponding to reading the memory cells 205, corresponding to latch voltages of sense amplifiers 325-a, corresponding to a set of logic states that may be stored by the memory cells 205). To support various operations or processing of the data path 350, the data sense amplifier component 360 may amplify such signals to generate signals having a second voltage swing (e.g., a full swing or a high swing) that is greater than the first voltage swing. Using a relatively wider or greater voltage swing in the data path 350 may support more robust signal transfer through the data path 350, or to a local memory controller 265, which may be related to relatively lower sensitivity to interference, relatively lower sensitivity to voltage drop or signal decay along resistive signal paths, relatively lower sensitivity to various charge leakage paths in the data path 350, and other characteristics associated with a relatively greater voltage swing.

In some examples, the data sense amplifier component 360 may include a single amplifier for each signal path of the tile multiplexer bus 341 (e.g., a 1:1 correspondence between an amplifier and a memory cell 205 or bit of transferred information, a set of r amplifiers). Thus, the data sense amplifier component 360 may include one or more circuit elements for each memory cell 205, or each bit of information accessed in a memory array, involved in a given access operation. Such a granularity or regularity may be referred to as a "bit slice" of the data path 350, where each bit slice of the data path includes one or more circuit elements that are repeated for each bit or memory cell 205 involved in an access operation supported by the data path 350.

In some examples, the data sense amplifier component 360 may be used to support read operations but not write operations, and accordingly the data sense amplifier component 360 may be bypassed in some access operations (e.g., alternatively coupling the tile multiplexer bus 341 with a write driver of the data path 350, not shown). In some examples, a data sense amplifier component 360 may be omitted from a data path 350, such as when a sense amplifier array 320 or sense amplifiers 325 are configured to output a full swing or high swing output (e.g., to a data path 350), where full swing may refer to a same voltage swing as used in a portion of or at an output of the data path 350.

The redundancy repair component 365 may be configured to replace or reroute data that is read from or would otherwise be written to a digit line 215 or a memory cell 205 that is known to be faulty, or is suspected to be faulty (e.g., as identified from array detection operations, error correction operations, manufacturing validation operations). In a read operation, for example, the redundancy repair component 365 may be configured to ignore a bit received from the data sense amplifier component 360 or ignore a signal path from the data sense amplifier component 360 and reroute or otherwise reconfigure signals to account for the faulty digit line 215 or memory cell 205. In a write operation, for example, the redundancy repair component 365 may be configured to reroute or otherwise reconfigure write signals or data to avoid writing a bit to a faulty digit line 215 or memory cell 205. Accordingly, a bus on the array side of the redundancy repair component 365 may be configured to carry more bits than a bus on the opposite side of the redundancy repair component 365 (e.g., where s>t). In one example, the memory layout 300 may be configured for one redundancy bit per byte of information transfer on the data path bus 351 (e.g., one redundancy bit per eight bits of information), though such a ratio is configurable to other ratios based on various design tradeoffs.

The error correction component 370 may be configured to detect or correct various data corruption or errors, and, in some cases, may recover data (e.g., during a read operation) before transmitting over the data path bus 351. Such error detection and correction may rely upon one or more error-correcting codes such as block codes, convolutional codes, Hamming codes, low-density parity-check codes, turbo codes, polar codes, and others. These processes, operations, and techniques may be referred as ECC processes, ECC operations, ECC techniques, or, in some cases, as simply ECC. In some examples, the error correction component 370 may include or be referred to as an in-line ECC. In a read operation, for example, the error correction component 370 may perform an error correction operation on data read from a memory array (e.g., as read or otherwise conveyed from one or more tile paths 310-a) according to the read operation. The error correction component 370 may generate corrected data (e.g., in a correction subcomponent) or an indication of a detected error (e.g., in a detection subcomponent). The error correction component 370 may output data, which, in various circumstances, may be the data read from the memory array, or data that has been corrected.

In one example of performing ECC operations, the error correction component 370 may calculate the "syndrome" of incoming read data (e.g., as received from the redundancy repair component 365), and the syndrome may be compared to one or more corresponding parity bits that accompany the incoming read data (e.g., as read from a memory cell 205 of a same or different tile path 310-a). When the calculated syndrome does not equal the corresponding parity bit or bits, the error correction component 370 may attempt to correct the incoming read data before forwarding it (e.g., over the data path bus 351), or send a signal that an error has been detected (e.g., over the control bus 266-a), or both. In another example of performing ECC operations, the error correction component 370 may calculate the parity bit of incoming write data (e.g., as received from the local memory controller 265-a over the data path bus 351, for later comparison to a calculated syndrome when reading the data), and the calculated parity bit may be written to a memory cell 205 of a same or different tile path 310-a as where the incoming write data is written. In one example, the memory layout 300 may be configured for one parity or ECC bit per byte of information transfer on the data path bus 351 (e.g., one parity bit per eight bits of information), though such a ratio is configurable to other ratios based on various design tradeoffs.

In some examples, the error correction component 370 may include logic or circuitry to detect a memory cell 205 or a digit line 215 associated with charge leakage, store an indication of such a detection, and where appropriate, invert a logic state that is to be written to the memory cell 205 or digit line 215, or invert a logic state that is read from the memory cell 205 or digit line 215, to mitigate the effect of charge leakage.

The data path 350 (e.g., the data path bus 351) and the tile paths 310-a may be configured according to various multiples, multiplexing configurations, and selective operations.

For example, the quantity of bits associated with access operations of the data path 350 (e.g., u bits of the data path bus 351) may correspond to a quantity of bits of an access command, such as a column access command, a column access strobe (CAS) command, or a prefetch command. Other buses of the memory layout 300 may be associated with a greater number of bits, according to various configurations of the memory layout 300.

In one illustrative example, the data path 350 may be associated with 256 bits of information transfer (e.g., a data packet or data burst of 256 bits), which, in some examples, may correspond to the data path bus 351 being configured with 256 separate conductive traces (e.g., where u=256). The error correction component 370 may be configured with one parity bit per eight bits of data transfer (e.g., on the data path bus 351), and accordingly the error correction component 370 may be coupled with the redundancy repair component 365 using a bus having 288 separate conductive traces (e.g., where t=288). The redundancy repair component 365 may be configured with one redundancy bit per eight bits of data transfer (e.g., on the data path bus 351), and accordingly the redundancy repair component 365 may be coupled with the data sense amplifier component 360 using a bus having 320 separate conductive traces (e.g., where s=320).

In examples of a data path 350 that includes a data sense amplifier component 360, the data sense amplifier component 360 may be configured with an amplifier for each of the conductive traces (e.g., on either side of the data sense amplifier component 360), and accordingly may be coupled with the tile multiplexer 340 and the redundancy repair component 365 using buses having a same number of conductive traces (e.g., where r=s=320). Thus, according to the illustrative example, the data path 350 may be configured to be communicatively coupled between a 320-bit or 320-conductor tile multiplexer bus 341 and a 256-bit or 256-trace data path bus 351. In other words, the data path 350 may be associated with a 25% overhead (e.g., a 125% ratio of memory cells 205 accessed in a given access operation to data bits conveyed with the local memory controller 265-a) to support redundancy and error correction operations for the set of memory tiles corresponding to the tile paths 310-a-1 through 310-a-q.

Continuing with the illustrative example, the tile paths 310-a and the tile multiplexer 340 may be configured with various multiples and multiplexing to support a 320-bit or 320-conductor tile multiplexer bus 341. For example, the memory layout 300 may include or correspond to a set or section of 64 memory tiles (e.g., where q=64). To support a given access operation, the tile multiplexer 340 may be configured to selectively couple half of the 64 corresponding tile paths 310-a (e.g., every other tile path 310-a according to an arrangement of tile paths 310-a in the set or section) with the tile multiplexer bus 341. Accordingly, the tile multiplexer bus 341 may be coupled with 32 tile paths 310-a using a respective 10-bit or 10-conductor tile bus 311-a (e.g., where p=10). In some examples, such a configuration may be supported by tile paths 310-a or tile buses 311-a that each include or are otherwise associated with two local I/O buses or lines, each configured to convey five bits (e.g., each having five individual conductors or traces, each coupled with a different subset of five sense amplifiers 325-a of a sense amplifier array 320).

Further continuing with the illustrative example, the sense amplifier arrays 320-a may be configured with various multiples and multiplexing to support 10-bit or 10-conductor tile buses 311-a. In one example, this configuration may correspond to a coupling with a sense amplifier array 320-a where each of the conductors of the respective tile bus 311-a is coupled with a single, dedicated sense amplifier 325-a (e.g., where n=p=10). In another example, this configuration may correspond to a sense amplifier array 320-a where conductors of the respective tile bus 311-a are selectively coupled with a subset of the sense amplifiers 325-a of the sense amplifier array 320-a (e.g., where n>p). For example, the sense amplifier arrays 320-a may each include 80 sense amplifiers 325 (e.g., where n=80), and the sense amplifier array 320-a may include a selection component or multiplexer that is configured to select or couple one of eight subsets of ten sense amplifiers 325-a with the respective tile bus 311-a.

Further continuing with the illustrative example, the memory cells 205 corresponding to a given tile path 310-a may be configured with various multiples and multiplexing to support the described coupling with a sense amplifier array 320-a. In one example, each of the tile paths 310-a may include or otherwise be associated with 2,560 digit lines 215-a (e.g., where m=2,560). According to different configurations of the memory layout 300, the digit line multiplexers 315-a may be configured to select or couple one of 256 subsets of ten digit lines 215-a with the respective sense amplifier array 320-a (e.g., to support a 10-bit or 10-conductor tile bus 311-a with a sense amplifier array 320-a having ten sense amplifiers 325-a), or the digit line multiplexers 315-a may be configured to select or couple one of 32 subsets of 80 digit lines 215-a with the respective sense amplifier array 320-a (e.g., to support a 10-bit or 10-conductor tile bus 311-a with a sense amplifier array 320-a having 80 sense amplifiers 325-a, arranged as eight selectable subsets of the sense amplifiers 325-a).

In one example of the memory layout 300, each of the tile paths 310-a may also include or otherwise be associated with 2,048 word lines 210. Thus, according to the illustrative example, the memory layout 300 may include memory tiles each having 5,242,880 memory cells 205. When the memory layout 300 refers to a section or bank of a memory device having 64 memory tiles, the memory layout 300 may therefore illustrate an arrangement that supports the selective accessing of an array of 335,544,320 memory cells 205 using a data path bus 351 associated with 256 bits of data transfer (e.g., 256 conductive traces).

In some examples, word lines 210 may be commonly accessed across multiple memory tiles (e.g., all or a subset of memory tiles within a bank or section), or signals for activating word lines 210 of different memory tiles may be shared or commonly driven. For example, in response to a particular prefetch or other access command, a page or row activation may correspond to an activation of 20,480 memory cells 205 or digit lines 215 (e.g., corresponding to 16,384 bits of data plus additional redundancy or parity bits), which may be distributed across 64 memory tiles, 32 memory tiles, 16 memory tiles, or some other number of memory tiles based on a particular multiplexing scheme of the memory layout 300 (e.g., according to different configurations of digit line multiplexers 315-a or tile multiplexer 340). In other examples (e.g., according to various partial activation, partial deactivation, or other idling techniques), a particular prefetch or other access command may be associated with half that quantity of memory cells 205 or digit lines 215, one quarter that quantity of memory cells 205 or digit lines 215, or some other amount. Signals from such a page or row activation may be selectively routed to various sense amplifier arrays 320-*a* of various tile paths 310-*a* in accordance with various examples of the described techniques.

In some examples, the data path 350 may be considered to end or terminate at die data pads of a memory die, such as a memory die 160 or a memory die 200. Although the memory layout 300 illustrates an example where a single data path 350 is coupled with the local memory controller 265-*a*, in other examples, a local memory controller 265, a local memory controller 165, or a device memory controller 155 may be selectively coupled with a set of more than one data path 350. In such examples, a memory die may include a data path multiplexer (not shown) configured to selectively couple the local memory controller 265, the local memory controller 165, or the device memory controller 155 with one or more of the corresponding data path buses to support various access operations.

Figure 4:
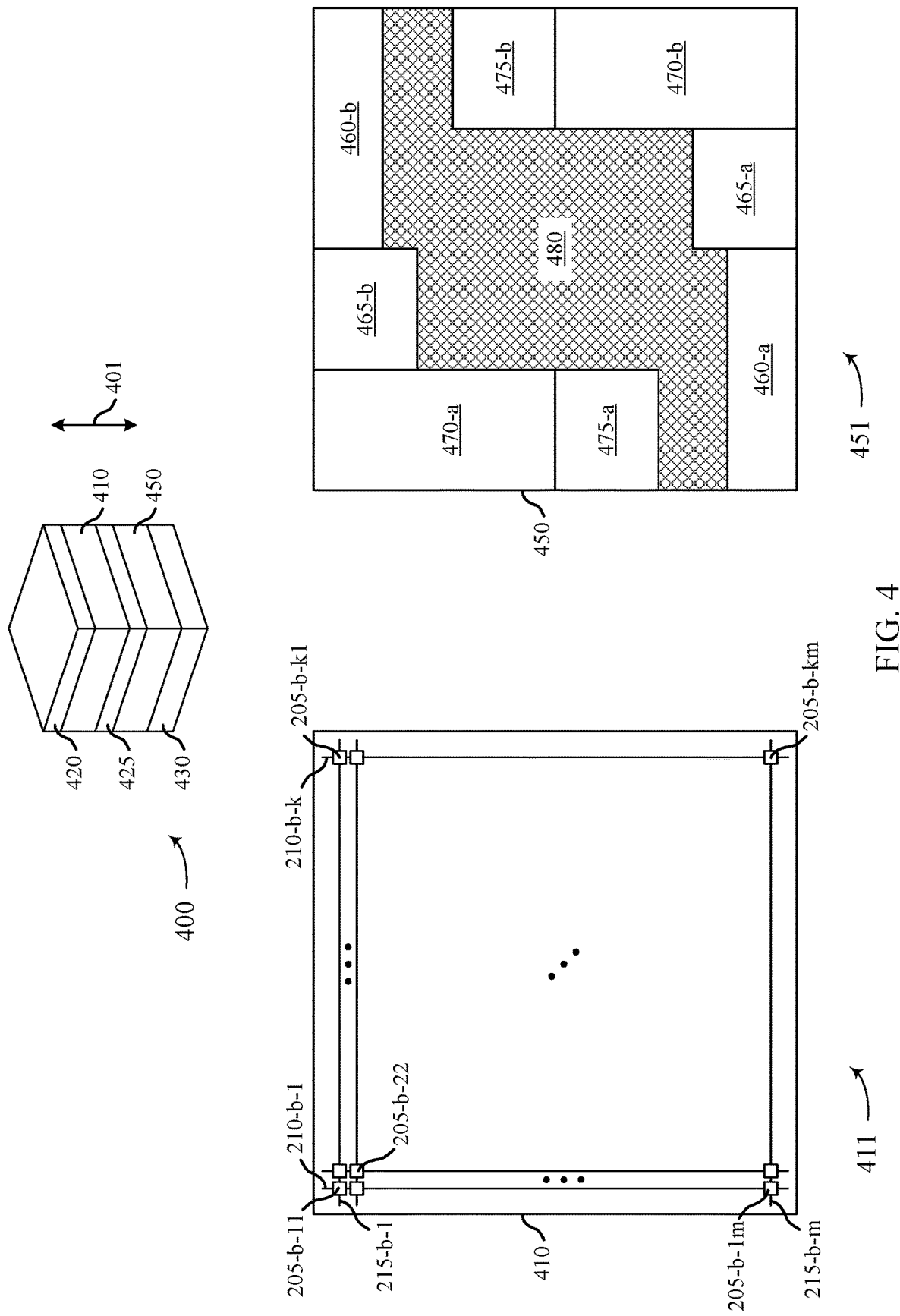
FIG. 4 illustrates an example layout of a memory tile that supports input/output line sharing for memory subarrays in accordance with examples as disclosed herein

FIG. 4 illustrates an example layout of a memory tile 400 that supports input/output line sharing for memory subarrays in accordance with examples as disclosed herein. The memory tile 400 illustrates a layout having levels (e.g., layers) relative to a thickness direction 401, which may refer to a direction perpendicular to a substrate, or a direction otherwise perpendicular to a plane of memory cells 205. The memory tile 400 includes an example of an array level 410 and a circuit level 450, which are shown relative to a substrate level 430. Although the memory tile 400 is illustrated with an array level 410 being above a circuit level 450 (e.g., relative to the substrate 430), in other examples or memory tiles 400, an array level 410 may be below a circuit level 450. Further, although one array level 410 and one circuit level 450 is shown in the example of memory tile 400, other examples of a memory tile 400 may include more than one array level 410, or more than one circuit level 450, or more than one array level 410 and more than one circuit level 450.

The array level 410 includes a plurality of memory cells 205-*b*, associated with word lines 210-*b* and digit lines 215-*b* that are configured to access the memory cells 205-*b* of the array level 410 (e.g., of the memory tile 400). For example, the array level 410 may include or be associated with k word lines 210-*b* (e.g., word lines 210-*b*-1 through 210-*b*-*k*) and m digit lines 215-*b* (e.g., digit lines 215-*b*-1 through 215-*b*-*m*), that are associated with the memory cells 205-*b*-11 through 205-*b*-*km* (e.g., a quantity of (k×m) memory cells 205). In an illustrative example, the array level 410 may be associated with 2,048 word lines 210-*b* (e.g., where k=2,048) and 2,560 digit lines 215-*b* (e.g., where m=2,560), and accordingly may be associated with 5,242,880 memory cells 205-*b*. However, the described techniques may support memory tiles 400 having other quantities of memory cells 205, word lines 210, and digit lines 215.

The array level 410 is illustrated with a top view 411, showing word lines 210-*b* and digit lines 215-*b* intersecting at respective memory cells 205-*b*. However, the memory cells 205-*b*, word lines 210-*b*, and digit lines 215-*b* may be formed or located at different positions or sub-levels (e.g., in the thickness direction 401) of the memory tile 400. In one example, the word lines 210-*b* may be below the memory cells 205-*b* (e.g., nearer to the substrate 430), and the digit lines 215-*b* may be below the word lines 210-*b*. Further, the array level may also include a plurality of plate lines 220 (not shown), or a common plate conductor, which may be formed or located at another position or sub-level of the memory tile 400 or array level 410. For example, the memory tile 400 or array level 410 may include a common plate conductor that is above the memory cells 205-*b* (e.g., farther from the substrate 430), and is shared by all the memory cells 205-*b* of the array level 410 (e.g., of the memory tile 400), which may refer to a common electrical node to all of the memory cells 205-*b* (e.g., a common electrical node of the memory tile 400). In one example, an array of memory cells 205 that all share such a common electrical node or common plate may define the extents (e.g., in number of word lines 210, in number of digit lines 215, in dimensions perpendicular to the thickness direction 401) of the memory tile 400. However, in some examples, the memory tile 400 may be subdivided into sub-units that have separately controllable plate nodes, or multiple memory tiles 400 may share a single controllable plate node, or such common electrical nodes or common plates of multiple memory tiles 400 that are separately controllable may be otherwise controlled to a same biasing (e.g., commonly controlled).

The array level 410 may be defined in the thickness direction 401 according to various constituent components. In the described example having a common plate conductor above the memory cells 205-*b* and the digit lines 215-*b* below the word lines 210-*b*, the array level 410 may be defined by an illustrative range in the thickness direction 401 that includes the common plate conductor and the digit lines 215-*b*, and portions of the array level 410 therebetween (e.g., the word lines 210-*b* and the memory cells 205-*b*). In another example, the array level 410 may be defined by an illustrative range in the thickness direction 401 by the memory cells 205-*b* (e.g., including the various features that are specific to a respective memory cell 205-*b*, including a storage element such as a capacitor 240 or configurable material memory element, a switching component 245, where present, and other memory cell features), in which case access lines or nodes such as the word lines 210-*b*, the digit lines 215-*b*, and plate lines 220 or a common plate conductor are considered to be outside (e.g., above or below) the array level 410. In some examples, the range in the thickness direction 401 that includes the features of the memory cells 205-*b* may be considered to be a minimum range in the thickness direction 401 that defines an array level 410.

The circuit level 450 may include various circuitry configured to operate the memory cells 205-*b* of the array level 410 (e.g., tile-specific circuitry, circuitry primarily corresponding to the memory tile 400, circuitry corresponding to or primarily assigned to the memory cells 205-*b*-11 through 205-*b*-*km*). For example, the circuit level 450 may include various decoders, buffers, multiplexers, sense amplifiers, or other components that may be dedicated to the operation of memory cells 205-*b*-11 through 205-*b*-*km*, and, in various examples, such circuitry may not be used in the operation of other memory cells 205 (e.g., of another memory tile 400, not shown) in the same or an adjacent section, or may be used in the operation of memory cells 205 of an adjacent memory tile 400 according to particular modes of operation. The circuit level 450 is illustrated with a top view 451, illustrating an example of a memory tile 400 that includes word line decoder portions 460, word line driver portions 465, digit line decoder portions 470, and digit line driver portions 475, but memory tiles 400 may include a circuit level 450 having a different arrangement components, or more or fewer components, that are primarily assigned to the operation of the memory tile 400.

The word line decoder portions 460 and the word line driver portions 465 may correspond to the word lines 210-*b*-1 through 210-*b*-*k* of the memory tile 400, and may be included in or otherwise refer to operations of a row decoder 225 described with reference to FIG. 2. The memory tile 400 illustrates an example where the circuit level 450 includes word line decoder portions 460 and word line driver portions 465 corresponding to different subsets of the word lines 210-b-1 through 210-b-k. For example, the word line decoder portion 460-a and the word line driver portion 465-a may correspond to word lines 210-b-1 through 210-b-(k/2), and the word line decoder portion 460-b and the word line driver portion 465-b may correspond to word lines 210-b-(k/2+1) through 210-b-k. As illustrated, in some examples, the word line decoder portion 460-a and the word line driver portion 465-a may be on an opposite end of the memory tile 400 (e.g., along a direction of word lines 210-b) from the word line decoder portion 460-b and the word line driver portion 465-b.

The word line decoder portions 460 and the word line driver portions 465 may perform various operations associated with selective accessing or activation of the word lines 210-b. For example, the word line driver portions 465 may be configured to receive control signals (e.g., via a control bus 266) associated with access commands (e.g., read commands, write commands) corresponding to the memory cells 205-b of the array level 410. In some examples, such access commands may be associated with a command to open a page of memory cells that includes a row of memory cells 205-b in the array level 410. The word line driver portions 465 may also include components or circuitry for buffering associated with access commands (e.g., a control buffer). In some examples, the word line driver portions 465 may include a voltage source for selectively activating word lines 210-b, or may be in electronic communication with such a voltage source that is shared between multiple memory tiles 400. The word line decoder portions 460 may include various multiplexing components (e.g., a transistor network) configured to couple a selection voltage source with a selected one or more of the word lines 210-b.

The digit line decoder portions 470 and the digit line driver portions 475 may correspond to the digit lines 215-b-1 through 215-b-m of the memory tile 400, and may be included in or otherwise refer to operations of a column decoder 230, a sense component 250, or an input/output component 260, or a combination thereof, described with reference to FIG. 2. In some examples, the digit line decoder portions 470 and the digit line driver portions 475 of the memory tile 400 may collectively refer to or be associated with at least a portion of a tile path 310. The memory tile 400 illustrates an example where the circuit level 450 includes digit line decoder portions 470 and digit line driver portions 475 corresponding to different subsets of the digit lines 215-b-1 through 215-b-m. For example, the digit line decoder portion 470-a and the digit line driver portion 475-a may correspond to digit lines 215-b-1 through 215-b-(m/2), and the digit line decoder portion 470-b and the digit line driver portion 475-b may correspond to digit lines 215-b-(m/2+1) through 215-b-m. As illustrated, in some examples, the digit line decoder portion 470-a and the digit line driver portion 475-a may be on an opposite end of the memory tile 400 (e.g., along a direction of digit lines 215-b) from the digit line decoder portion 470-b and the digit line driver portion 475-b.

The digit line decoder portions 470 and the digit line driver portions 475 may perform various operations associated with selective accessing or activation of the digit lines 215-b. For example, the digit line driver portions 475 may be configured to receive control signals (e.g., via a control bus 266) associated with access commands (e.g., read commands, write commands) corresponding to the memory cells 205-b of the array level 410. Additionally or alternatively, the digit line driver portions 475 may be configured to communicate data signals (e.g., with a tile multiplexer 340, with a data path 350, via a tile bus 311, via an input/output component 260) associated with access commands corresponding to the memory cells 205-b of the memory tile 400, and accordingly may include a transmitter, receiver, or transceiver associated with a tile bus 311. In other words, the memory tile 400 may be associated with a tile bus 311 that is connected with the digit line driver portions 475-a and 475-b (e.g., each coupled with a respective portion of the tile bus 311). In another example for defining extents of a memory tile 400 (e.g., in number of word lines 210, in number of digit lines 215, in dimensions perpendicular to the thickness direction 401), an array of memory cells 205 that all share a common tile bus 311 may define such extents. The digit line driver portions 475 may also include components or circuitry for buffering associated with access commands (e.g., a control buffer, a data buffer).

In some examples, access commands may be associated with a command to access or activate a subset of the digit lines 215-b of the memory tile 400, and each of the digit line decoder portions 470 may include a respective digit line multiplexer 315, or portion thereof, that receives control signaling via a control bus 266 to perform selective activations or connections. In another example, each of the digit line driver portions 475 may include a respective sense amplifier array 320, or portion thereof, including a plurality of sense amplifiers 325 (e.g., a respective subset or subarray of sense amplifiers 325) that may be selectively coupled with ones of the digit lines 215-b (e.g., by a digit line multiplexer 315 of the respective digit line driver portion 475) for detecting a logic state of a particular memory cell 205-b.

In some examples, the digit line driver portions 475 may include voltage sources for selectively activating or charging digit lines 215-b, or be in electronic communication with such a voltage source that is shared between multiple memory tiles. In some examples, the digit line driver portions 475 may include signal development components (e.g., of a sense amplifier array 320, or between a sense amplifier array 320 and memory cells 205-b) that develop, convert, or amplify signals to support the detection of logic states from the memory cells 205-b, or the writing of logic states to the memory cells 205-b.

In various examples, the circuit level 450 may be defined in the thickness direction 401 according to different constituent components. In one example, the circuit level 450 may be defined in the thickness direction 401 by the farthest extents in the thickness direction 401 of the circuitry corresponding to the operation of the memory tile 400 (e.g., the farthest extents of the union, in the thickness direction 401, of tile-specific circuitry of the memory tile 400, the farthest extents of the word line decoder portions 460, word line driver portions 465, digit line decoder portions 470, and digit line driver portions 475, collectively). In another example, the circuit level 450 may be defined in the thickness direction 401 by the extents in the thickness direction 401 having a portion of each type of circuitry corresponding to the operation of the memory tile 400 (e.g., the farthest extents of the intersection, in the thickness direction 401, of tile-specific circuitry of the memory tile 400, the farthest extents of the word line decoder portions 460, word line driver portions 465, digit line decoder portions 470, and digit line driver portions 475, collectively).

The memory tile 400 may also include, or be otherwise associated with routing levels, which may be considered to routing levels of the memory tile 400, routing levels of a bank or section of multiple (e.g., adjacent) memory tiles 400, routing levels of a plurality of banks or sections of memory tiles 400, or, more generally, routing levels of a memory die 160 or a memory die 200. For example, the memory tile 400 may include a routing level 420, which may be referred to as an "over-array" routing level, and a routing level 425, which may be referred to as an "under-array" routing level.

The routing levels 420 and 425 may include one or more levels or layers (e.g., stacked in the thickness direction 401) of conductive paths for routing signals or power (e.g., supplied voltage, supplied current) in a memory die. In one example, the routing level 420 may include four layers of conductive paths, where two of the layers each include a plurality of conductive paths that are perpendicular to word lines 210 (e.g., of the array level 410) and two of the layers each include a plurality of signal paths that are perpendicular to digit lines 215. In another example, the routing level 425 may include three layers of conductive paths, where two of the layers each include a plurality of conductive paths that are perpendicular to word lines 210 and one of the layers includes a plurality of conductive paths that are perpendicular to digit lines 215. However, various arrangements of conductive paths may be used in a routing level 420 or 425, including layers having conductive paths in multiple directions or conductive paths that are nonlinear. In some examples, one or more of the conductive paths of the routing level 420 (e.g., sublayers of the routing level 420) may be formed of copper, and one or more of the conductive paths of the routing level 425 (e.g., sublayers of the routing level 425) may be formed of tungsten, where such formation may include selective deposition or removal (e.g., etching) to form the particular signal paths.

In some examples, the array level 410 or the circuit level 450 may be defined in the thickness direction 401 according to the relative positions of routing layers. In one example, the array level 410 may correspond to the portion of the memory tile 400 that is between a routing level 420 and a routing level 425 (e.g., along the thickness direction 401). In another example, the circuit level 450 may correspond to the portion of the memory tile 400 that is between a routing level 425 and a substrate 430 or another routing level (not shown).

The memory tile 400 may also include conductors along the thickness direction 401, which may be referred to as "sockets" (not shown). Sockets may provide conductive paths between levels or layers of the memory tile 400, such as between adjacent levels (e.g., between a routing level 420 and an array level 410) or between non-adjacent levels (e.g., between an array level 410 and a circuit level 450). In various examples, sockets may be located within the illustrative boundary of the memory tile 400 (e.g., in a top view), or outside the illustrative boundary of the memory tile 400 (e.g., between memory tiles), or both.

As illustrated by the top view 451 of the circuit level 450, not all of the area of the circuit level 450 of the memory tile 400 is occupied by the circuitry primarily associated with the memory tile 400 (e.g., the word line decoder portions 460, word line driver portions 465, digit line decoder portions 470, and digit line driver portions 475, collectively). Rather, the circuit level 450 also includes an area 480 that is available for other purposes. In some examples, a plurality of memory tiles 400 (e.g., a section of memory tiles 400, a quilt of memory tiles 400) may be associated with a data path 350, and circuitry associated with the data path 350 may be distributed across the respective areas 480 of the plurality of memory tiles 400.

Figure 5:
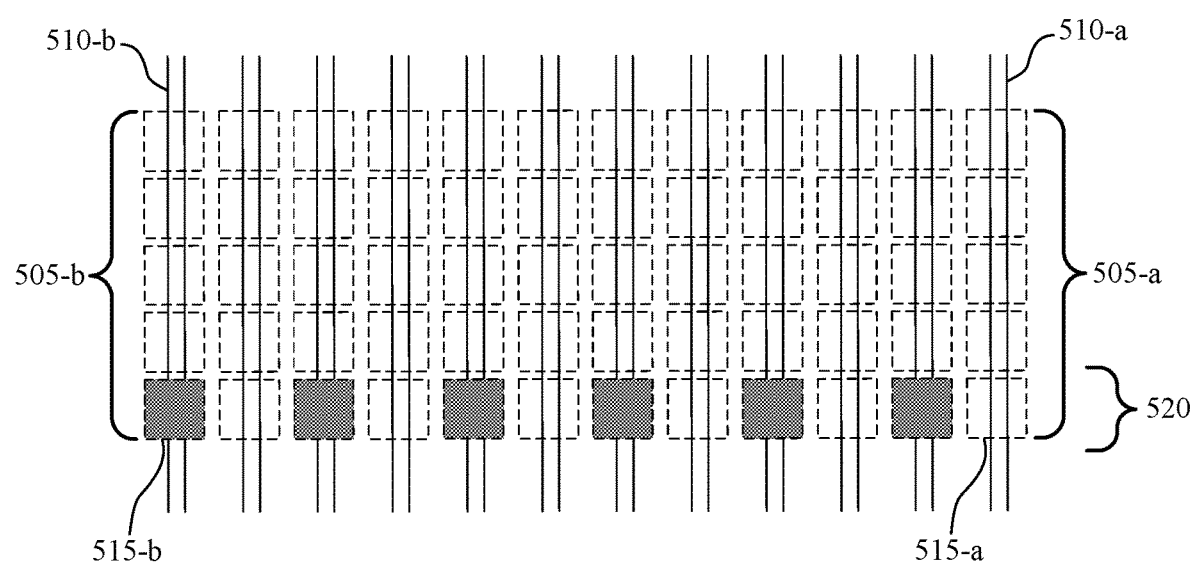
FIG. 5 illustrates an example of aspects of a memory array that supports input/output line sharing for memory subarrays in accordance with examples as disclosed herein.

FIG. 5 illustrates an example of a memory array 500 that supports input/output line sharing for memory subarrays in accordance with examples as disclosed herein. Memory array 500 may include a plurality of subarrays 505, each of which may be referred to as a memory tile or patch. In some examples, the subarrays 505 may be an example of, or otherwise share certain characteristics with the memory tiles 400 described with reference to FIG. 4. In some examples, each of the subarrays 505 may be associated with a different tile path (e.g., a tile path 310). Memory array 500 may also include a plurality of main I/O lines 510. In some examples, one or more of the main I/O lines 510 may be included in a tile multiplexer bus (e.g., a tile multiplexer bus 341), or may be coupled with another selection or multiplexing component (e.g., a portion of a tile multiplexer 340) configured to selectively couple ones of the main I/O lines 510 with such a tile multiplexer bus for communication with a data path (e.g., a data path 350).

The plurality of subarrays 505 may be arranged as rows and columns. In some examples, a group (e.g., a row) of subarrays 505 may be collectively referred to as a memory bank or section. The plurality of subarrays 505 may include a first plurality of subarrays 505-a arranged in a first column and a second plurality of subarrays 505-b arranged in a second column. The first plurality of subarrays 505-a may include a subarray 515-a, and the second plurality of subarrays 505-b may include a subarray 515-b. The subarray 515-a and the subarray 515-b may be in a same row (e.g., bank) but in different columns.

The plurality of main I/O lines 510 may include a main I/O line 510-a and a main I/O line 510-b. The main I/O line 510-a may at least partially traverse the first plurality of subarrays 505-a in the first column (e.g., in a routing layer, in a circuit layer). In such cases, the main I/O line 510-a may at least partially traverse the subarray 515-a. The main I/O line 510-b may at least partially traverse the second plurality of subarrays 505-b in the second column. In such cases, the main I/O line 510-b may at least partially traverse the subarray 515-b. That is, the main I/O line 510-a does not traverse the subarray 515-b, and the main I/O line 510-b does not traverse the subarray 515-a. A main I/O line 510 may be configured to transmit data read from or written to a plurality of subarrays 505 with an I/O component of a memory device that includes the memory array 500. In some cases, the main I/O line 510-a and the main I/O line 510-b may each be a single I/O line or each may include a plurality of I/O lines. For example, the main I/O line 510-a and main I/O line 510-b may each be five bits wide (e.g., configured to carry five bits of information, an may include five separate conductive paths).

The memory device that includes memory array 500 may receive a command or other control signaling (e.g., from a local memory controller 265, over a control bus 266) to operate the memory array 500 in a reduced power mode. For example, the memory device may be configured to place memory array 500 into the reduced power mode based on a command or other control signaling indicating a reduced page size. When operated in the reduced power mode, the memory array 500 may be configured to activate only an indicated subset (e.g., half) of the plurality of subarrays 515 included in an activated bank, and to leave deactivated a remainder of the plurality of subarrays 515 included in the activated bank. For example, when an activation command for the bank that includes the subarrays 515-a and 515-b is received, the subarray 515-a may be activated but the subarray 515-*b* may remain deactivated based on operating the memory array 500 in the reduced power mode.

In some cases, a total range of column addresses may span addresses corresponding to two or more subarrays 505, and the memory array 500 may be configured to activate only subarrays within an activated bank that correspond to an indicated subset of the column address range, and to leave other subarrays within the activated bank in a deactivated mode. For example, if the column address range spans two subarrays 505, and the columns are indexed from left to right such that the column including subarray 515-*b* is column 0 and the column including subarray 515-*a* is column 11, then only odd-indexed subarrays 505 such as subarray 515-*a* may be activated when an indicated column address range is in an upper half of the total range, and only odd-indexed subarrays 505 such as subarray 515-*b* may be activated when an indicated column address range is in a lower half of the total range. Accordingly, in some cases, every other subarray 505 within an activated bank may be activated. Other patterns of activated and deactivated subarrays within an activated bank (e.g., beyond alternating activated/deactivated) are also possible, including as described herein, for example, with reference to FIGS. 13 and 14.

FIG. 5 illustrates one operating example: The memory device that includes memory array 500 may receive a command to operate with a reduced page size. The memory device may (e.g., subsequently, concurrently, or as part of a same command) receive an activation command indicating a targeted bank 520 for activation. The activation command (or some other command, depending on implementation) may also indicate a subset of the subarrays 505 in the targeted bank 520 for activation (e.g., by indicating a range of column addresses, where different subarrays 505 in the targeted bank 520 are associated with different ranges (e.g., subsets) within an overall range of column addresses). The memory device may activate only those subarrays 505 indicated for activation (e.g., within the targeted bank 520, only those subarrays 505 corresponding to the indicated range of column addresses), and the other subarrays 505 in the targeted bank 520 may remain deactivated (or be deactivated, if previously activated). For example, if the indicated subset of the subarrays 505 includes subarray 515-*a* and other unshaded subarrays 505 within the targeted bank 520, the subarray 515-*b* and other shaded subarrays 505 within the targeted bank 520 may remain deactivated. An access command may be received after the memory array 500 receives the activation command. The access command may indicate a column address (e.g., column select value) within the address range corresponding to the activated subarrays 505 within the targeted bank 520, and the subset of memory cells in the open page that also correspond to the indicated column address may be accessed (e.g., read or written).

Activating only a fraction of the subarrays 505 in an activated bank may save power during a reduced page mode (e.g., a reduced power mode). For example, less bits may be accessed (e.g., sensed) within the memory array 500 based on the command indicating a reduced page size, and one or more circuit aspects associated with the unaccessed subarrays 505 may remain deactivated.

Figure 6:
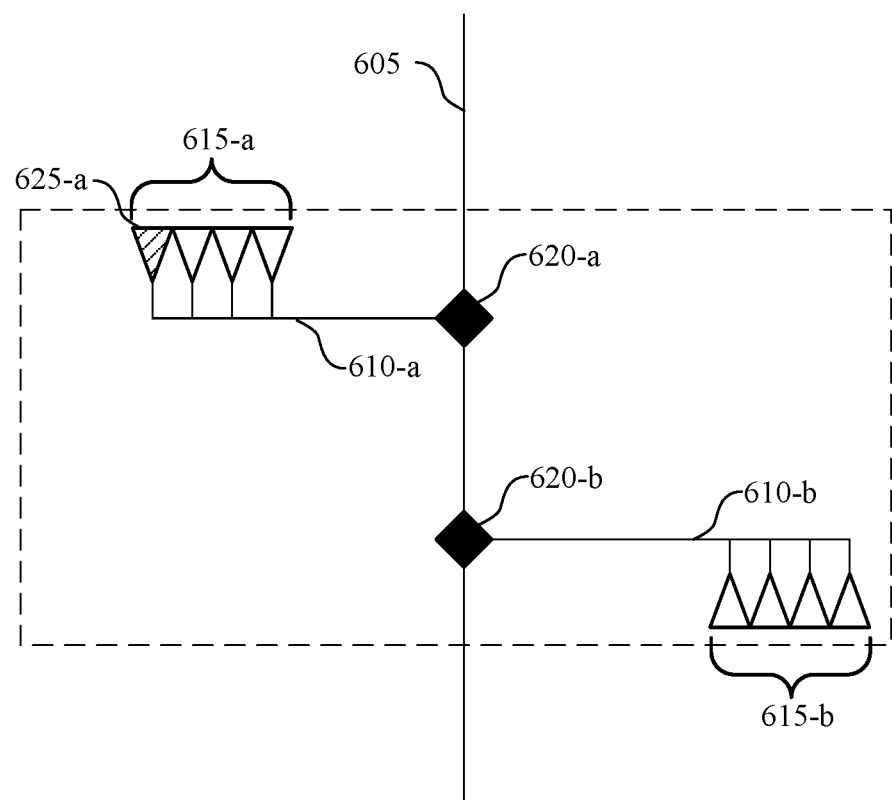
FIG. 6 illustrates an example of a memory subarray that supports input/output line sharing for memory subarrays in accordance with examples as disclosed herein.

FIG. 6 illustrates an example of a subarray 600 that supports input/output line sharing for memory subarrays in accordance with examples as disclosed herein. The subarray 600 may be an example of a memory tile or patch (e.g., a memory tile 400, a subarray 505), and may include local I/O lines 610, pluralities of sense components 615, and drivers 620. In some examples, the local I/O lines 610-*a* and 610-*b* may collectively be an example of a tile bus 311, and the pluralities of sense components 615-*a* and 615-*b* may collectively be an example of a sense amplifier array 320, as described with reference to FIG. 3. The subarray 600 may also be associated with at least one main I/O line 605, which may be shared across (e.g., may traverse) one or more other subarrays (not shown).

In some examples, the drivers 620 may be configured to selectively couple at least a portion of the local I/O lines 610 with the main I/O line 605 (e.g., in response to control signaling (not shown), which may be conveyed over a control bus 266), in which case the drivers 620 may be considered to be a portion of a tile multiplexer 340 described with reference to FIG. 3. For example, the drivers 620 may be three-state drivers (which may also be known as tri-state drivers, three-state buffers, or tri-state buffers) and thus may selectively couple a corresponding local I/O line 610 with the main I/O line 605 when activated (e.g., based on a control signal, not shown, which may be based on a column address or column address range) and decouple (e.g., electrically isolate) the corresponding local I/O line 610 from the main I/O line 605 when deactivated (e.g., based on the control signal). For example, when the driver 620-*a* is activated, the driver 620-*a* may couple local I/O line 610-*a* with main I/O line 605, and when the driver 620-*a* is deactivated, the driver 620-*a* may decouple local I/O line 610-*a* from main I/O line 605. The subarray 600 and the main I/O line 605 may be examples of the subarray 505 and the main I/O lines 510, respectively, as described with reference to FIG. 5.

The subarray 600 may include a portion of or otherwise be associated with the main I/O line 605 that traverses the subarray 600. The driver 620-*a* and the driver 620-*b* may be coupled with the main I/O line 605. The driver 620-*a* may also be coupled with the local I/O line 610-*a*, and the driver 620-*b* may be coupled with the local I/O line 610-*b*. The local I/O line 610-*a* may be coupled with plurality of sense components 615-*a*, and the local I/O line 610-*b* may be coupled with the plurality of sense components 615-*b*. In some cases, the local I/O line 610-*a* may serve as an intermediary (e.g., conduct signals) between the plurality of sense components 615-*a* and the main I/O line 605. The local I/O line 610-*b* may serve as an intermediary (e.g., conduct signals) between the plurality of sense components 615-*b* and the main I/O line 605.

The plurality of sense components 615-*a* and the plurality of sense components 615-*b* may each include any number of individual sense components 625 associated with the subarray 600, and each individual sense component 625 may include any number of individual sense amplifiers, such as sense amplifiers 325 described with reference to FIG. 3. For example, each of the plurality of sense components 615 may include four sense components 625, and each of the four sense components 625 may include five individual sense amplifiers. In some cases, the plurality of sense components 615-*a* and the plurality of sense components 615-*b* may both be located under memory cells of the subarray 600 or above memory cells of the subarray 600 (e.g., in a circuit layer, closer to or farther from a substrate). In some examples, the main I/O line 605 may be located under memory cells of the subarray 600 or above memory cells of the subarray 600 (e.g., in a circuit layer, in a routing layer).

A memory device that includes the subarray 600 may receive an activation command and activate the subarray 600 in response to the activation command. For example, the activation command may specify a row of memory cells within the subarray 600, and the memory device may activate the subarray 600 (e.g., may activate sense components 615, one or more access line drivers, timing circuitry or "phases" for generating timing signals associated with access operations and other operations, or any combination thereof) based on the activation command. In some cases, the subarray 600 may be included in a bank of subarrays, the activation command may specify a row of memory cells within the bank (e.g., across multiple subarrays), and the memory device may activate one or more subarrays within the bank based on the activation command. The memory device may also activate a word line (e.g., row line) within each activated subarray to couple the memory cells in the activated row with their respective digit lines (e.g., column lines) and thereby open a page of memory cells.

The memory device may receive an access command (e.g., after the activation command), and a selected one of the plurality of sense components 615-*a* and the plurality of sense components 615-*b* may be used to sense data from the subarray 600 based on the activation command (e.g., based on a column address or mask included in or otherwise associated with the access command). For example, when the subarray 600 receives or is otherwise accessed in response to a read command, the data may be exchanged with a host device for the memory device. If the selected sense components are included in the plurality of sense components 615-*a*, then selected sense components may drive data on the local I/O line 610-*a*, and the driver 620-*a* may drive data from the local I/O line 610-*a* onto the main I/O line 605 to be exchanged with the host device. Alternatively, if the selected sense components are included in the plurality of sense components 615-*b*, then the selected sense components may drive data on the local I/O line 610-*b*, and the driver 620-*b* may drive data from the local I/O line 610-*b* onto the main I/O line 605 to be exchanged with the host device.

The plurality of sense components 615-*a* may be associated with a first address range for the access command, and the plurality of sense components 615-*b* may be associated with a second address range for the access command, where the second address range is different than the first address range. For example, the plurality of sense components 615-*a* may be associated with an address range that includes a column select value of four, five, six, or seven. The plurality of sense components 615-*b* may be associated with an address range that includes a column select value of zero, one, two, or three. The access command may indicate an address, such as a column select value (e.g., column address) (e.g., within the first address range or the second address range). In other words, a column select value may correspond to, or be used to select or activate a particular sense component 625 of the pluralities of sense components 615 (e.g., by a sense component selection component or multiplexer, by a sense amplifier selection component or multiplexer).

The column select value may indicate which data is selected and extracted by specifying a sense component 625 of the plurality of sense components 615. As an example, each sense component (e.g., sense component 625) may be associated with five bits of data, which may correspond to an individual sense component 625 including five sense amplifiers 325. In some cases, each local I/O line 610-*a* and local I/O line 610-*b* may be configured to carry five bits of information, which may correspond to five separate conductive paths. In such cases, the main I/O line 605 may also be configured to carry five bits of information, which may correspond to five separate conductive paths.

As an illustrative example, if the column address indicates a column select value of seven, the sense component 625-*a* of the plurality of sense components 615-*a* may be activated. In such cases, the sense component 625-*a* may be coupled with the local I/O line 610-*a* and the main I/O line 605-*a*. The data associated with (e.g., read or written using) sense component 625-*a* may be exchanged with the host device or another aspect of the memory device based on coupling the sense component 625-*a* with the local I/O line 610-*a* and the main I/O line 605-*a*.

Continuing the illustrative example, the driver 620-*a* may be activated based on the access command corresponding to a column select value of seven (or any value within a range corresponding to the plurality of sense components 615-*a*). The sense component 625-*a* and the main I/O line 605-*a* may be coupled based on activating the driver 620-*a*. The driver 620-*b* may be deactivated or maintained in a deactivated state (e.g., if already deactivated before receiving the access command or a corresponding activation command) based on the access command corresponding to a column select value of seven (or any value outside a range corresponding to the plurality of sense components 615-*b*). For example, if the access command does not indicate a column select value of zero, one, two, or three (e.g., associated with the plurality of sense components 615-*b*), then the plurality of sense components 615-*b*, the local I/O line 610-*b*, and the driver 620-*b* may remain deactivated.

Figure 7:
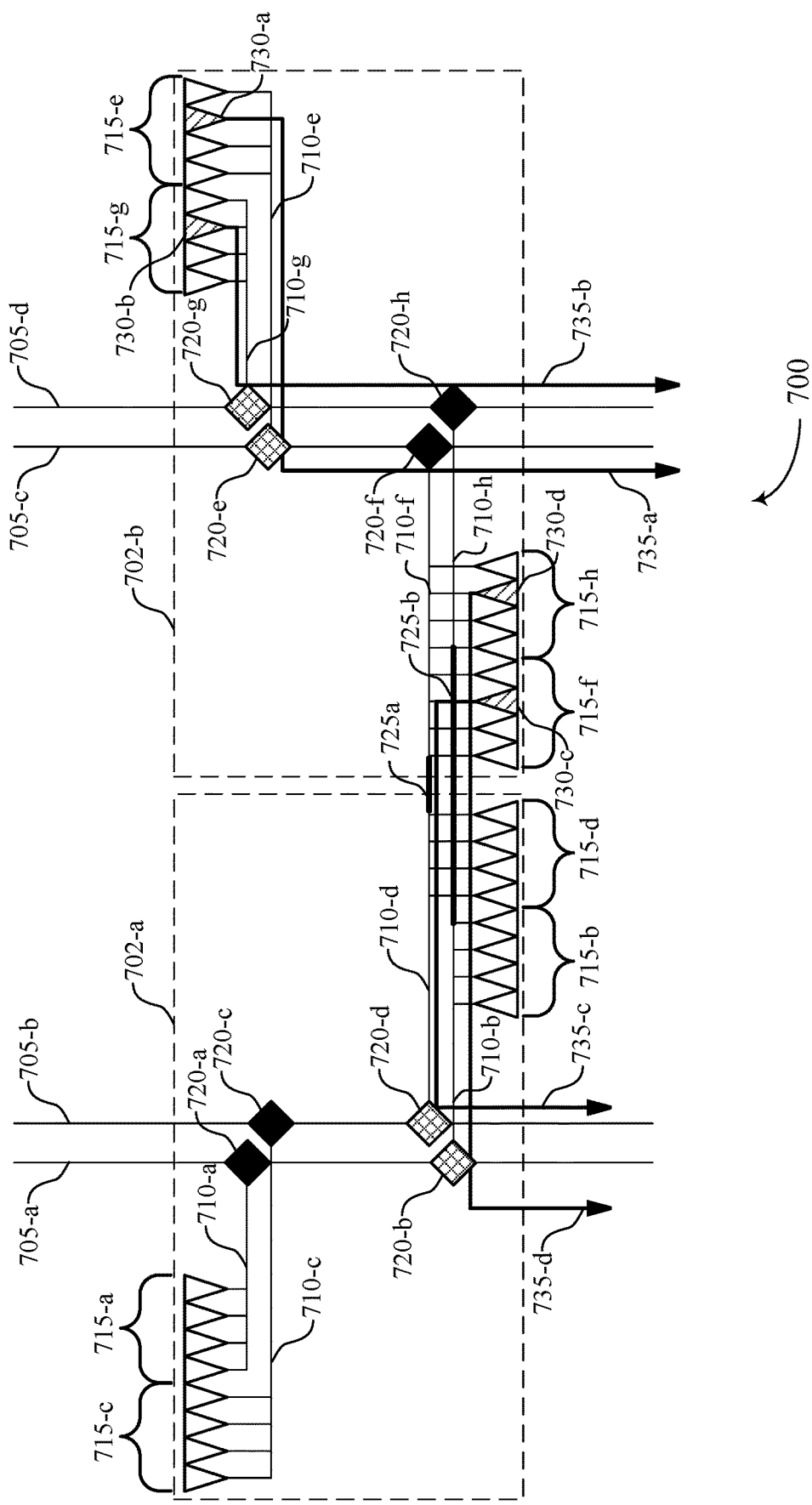
FIG. 7 illustrates an example of aspects of a memory array that supports input/output line sharing for memory subarrays in accordance with examples as disclosed herein.

FIG. 7 illustrates an example of aspects of a memory array 700 that supports input/output line sharing for memory subarrays in accordance with examples as disclosed herein. The memory array 700 may include subarray 702-*a* and subarray 702-*b* (e.g., memory tiles, memory patches), main I/O lines 705, local I/O lines 710, pluralities of sense components 715, and drivers 720. In some examples, the subarrays 705 may be an example of, or otherwise share certain characteristics with the memory tiles 400 described with reference to FIG. 4. For example, subarray 702-*a* and subarray 702-*b* may be included in a same bank within an array such as memory array 500. The memory array 700 may also include shunts 725, which may be configured to couple (e.g., merge, combine, join together) local I/O lines 710 of different (e.g., adjacent) subarrays 702. In some cases, local I/O lines 710 connected with a common shut 725 may be considered a single local I/O line, but may be described as separate I/O lines that have been joined by the shunt 725 for illustrative clarity. Subarrays 702, main I/O lines 705, local I/O lines 710, sense components 715, and drivers 720 may be examples of subarrays, main I/O lines, local I/O lines, sense components, and drivers, respectively, as described with reference to FIGS. 5 and 6. In the example of the memory array 700, the subarray 702-*a* and the subarray 702-*b* may both be activated.

The subarray 702-*a* may include a portion of or be otherwise associated with the main I/O line 705-*a* and the main I/O line 705-*b*, which both may at least partially traverse the subarray 702-*a*. In some cases, the main I/O line 705-*a* and the main I/O line 705-*b* may be representative of a single I/O line (e.g., a portion of a tile multiplexer bus 341, or a line of bus configured to be selectively coupled with or mapped to a tile multiplexer bus 341, as described with reference to FIG. 3). The driver 720-*a* and the driver 720-*b* may be coupled with the main I/O line 705-*a*. The driver 720-*c* and the driver 720-*d* may be coupled with the main I/O line 705-*b*. The driver 720-*a* may be coupled with the local I/O line 710-*a*, the driver 720-*b* may be coupled with local I/O line 710-*b*, the driver 720-*c* may be coupled with the local I/O line 710-*c*, and the driver 720-*d* may be coupled with local I/O line 710-d. In some examples, the main I/O line 705-a may be located under memory cells of the subarray 702-a, and the main I/O line 705-b may be located above memory cells of the subarray 702-a. In other examples, the main I/O line 705-a may be located above memory cells of the subarray 702-a, and the main I/O line 705-b may be located under memory cells of the subarray 702-a. In still other examples, the main I/O line 705-a and the main I/O line 705-b may both be located above or under memory cells of the subarray 702-a.

The local I/O lines 710 may each be coupled with a plurality of sense components 715. For example, the local I/O line 710-a may be coupled with a plurality of sense components 715-a, the local I/O line 710-b may be coupled with the plurality of sense components 715-b, the local I/O line 710-c may be coupled with the plurality of sense components 715-c, and the local I/O line 710-d may be coupled with the plurality of sense components 715-d.

The pluralities of sense components 715-a, 715-b, 715-c, and 715-d may each be configured to sense data from subarray 702-a and each may include any number (e.g., four) individual sense components 730 associated with the subarray 702-a. As described herein, any sense component configured to sense data from a subarray may also be configured to support writing data to the subarray. For example, each of the four sense components 730 of a given plurality of sense components 715 may include any number (e.g., five) individual sense amplifiers (e.g., sense amplifiers 325 described with reference to FIG. 3). In some cases, the plurality of sense components 715-a, the plurality of sense components 715-b, the plurality of sense components 715-c, and the plurality of sense components 715-d may all be located under or above memory cells of the subarray 702-a. The plurality of sense components 715-a, 715-b, 715-c, and 715-d may each be associated with a same address range (e.g., column select values from four to seven). For example, each column select value of four, five, six, or seven may indicate one of the four sense components 730 in the plurality of sense components 715-a, one of the four sense components 730 in the plurality of sense components 715-b, one of the four sense components 730 in the plurality of sense components 715-c, and one of the four sense components 730 in the plurality of sense components 715-d.

The subarray 702-b may include a portion of or be otherwise associated with the main I/O line 705-c and the main I/O line 705-d, which both may at least partially traverse the subarray 702-b. In some cases, the main I/O line 705-c and the main I/O line 705-d may be representative of a single I/O line (e.g., a portion of a tile multiplexer bus 341, or a line of bus configured to be selectively coupled with or mapped to a tile multiplexer bus 341, as described with reference to FIG. 3). The driver 720-e and the driver 720-f may be coupled with the main I/O line 705-c. The driver 720-g and the driver 720-h may be coupled with the main I/O line 705-d. The driver 720-e may be coupled with the local I/O line 710-e, the driver 720-f may be coupled with local I/O line 710-f, the driver 720-g may be coupled with the local I/O line 710-g, and the driver 720-h may be coupled with local I/O line 710-h. In some examples, the main I/O line 705-c may be located under memory cells of the subarray 702-b, and the main I/O line 705-d may be located above memory cells of the subarray 702-b. In other examples, the main I/O line 705-c may be located above memory cells of the subarray 702-b, and the main I/O line 705-d may be located under memory cells of the subarray 702-b. In still other examples, the main I/O line 705-c and the main I/O line 705-d may both be located above or under memory cells of the subarray 702-b.

The local I/O lines 710 may each be coupled with a plurality of sense components 715. For example, the local I/O line 710-e may be coupled with a plurality of sense components 715-e, the local I/O line 710-f may be coupled with the plurality of sense components 715-f, the local I/O line 710-g may be coupled with the plurality of sense components 715-g, and the local I/O line 710-h may be coupled with the plurality of sense components 715-h.

The pluralities of sense components 715-e, 715-f, 715-g, and 715-h may each be configured to sense data from subarray 702-b and each may include any number of (e.g., four) sense components 730 associated with subarray 702-b. For example, each of the four sense components 730 of a given plurality of sense components 715 may include any number of (e.g., five) individual sense amplifiers (e.g., sense amplifiers 325 described with reference to FIG. 3). In some cases, the plurality of sense components 715-e, the plurality of sense components 715-f, the plurality of sense components 715-g, and the plurality of sense components 715-h may all be located under or above memory cells of the subarray 702-b. The plurality of sense components 715-e, 715-f, 715-g, and 715-h may each be associated with a same address range (e.g., column select values from zero to three). For example, each column select value of zero, one, two, or three may indicate one of the four sense components 730 in the plurality of sense components 715-e, one of the four sense components 730 in the plurality of sense components 715-f, one of the four sense components 730 in the plurality of sense components 715-g, and one of the four sense components 730 in the plurality of sense components 715-h.

A column address (e.g., column select value) may be included in, or otherwise be determined based on an access command, and the column address may be used to couple a particular sense component 730 with a main I/O line 705. FIG. 7 may illustrate data flows and activated sense components 730 and drivers 720 in an example in which the address indicates a column select value of two (e.g., column address of two), which may be generally representative of data flows and activated sense components 730 and drivers 720 when a column address corresponds to subarray 702-b.

In the example of a column select value of two, the sense component 730-a of the plurality of sense components 715-e may be activated, the sense component 730-b of the plurality of sense components 715-g may be activated, the sense component 730-d of the plurality of sense components 715-h may be activated, and the sense component 730-c of the plurality of sense components 715-f may be activated. Other sense components 730 may be deactivated or (e.g., if already deactivated) maintained in a deactivated state. The drivers 720-g, 720-e, 720-d, and 720-b may also be activated (and thus each may couple a corresponding local I/O line 710 to a corresponding main I/O line 705). The drivers 720-f, 720-h, 720-a, and 720-b may be deactivated or (e.g., if already deactivated) maintained in a deactivated state (and thus each may decouple (e.g., electrically isolate) a corresponding local I/O line 710 from a corresponding main I/O line 705).

Thus, sense component 730-a may be coupled with the local I/O line 710-e and main I/O line 705-c (e.g., via driver 720-e). The data associated with (e.g., read or written using) sense component 730-a may be exchanged with the host device based on coupling the sense component 730-a with the local I/O line 710-e and main I/O line 705-c. In some cases, the driver 720-e may be activated based on the access command corresponding to a column select value of two.

The sense component 730-*a* and the main I/O line 705-*c* may be coupled based on activating the driver 720-*e*. In such cases, sense component 730-*a* may exchange data with the host device via activated information path 735-*a*.

Similarly, sense component 730-*b* may be coupled with the local I/O line 710-*g* and main I/O line 705-*d* (e.g., via driver 720-*g*). The data associated with sense component 730-*b* may be exchanged with the host device based on coupling the sense component 730-*b* with the local I/O line 710-*g* and main I/O line 705-*d*. In some cases, the driver 720-*g* may be activated based on the access command corresponding to a column select value of two. The sense component 730-*b* and the main I/O line 705-*d* may be coupled based on activating the driver 720-*g*. In such cases, sense component 730-*b* may exchange data with the host device via activated information path 735-*b*. In some cases, the sense component 730-*a* and the sense component 730-*b* may be activated at a same time.

The driver 720-*f* and driver 720-*h* may each be deactivated based on the access command corresponding to a column select value of two (e.g., a value within a range corresponding to subarray 702-*b*). In some cases, the driver 720-*f* may be deactivated based on activating driver 720-*e* on the same main I/O line 705-*c*. The driver 720-*h* may be deactivated based on activating driver 720-*g* on the same main I/O line 705-*d*.

In some cases, the subarray 702-*a* and the subarray 702-*b* may be adjacent to each other (e.g., adjacent within a memory bank, in a memory section). In such cases, one or more shunts 725 may couple the subarray 702-*a* with the subarray 702-*b*. For example, the shunt 725-*a* may couple the driver 720-*d* with the driver 720-*f* (e.g., providing the driver 720-*d* and the driver 720-*f* with a common or otherwise shared I/O line or bus). The shunt 725-*b* may couple the driver 720-*b* with the driver 720-*h*. The shunt 725-*a* may short the local I/O line 710-*d* and the local I/O line 710-*f*, and the shunt 725-*b* may short the local I/O line 710-*b* and the local I/O line 710-*h*. In some cases, a shunt 725 may be hardwired (e.g., via one or more permanent conductive paths, which each may couple one or more individual conductive patches within a coupled local I/O line 710). In some cases, local I/O lines 710 that are both coupled to a shunt 725 may be considered a single I/O line, though for clarity in illustrating concepts the disclosure herein, they may be referred to as separate local I/O lines 710 that have been coupled or shunted together.

The shunt 725-*a* and the shunt 725-*b* may each comprise a bidirectional information path configured to carry data in a first direction or a second direction based on an access command (e.g., based on which sense components 730 and drivers 720 are activated or deactivated in response to the access command). For example, the shunt 725-*a* may be configured to carry data between the subarray 702-*b* and the main I/O line 705-*b* when driver 720-*f* is deactivated and driver 720-*d* is activated, and to carry data between the subarray 702-*a* and the main I/O line 705-*c* when driver 720-*d* is deactivated and driver 720-*f* is activated. Similarly, the shunt 725-*b* may be configured to carry data between the subarray 702-*b* and the main I/O line 705-*a* when driver 720-*h* is deactivated and driver 720-*b* is activated, and to carry data between the subarray 702-*a* and the main I/O line 705-*d* when driver 720-*b* is deactivated and driver 720-*h* is activated.

Thus, if the address range indicates a column select value of two, sense component 730-*c* may be coupled with main I/O line 705-*b* via shunt 725-*a*. In cases where the driver 720-*f* is deactivated, the sense component 730-*c* and thus subarray 702-*b* may borrow main I/O line 705-*b* of subarray 702-*a* to exchange data with the host device. The driver 720-*d* may be activated based on the access command corresponding to a column select value of two, thereby allowing the shunt 725-*a* to route the data between the sense component 730-*c* and the main I/O line 705-*b*. That is, the sense component 730-*c* and the main I/O line 705-*b* may be coupled based on activating the driver 720-*d*. In such cases, sense component 730-*c* may exchange data with the host device via activated information path 735-*c*. For example, data may be read from subarray 702-*b*, but the data may be routed via a main I/O line that at least partially traverses subarray 702-*a* (and may not traverse subarray 702-*b*) via activated information path 735-*c*.

Similarly, if the address range indicates a column select value of two, sense component 730-*d* may be coupled with main I/O line 705-*a* via shunt 725-*b*. In cases where the driver 720-*h* is deactivated, the sense component 730-*d* and thus subarray 702-*b* may borrow main I/O line 705-*a* of subarray 702-*a* to exchange data with the host device. The driver 720-*b* may be activated based on the access command corresponding to a column select value of two, thereby allowing the shunt 725-*b* to route the data between the sense component 730-*d* and the main I/O line 705-*a*. That is, the sense component 730-*d* and the main I/O line 705-*a* may be coupled based on activating the driver 720-*b*. In such cases, sense component 730-*d* may exchange data with the host device via activated information path 735-*d*. For example, data may be read from subarray 702-*b*, but the data may be routed via a main I/O line that at least partially traverses subarray 702-*a* via activated information path 735-*d*. In some cases, the sense component 730-*c* and the sense component 730-*d* may be activated at a same time. Additionally or alternatively, the sense components, 730-*a*, 730-*b*, 730-*c*, and 730-*d* may each be activated at a same time.

Based on the address indicated in the access command, the plurality of sense components 715-*a*, 715-*b*, 715-*c*, and 715-*d* may each be deactivated. For example, the plurality of sense components 715-*a*, 715-*b*, 715-*c*, and 715-*d* may correspond to an address range that does not include the address indicated in the access command. In such cases, the driver 720-*a* coupled with the plurality of sense components 715-*a* may be deactivated, and the driver 720-*c* coupled with the plurality of sense components 715-*c* may be deactivated.

Figure 8:
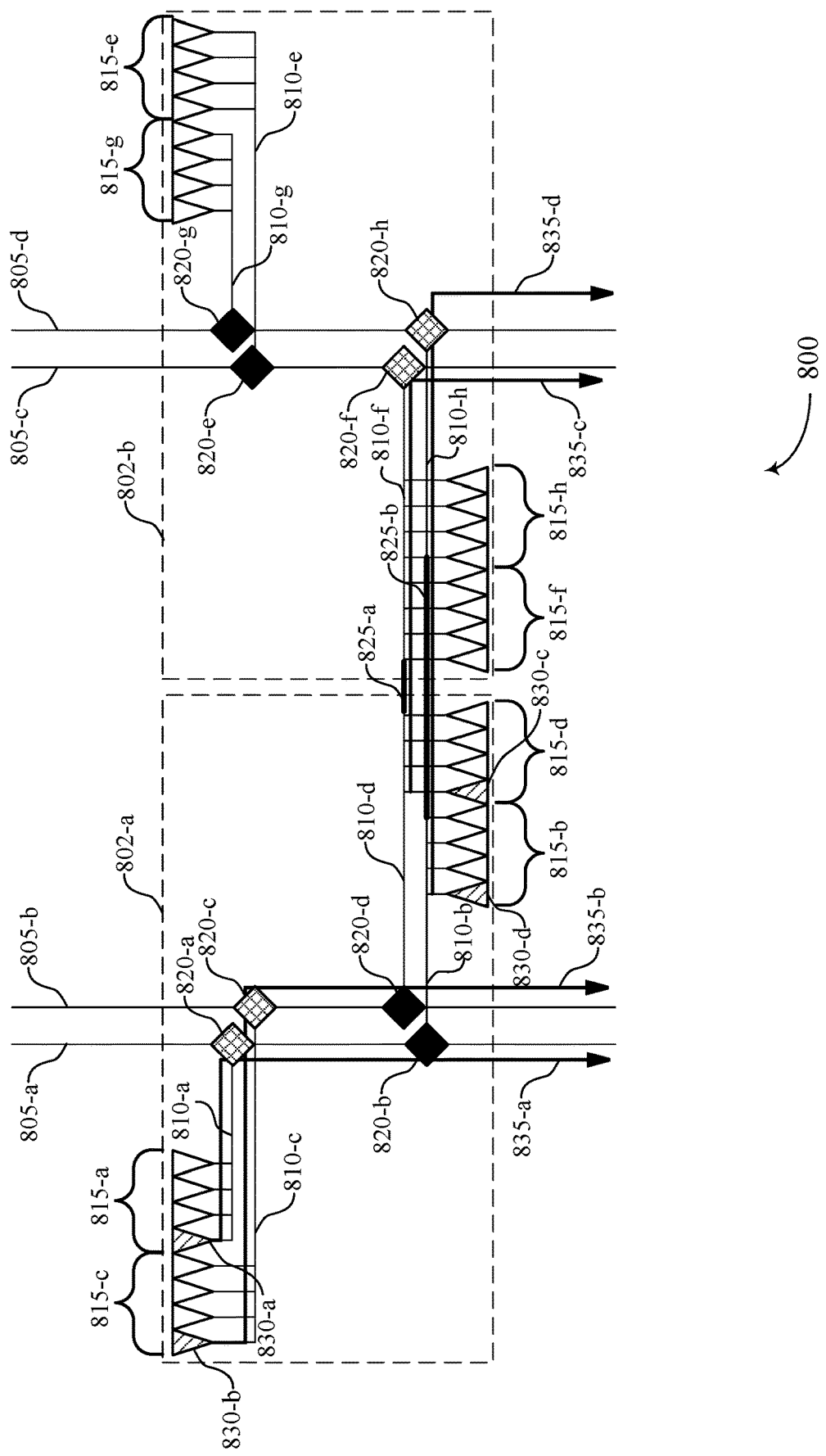
FIG. 8 illustrates an example of aspects of a memory array that supports input/output line sharing for memory subarrays in accordance with examples as disclosed herein.

FIG. 8 illustrates an example of aspects of a memory array 800 that supports input/output line sharing for memory subarrays in accordance with examples as disclosed herein. The memory array 800 may include subarray 802-*a* and subarray 802-*b*, main I/O lines 805, local I/O lines 810, pluralities of sense components 815, and drivers 820. The memory array 800 may also include shunts 825. Subarrays 802, main I/O lines 805, local I/O lines 810, sense components 815, and drivers 820 may be examples of subarrays, main I/O lines, local I/O lines, sense components, and drivers, respectively, as described with reference to FIGS. 5 through 7. Aspects of the memory array 800 may be identical or similar to the memory array 700 described with reference to FIG. 7. The memory array 800 may illustrate operation according to an alternative configuration or scenario (e.g., compared to the configuration or scenario of the memory array 700) for at least the reasons described herein.

A column address (e.g., column select value) may be included in, or otherwise determined based on an access command, and the column address may be used to couple a particular sense component 830 with a main I/O line 805. FIG. 8 may illustrate data flows and activated sense components 830 and drivers 820 in an example in which the address indicates a column select value of seven (e.g., column address of seven), which may be generally representative of data flows and activated sense components 730 and drivers 720 when a column address corresponds to subarray 702-*a*.

In the example of a column select value of seven, the sense component 830-*a* of the plurality of sense components 815-*a* may be activated, the sense component 830-*b* of the plurality of sense components 815-*c* may be activated, the sense component 830-*d* of the plurality of sense components 815-*b* may be activated, and the sense component 830-*c* of the plurality of sense components 815-*d* may be activated. Other sense components 830 may be deactivated or (e.g., if already deactivated) maintained in a deactivated state. The drivers 820-*a*, 820-*c*, 820-*f*, and 820-*h* may also be activated (and thus each may couple a corresponding local I/O line 810 to a corresponding main I/O line 805). The drivers 820-*b*, 820-*d*, 820-*e*, and 820-*g* may be deactivated or (e.g., if already deactivated) maintained in a deactivated state (and thus each may decouple (e.g., electrically isolate) a corresponding local I/O line 810 from a corresponding main I/O line 805).

Thus, sense component 830-*a* may be coupled with the local I/O line 810-*a* and main I/O line 805-*a* (e.g., via driver 820-*a*). The data associated with (e.g., read or written using) sense component 830-*a* may be exchanged with the host device based on coupling the sense component 830-*a* with the local I/O line 810-*a* and main I/O line 805-*a*. In some cases, the driver 820-*a* may be activated based on the access command corresponding to a column select value of seven. The sense component 830-*a* and the main I/O line 805-*a* may be coupled based on activating the driver 820-*a*. In such cases, sense component 830-*a* may exchange data with the host device via activated information path 835-*a*.

Similarly, sense component 830-*b* may be coupled with the local I/O line 810-*c* and main I/O line 805-*b* (e.g., via driver 820-*c*). The data associated with sense component 830-*b* may be exchanged with the host device based on coupling the sense component 830-*b* with the local I/O line 810-*c* and main I/O line 805-*b*. In some cases, the driver 820-*c* may be activated based on the access command corresponding to a column select value of seven. The sense component 830-*b* and the main I/O line 805-*b* may be coupled based on activating the driver 820-*c*. In such cases, sense component 830-*b* may exchange data with the host device via activated information path 835-*b*.

The driver 820-*b* and driver 820-*d* may each be deactivated based on the access command corresponding to a column select value of seven (e.g., a value within a range corresponding to subarray 802-*a*). In some cases, the driver 820-*b* may be deactivated based on activating driver 820-*a* on the same main I/O line 805-*a*. The driver 820-*d* may be deactivated based on activating driver 820-*c* on the same main I/O line 805-*b*.

The shunt 825-*a* may be configured to carry data between the subarray 802-*a* and the main I/O line 805-*c* when driver 820-*d* is deactivated and driver 820-*f* is activated, and to carry data between the subarray 802-*b* and the main I/O line 805-*b* when driver 820-*f* is deactivated and driver 820-*d* is activated. Similarly, the shunt 825-*b* may be configured to carry data between the subarray 802-*a* and the main I/O line 805-*d* when driver 820-*b* is deactivated and driver 820-*h* is activated, and to carry data between the subarray 702-*b* and the main I/O line 705-*a* when driver 820-*h* is deactivated and driver 820-*b* is activated.

Thus, if the address range indicates a column select value of seven, sense component 830-*c* may be coupled with main I/O line 805-*c* via shunt 825-*a*. In cases where the driver 820-*d* is deactivated, sense component 830-*c* and thus subarray 802-*a* may borrow main I/O line 805-*c* of subarray 802-*b* to exchange data with the host device. The driver 820-*f* may be activated based on the access command corresponding to a column select value of seven, thereby allowing the shunt 825-*a* to route the data between the sense component 830-*c* and the main I/O line 805-*c*. That is, the sense component 830-*c* and the main I/O line 805-*c* may be coupled based on activating the driver 820-*f*. In such cases, sense component 830-*c* may exchange data with the host device via activated information path 835-*c*.

Similarly, if the address range indicates a column select value of seven, sense component 830-*d* may be coupled with main I/O line 805-*d* via shunt 825-*b*. In cases where the driver 820-*b* is deactivated, sense component 830-*d* and thus subarray 802-*a* may borrow main I/O line 805-*d* of subarray 802-*b* to exchange data with the host device. The driver 820-*h* may be activated based on the access command corresponding to a column select value of seven, thereby allowing the shunt 825-*b* to route the data between the sense component 830-*d* and the main I/O line 805-*d*. That is, the sense component 830-*d* and the main I/O line 805-*d* may be coupled based on activating the driver 820-*h*.

Based on the address indicated in the access command, the plurality of sense components 815-*e*, 815-*f*, 815-*g*, and 815-*h* may each be deactivated. For example, the plurality of sense components 815-*e*, 815-*f*, 815-*g*, and 815-*h* may correspond to an address range that does not include the address indicated in the access command. In such cases, the driver 820-*e* coupled with the plurality of sense components 815-*e* may be deactivated, and the driver 820-*g* coupled with the plurality of sense components 815-*g* may be deactivated.

Thus, one or more local I/O lines may be shared by adjacent (e.g., neighboring) subarrays. This may allow for borrowing of main I/O lines by subarrays that share at least one local I/O line. When data is read from or written to an accessed subarray, it may be communicated at least in part by a main I/O line that does not traverse the accessed subarray, but instead traverses a neighbor subarray. That is, a main I/O line may sometimes carry data read from or written to a subarray traversed by the main I/O line, but may other times carry data read from or written to a subarray not traversed by the main I/O line.

Figure 9:
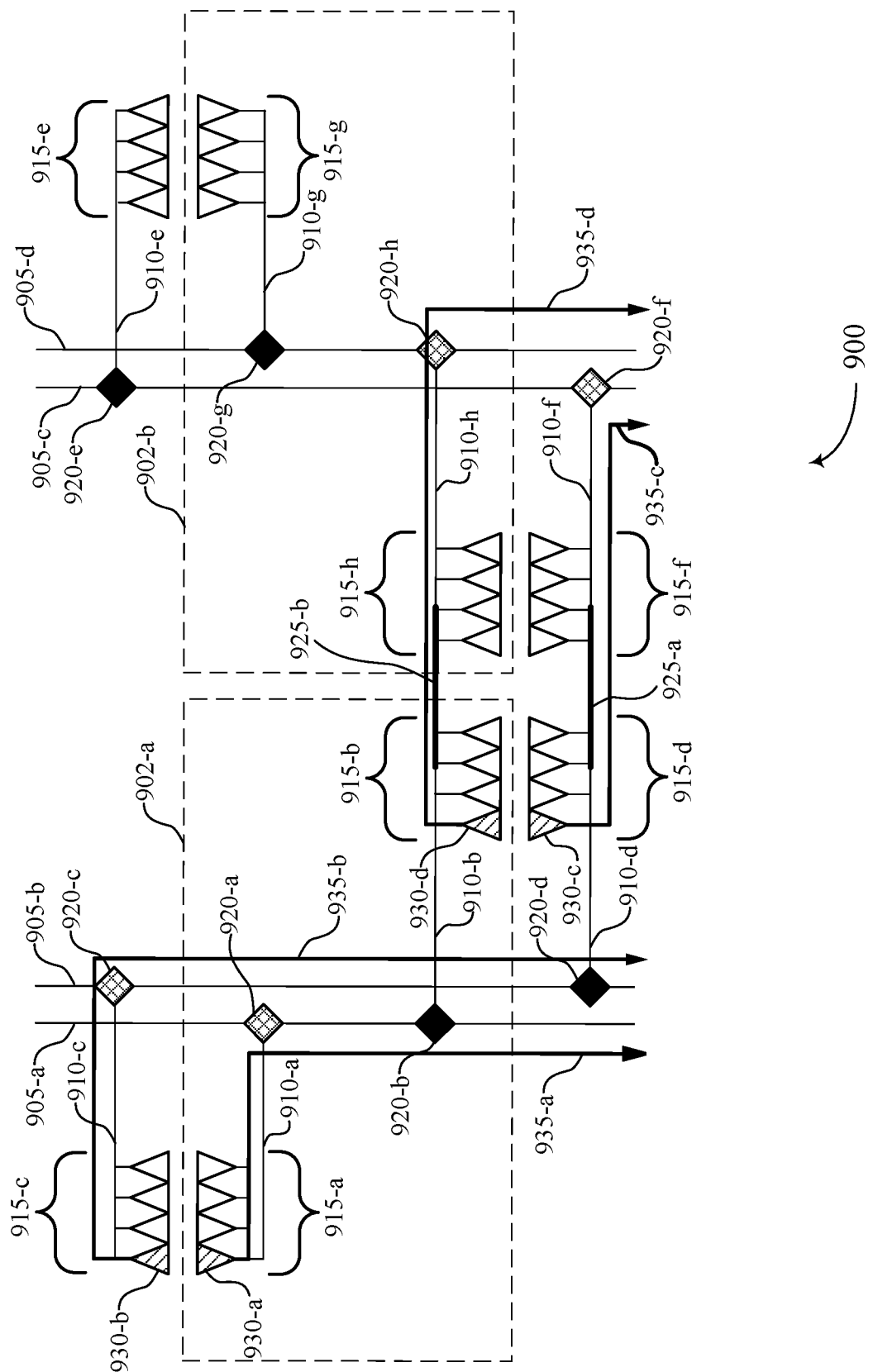
FIG. 9 illustrates an example of aspects of a memory array that supports input/output line sharing for memory subarrays in accordance with examples as disclosed herein.

FIG. 9 illustrates an example of aspects of a memory array 900 that supports input/output line sharing for memory subarrays in accordance with examples as disclosed herein. The memory array 900 may include subarray 902-*a* and subarray 902-*b*, main I/O lines 905, local I/O lines 910, pluralities of sense components 915, and drivers 920. In some examples, the subarrays 902 may be an example of, or otherwise share certain characteristics with the memory tiles 400 described with reference to FIG. 4. For example, subarray 902-*a* and subarray 902-*b* may be included in a same bank within an array such as memory array 500. The memory array 900 may also include shunts 925, which may be configured to couple (e.g., merge, combine, join together) local I/O lines 910 to different (e.g., adjacent) subarrays 902. Subarrays 902, main I/O lines 905, local I/O lines 910, sense components 915, and drivers 920 may be examples of subarray and main I/O line, local I/O line, sense components, and drivers, respectively, as described with reference to FIGS. 5 through 8. Aspects of the memory array 900 may be identical or similar to the subsets of a memory array 700 or 800. The memory array 900 may illustrate operation according to an alternative configuration (e.g., compared to the configurations of the subsets of a memory array 700 or 800) for at least the reasons described herein.

The pluralities of sense components 915 may be arranged in various layers or levels of one or more memory tiles. For example, the plurality of sense components 915-*a* and the plurality of sense components 915-*b* may both be located either under or above memory cells of the subarray 902-*a*, the plurality of sense components 915-*c* may be located either under or above memory cells of an adjacent subarray (not shown) (e.g., a subarray in a first adjacent bank and within a column of subarrays that includes subarray 902-*a*), and the plurality of sense components 915-*d* may be located either under or above memory cells of the subarray 902-*a* of another adjacent subarray (not shown) (e.g., a subarray in a second adjacent bank and within the column of subarrays that includes subarray 902-*a*, where the bank that includes subarrays 902-*a* and 902-*b* is between the first adjacent bank and the second adjacent bank). In such cases, a plurality of sense components 915 may be borrowed from a subarray in a bank that is adjacent to the subarray 902-*a* to exchange data with the host device. The plurality of sense components 915-*a*, 915-*b*, 915-*c*, and 915-*d* may each be associated with column addresses within an address range that includes column select values of four, five, six, or seven.

In some cases, the plurality of sense components 915-*g* and the plurality of sense components 915-*h* may both be located either under or above memory cells of the subarray 902-*b*, the plurality of sense components 915-*e* may be located either under or above memory cells of an adjacent subarray (not shown) (e.g., a subarray in the first adjacent bank and within a column of subarrays that includes subarray 902-*b*), and the plurality of sense components 915-*f* may be located above memory cells of another adjacent subarray (not shown) (e.g., a subarray in the second adjacent bank and within the column of subarrays that includes subarray 902-*b*, where the bank that includes subarrays 902-*a* and 902-*b* is between the first adjacent bank and the second adjacent bank). In such cases, a plurality of sense components 915 may be borrowed from a subarray in a bank that is adjacent to the subarray 902-*b* to exchange data with the host device. The plurality of sense components 915-*e*, 915-*f*, 915-*g*, and 915-*h* may each be associated with column addresses within an address range that includes column select values of zero, one, two, or three.

A column address (e.g., column select value) may be included in, or otherwise determined based on an access command, and the column address may be used to couple a particular sense component 930 with a main I/O line 905. FIG. 9 may illustrate data flows and activated sense components 930 and drivers 920 in an example in which the address indicates a column select value of seven (e.g., column address of seven).

In the example of a column select value of seven, the sense component 930-*a* of the plurality of sense components 915-*a* may be activated, the sense component 930-*b* of the plurality of sense components 915-*c* may be activated, the sense component 930-*d* of the plurality of sense components 915-*b* may be activated, and the sense component 930-*c* of the plurality of sense components 915-*d* may be activated. Other sense components 930 may be deactivated or (e.g., if already deactivated) maintained in a deactivated state. The drivers 920-*a*, 920-*c*, 920-*f*, and 920-*h* may also be activated (and thus each may couple a corresponding local I/O line 910 to a corresponding main I/O line 905). The drivers 920-*b*, 920-*d*, 920-*e*, and 920-*g* may be deactivated or (e.g., if already deactivated) maintained in a deactivated state (and thus each may decouple (e.g., electrically isolate) a corresponding local I/O line 910 from a corresponding main I/O line 905).

Thus, sense component 930-*a* may be coupled with the local I/O line 910-*a* and main I/O line 905-*a* (e.g., via driver 920-*a*). The data associated with (e.g., read or written using) sense component 930-*a* may be exchanged with the host device based on coupling the sense component 930-*a* with the local I/O line 910-*a* and main I/O line 905-*a*. In some cases, the driver 920-*a* may be activated based on the access command corresponding to a column select value of seven. The sense component 930-*a* and the main I/O line 905-*a* may be coupled based on activating the driver 920-*a*. In such cases, sense component 930-*a* may exchange data with the host device via activated information path 935-*a*.

Similarly, sense component 930-*b* may be coupled with the local I/O line 910-*c* and main I/O line 905-*b* (e.g., via driver 920-*c*). The data associated with sense component 930-*b* may be exchanged with the host device based on coupling the sense component 930-*b* with the local I/O line 910-*c* and main I/O line 905-*b*. In some cases, the driver 920-*c* may be activated based on the access command corresponding to a column select value of seven. The sense component 930-*b* and the main I/O line 905-*b* may be coupled based on activating the driver 920-*c*. In such cases, sense component 930-*b* may exchange data with the host device via activated information path 935-*b*.

The driver 920-*b* and driver 920-*d* may each be deactivated based on the access command corresponding to a column select value of seven (e.g., a value within a range corresponding to subarray 902-*a*). In some cases, the driver 920-*b* may be deactivated based on activating driver 920-*a* on the same main I/O line 905-*a*. The driver 920-*d* may be deactivated based on activating driver 920-*c* on the same main I/O line 905-*b*.

The shunt 925-*a* may be configured to carry data between the subarray 902-*a* and the main I/O line 905-*c* when driver 920-*d* is deactivated and driver 920-*f* is activated, and to carry data between the subarray 902-*b* and the main I/O line 905-*b* when driver 920-*f* is deactivated and driver 920-*d* is activated. Similarly, the shunt 925-*b* may be configured to carry data between the subarray 902-*a* and the I/O line 905-*d* when driver 920-*b* is deactivated and driver 920-*h* is activated, and to carry data between the subarray 902-*b* and the main I/O line 905-*a* when driver 920-*h* is deactivated and driver 920-*b* is activated.

Thus, if the address range indicates a column select value of seven, sense component 930-*c* may be coupled with main I/O line 905-*c* via shunt 925-*a*. In cases where the driver 920-*d* is deactivated, sense component 930-*c* and thus subarray 902-*a* may borrow main I/O line 905-*c* of subarray 902-*b* to exchange data with the host device. The driver 920-*f* may be activated based on the access command corresponding to a column select value of seven, thereby allowing the shunt 925-*a* to route the data between the sense component 930-*c* and the main I/O line 905-*c*. That is, the sense component 930-*c* and the main I/O line 905-*c* may be coupled based on activating the driver 920-*f* In such cases, sense component 930-*c* may exchange data with the host device via activated information path 935-*c*.

Similarly, if the address range indicates a column select value of seven, sense component 930-*d* may be coupled with main I/O line 905-*d* via shunt 925-*b*. In cases where the driver 920-*b* is deactivated, sense component 930-*d* and thus subarray 902-*a* may borrow main I/O line 905-*d* of subarray 902-*b* to exchange data with the host device. The driver 920-*h* may be activated based on the access command corresponding to a column select value of seven and the shunt 925-*b* routing the data between the sense component 930-*d* and the main I/O line 905-*d*. That is, the sense component 930-*d* and the main I/O line 905-*d* may be coupled based on activating the driver 920-*h*.

Based on the address indicated in the access command, the plurality of sense components 915-*e*, 915-*f*, 915-*g*, and 915-*h* may each be deactivated. For example, the plurality of sense components 915-*e*, 915-*f*, 915-*g*, and 915-*h* may correspond to an address range that does not include the address indicated in the access command. In such cases, the driver 920-*e* coupled with the plurality of sense components 915-*e* may be deactivated, and the driver 920-*g* coupled with the plurality of sense components 915-*g* may be deactivated.

Figure 10:
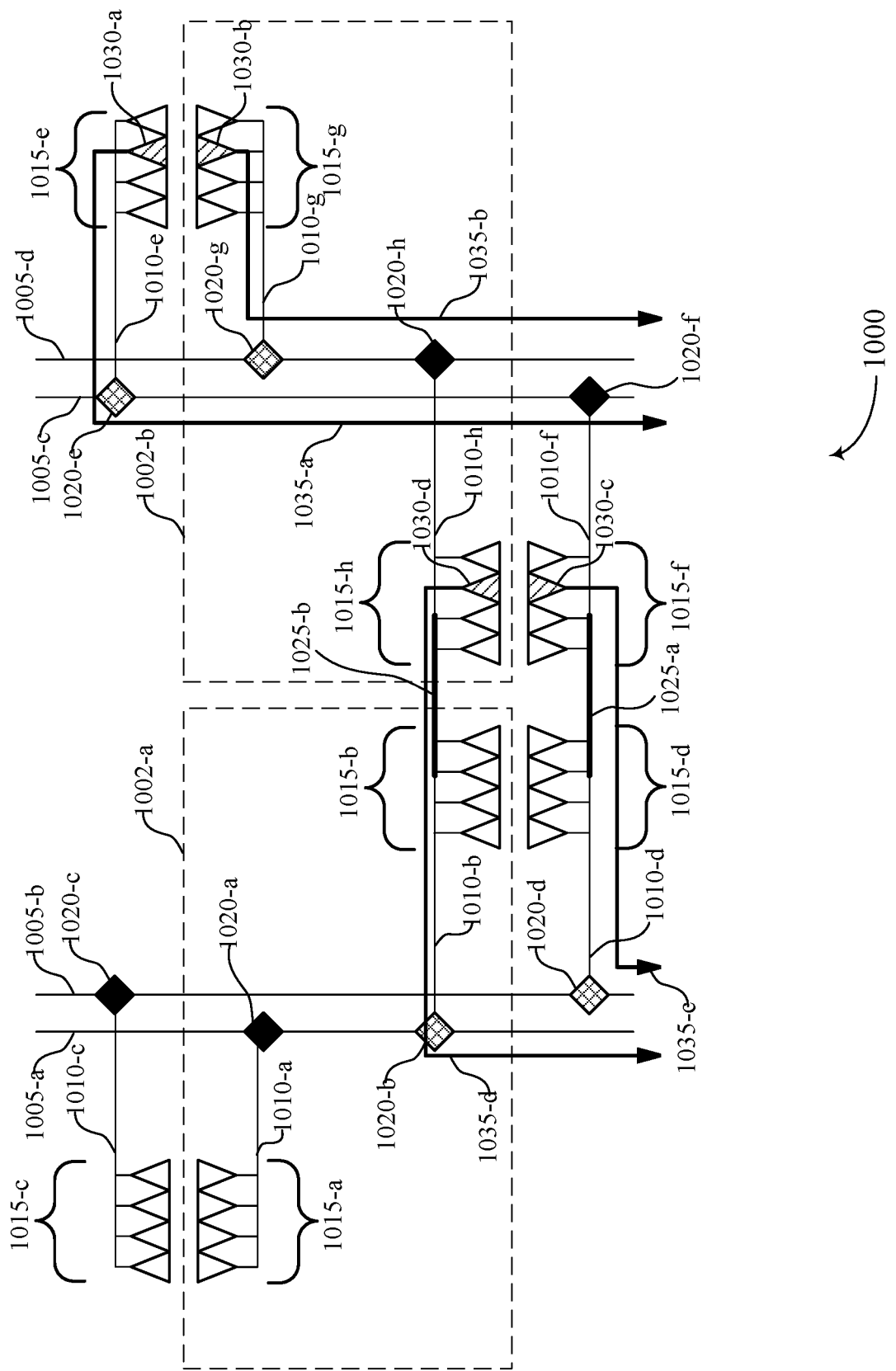
FIG. 10 illustrates an example of aspects of a memory array that supports input/output line sharing for memory subarrays in accordance with examples as disclosed herein.

FIG. 10 illustrates an example of aspects of a memory array 1000 that supports input/output line sharing for memory subarrays in accordance with examples as disclosed herein. The memory array 1000 may include subarray 1002-*a* and subarray 1002-*b*, main I/O lines 1005, local I/O lines 1010, pluralities of sense components 1015, and drivers 1020. The memory array 1000 may also include shunts 1025. Subarrays 1002, main I/O lines 1005, local I/O lines 1010, sense components 1015, and drivers 1020 may be examples of subarrays, main I/O lines, local I/O lines, sense components, and drivers, respectively, as described with reference to FIGS. 5 through 9. Aspects of the memory array 1000 may be similar to the subsets of a memory array 700, 800, or 900. The memory array 1000 may illustrate operation according to an alternative configuration (e.g., compared to the configurations of the subsets of a memory array 700, 800, or 900) for at least the reasons described herein.

A column address (e.g., column select value) may be included in, or otherwise determined based on an access command, and the column address may be used to couple a particular sense component 1030 with a main I/O line 1005. FIG. 10 may illustrate data flows and activated sense components 1030 and drivers 1020 in an example in which the address indicates a column select value of two (e.g., column address of two). The address indicates a column select value of two (e.g., column address of two), which may be generally representative of data flows and activated sense components 1030 and drivers 1020 when a column address corresponds to subarray 1002-*b*.

In the example of a column select value of two, the sense component 1030-*a* of the plurality of sense components 1015-*e* may be activated, the sense component 1030-*b* of the plurality of sense components 1015-*g* may be activated, the sense component 1030-*d* of the plurality of sense components 1015-*h* may be activated, and the sense component 1030-*c* of the plurality of sense components 1015-*f* may be activated. Other sense components 1030 may be deactivated or (e.g., if already deactivated) maintained in a deactivated state. The drivers 1020-*g*, 1020-*e*, 1020-*d*, and 1020-*b* may also be activated (and thus each may couple a corresponding local I/O line 1010 to a corresponding main I/O line 1005). The drivers 1020-*f*, 1020-*h*, 1020-*a*, and 1020-*b* may be deactivated or (e.g., if already deactivated) maintained in a deactivated state (and thus each may decouple (e.g., electrically isolate) a corresponding local I/O line 1010 from a corresponding main I/O line 1005).

Thus, the sense component 1030-*a* may be coupled with the local I/O line 1010-*e* and main I/O line 1005-*c* (e.g., via driver 1020-*e*). The data associated with (e.g., read or written using) sense component 1030-*a* may be exchanged with the host device based on coupling the sense component 1030-*a* with the local I/O line 1010-*e* and main I/O line 1005-*c*. In some cases, the driver 1020-*e* may be activated based on the access command corresponding to a column select value of two. The sense component 1030-*a* and the main I/O line 1005-*c* may be coupled based on activating the driver 1020-*e*. In such cases, sense component 1030-*a* may exchange data with the host device via activated information path 1035-*a*.

Similarly, sense component 1030-*b* may be coupled with the local I/O line 1010-*g* and main I/O line 1005-*d* (e.g., via driver 1020-*g*). The data associated with sense component 1030-*b* may be exchanged with the host device based on coupling the sense component 1030-*b* with the local I/O line 1010-*g* and main I/O line 1005-*d*. In some cases, the driver 1020-*g* may be activated based on the access command corresponding to a column select value of two. The sense component 1030-*b* and the main I/O line 1005-*d* may be coupled based on activating the driver 1020-*g*. In such cases, sense component 1030-*b* may exchange data with the host device via activated information path 1035-*b*.

The driver 1020-*f* and driver 1020-*h* may each be deactivated based on the access command corresponding to a column select value of two (e.g., a value within a range corresponding to subarray 1002-*b*). In some cases, the driver 1020-*f* may be deactivated based on activating driver 1020-*e* on the same main I/O line 1005-*c*. The driver 1020-*h* may be deactivated based on activating driver 1020-*g* on the same main I/O line 1005-*d*.

In some examples, the shunt 1025-*a* may be configured to carry data between the subarray 1002-*b* and the main I/O line 1005-*b* when driver 1020-*f* is deactivated and driver 1020-*d* is activated, and to carry data between the subarray 1002-*a* and the main I/O line 1005-*c* when driver 1020-*d* is deactivated and driver 1020-*f* is activated. Similarly, the shunt 1025-*b* may be configured to carry data between the subarray 1002-*b* and the main I/O line 1005-*a* when driver 1020-*h* is deactivated and driver 1020-*b* is activated, and to carry data between the subarray 1002-*a* and the main I/O line 1005-*d* when driver 1020-*b* is deactivated and driver 1020-*h* is activated.

Thus, if the address range indicates a column select value of two, sense component 1030-*c* may be coupled with main I/O line 1005-*b* via shunt 1025-*a*. In cases where the driver 1020-*f* is deactivated, sense component 1030-*c* and thus subarray 1002-*b* may borrow main I/O line 1005-*b* of subarray 1002-*a* to exchange data with the host device. The driver 1020-*d* may be activated based on the access command corresponding to a column select value of two, thereby allowing the shunt 1025-*a* to route the data between the sense component 1030-*c* and the main I/O line 1005-*b*. That is, the sense component 1030-*c* and the main I/O line 1005-*b* may be coupled based on activating the driver 1020-*d*. In such cases, sense component 1030-*c* may exchange data with the host device via activated information path 1035-*c*.

Similarly, if the address range indicates a column select value of two, sense component 1030-*d* may be coupled with main I/O line 1005-*a* via shunt 1025-*b*. In cases where the driver 1020-*h* is deactivated, sense component 1030-*d* and thus subarray 1002-*a* may borrow main I/O line 1005-*a* of subarray 1002-*a* to exchange data with the host device. The driver 1020-*b* may be activated based on the access command corresponding to a column select value of two, thereby allowing the shunt 1025-*b* to route the data between the sense component 1030-*d* and the main I/O line 1005-*a*. That is, the sense component 1030-*d* and the main I/O line 1005-*a* may be coupled based on activating the driver 1020-*b*.

Based on the address indicated in the access command, the plurality of sense components 1015-*a*, 1015-*b*, 1015-*c*, and 1015-*d* may each be deactivated. For example, the plurality of sense components 1015-*a*, 1015-*b*, 1015-*c*, and 1015-*d* may correspond to an address range that does not include the address indicated in the access command. In such cases, the driver 1020-*a* coupled with the plurality of sense components 1015-*a* may be deactivated, and the driver 1020-*c* coupled with the plurality of sense components 1015-*c* may be deactivated.

Thus, in some cases, the sharing of one or more local I/O lines by adjacent (e.g., neighboring) subarrays may be combined with the sharing of one or more sense component including with subarrays in adjacent (e.g., neighboring) banks. When data is read from or written to an accessed subarray, it may be communicated at least in part by a main I/O line that does not traverse the accessed subarray, but instead traverses a neighbor subarray, and may also be read or written at least in part using a sense component in (or under or above) a different subarray or bank.

Figure 11:
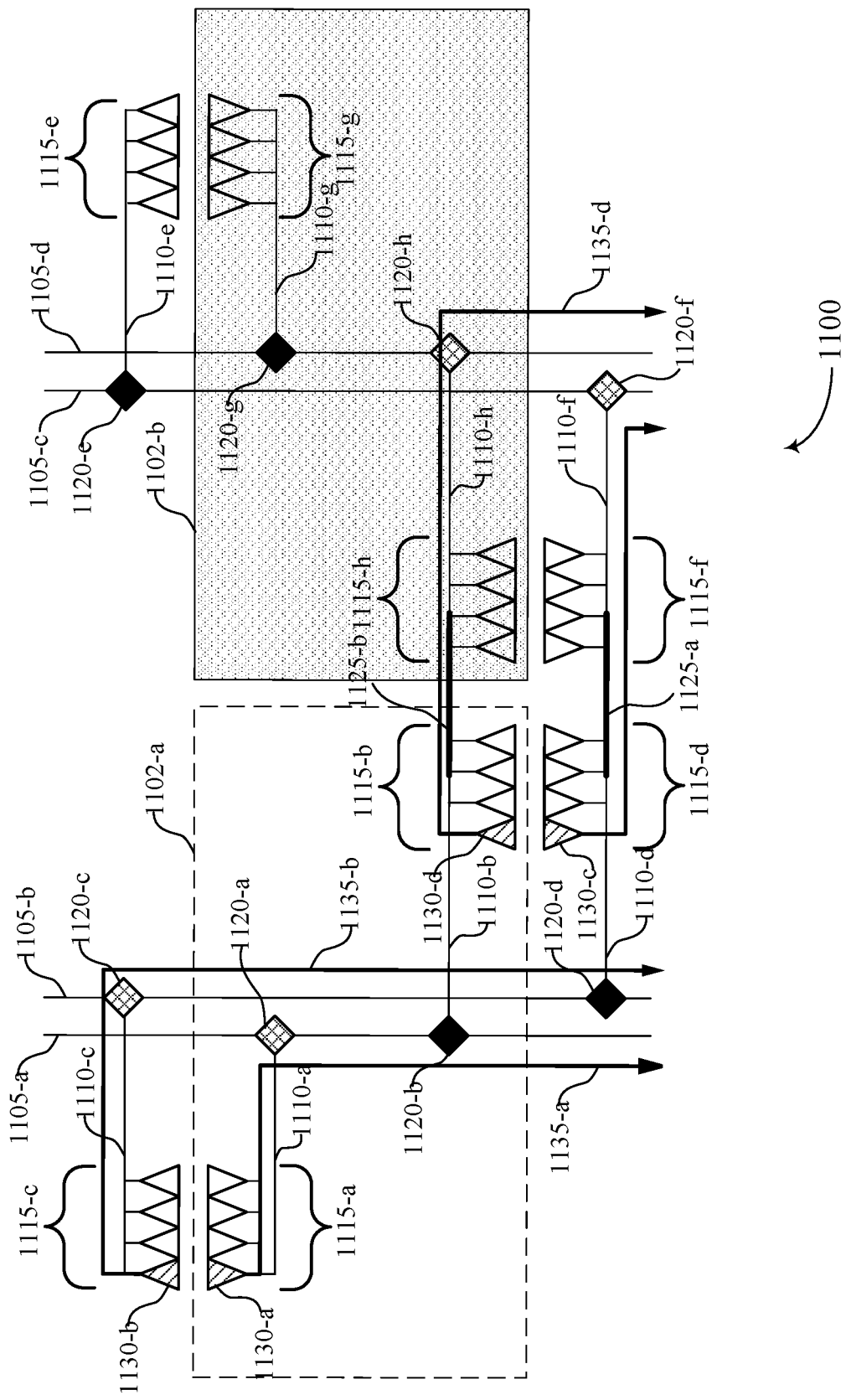
FIG. 11 illustrates an example of aspects of a memory array that supports input/output line sharing for memory subarrays in accordance with examples as disclosed herein.

FIG. 11 illustrates an example of aspects of a memory array 1100 that supports input/output line sharing for memory subarrays in accordance with examples as disclosed herein. The memory array 1100 may include subarray 1102-*a* and subarray 1102-*b* (e.g., memory tiles, memory patches), main I/O lines 1105, local I/O lines 1110, pluralities of sense components 1115, and drivers 1120. The memory array 1100 may also include shunts 1125. Subarrays 1102, main I/O lines 1105, local I/O lines 1110, sense components 1115, and drivers 1120 may be examples of subarrays, main I/O lines, local I/O lines, sense components, and drivers, respectively, as described with reference to FIGS. 5 through 10. Aspects of the memory array 1100 may be identical or similar to the subsets of a memory array 700, 800, 900, or 1000. The memory array 1100 may illustrate operation according to an alternative configuration or mode (e.g., compared to the configurations or modes of the subsets of a memory array 700, 800, 900, or 1000) for at least the reasons described herein.

For example, a memory device that includes the memory array 1100 may receive a command to operate the memory array 1100 (or the memory array) in a reduced power mode. In some cases, the reduced power mode may correspond to a reduced page size and may be referred to as a reduced page mode. When operating in the reduced power mode, the memory device may be configured to activate only a subset of the subarrays in an activated bank, while deactivating other subarrays in the activated bank or (e.g., if already deactivated) maintaining such other subarrays in a deactivated mode. For example, the memory device may be configured to activate only half (or some other faction) of the subarrays in an activated bank.

In some cases, an addressable range of column addresses may be divided into subsets (e.g., non-overlapping ranges that are each a subset of the overall addressable range), and each subset of the column address range may correspond to a respective subset of the subarrays in each bank of the memory array. For example, if the overall addressable range of column addresses is zero though seven (0:7), and the subarrays in the bank are divided into two subsets, a first address range of zero through three (0:3) may correspond to subarrays in the first subset of subarrays, and a second address range of four through seven (4:7) may correspond to subarrays in the first subset of subarrays. When the memory device is operating the memory array in the reduced power mode and receives an access command associated with (e.g., including) a column address value within the first range, the memory device may activate only the first subset of subarrays within a bank, and the second (e.g., other) subset of subarrays within the bank may be deactivated or maintained in a deactivated mode. Similarly, when the memory device is operating the memory array in the reduced power mode and receives an access command associated with (e.g., including) a column address value within the second range, the memory device may activate only the second subset of subarrays within a bank, and the first (e.g., other) subset of subarrays within the bank may be deactivated or maintained in a deactivated mode.

In some cases, an activation command (e.g., an ACT command) that is associated with (e.g., precedes as part of a command sequence) the access command may indicate an address range for the associated (e.g., forthcoming) access command. For example, the activation command may indicate the first address range of zero through three (0:3), and then the access command may be associated with a column select value of two (or any other value within the range of zero through three). As another example, the activation command may indicate the second address range of four through seven (4:7), and then the access command may be associated with a column select value of five (or any other value within the range of four through seven). In some cases, the activation command may indicate the address range directly (e.g., may specify the endpoints or at least one endpoint and a size of the address range). In other cases, the activation command may indicate the address range indirectly. For example, a bit included in the activation command may indicate whether the address range corresponds to the first address range or a second address range, such as a first (e.g., lower) half of the overall addressable range or a second (e.g., upper) half of the overall addressable range). Other numbers of bits configured to indicate one of any other number of ranges within the overall addressable range are also possible (e.g., two bits may indicate one out of four ranges (e.g., subsets) within the overall addressable range).

In some cases, the activation command may include the command to operate the memory array in the reduced power mode. In other cases, the command to operate the memory array in the reduced power mode may be received separate from (e.g., before) the activation command. Any number of activation commands and associated access commands may be received while operating the memory array in the reduced power mode.

FIG. 11 may illustrate data flows and activated sense components 1130 and drivers 1120 in an example in which the address indicates a column select value of seven (e.g., column address of seven), which may be generally representative of data flows and activated sense components 1130 and drivers 1120 when a column address corresponds to subarray 1102-*a*, and may be identical to those described with reference to FIG. 9. Based on the reduced power mode, however, as well as the column address corresponding to subarray 1102-*a* (e.g., based on an indicated address range including column addresses corresponding to subarray 1102-*a*), subarray 1102-*a* may be activated, and subarray 1102-*b* may be deactivated or (e.g., if already deactivated) maintained in a deactivated mode. Other pairs of subarrays coupled via respective shunts 1125 and within the same bank as subarrays 1102-*a* and 1102-*b* may be similarly operated, with one of the coupled subarrays activated and the other deactivated, such that half of the subarrays in the bank are activated and half are deactivated.

By activating the subarray 1102-*a* and deactivating the subarray 1102-*b*, the subset of a memory array 1100 may reduce the page size by half as compared to the page size of the memory array 900 as described with reference to FIG. 9. For example, the memory array 1100 may sense half of the amount of bits as compared to the number of bits sensed by the memory array 900 (e.g., not sensing memory cells of the deactivated subarray 1102-*b* that would otherwise be commonly or simultaneously sensed or accessed with the activated subarray 1102-*a*). This, along with the deactivation of various circuitry or other components associated with the deactivated subarray 1102-*b*, may provide power saving and other benefits.

Figure 12:
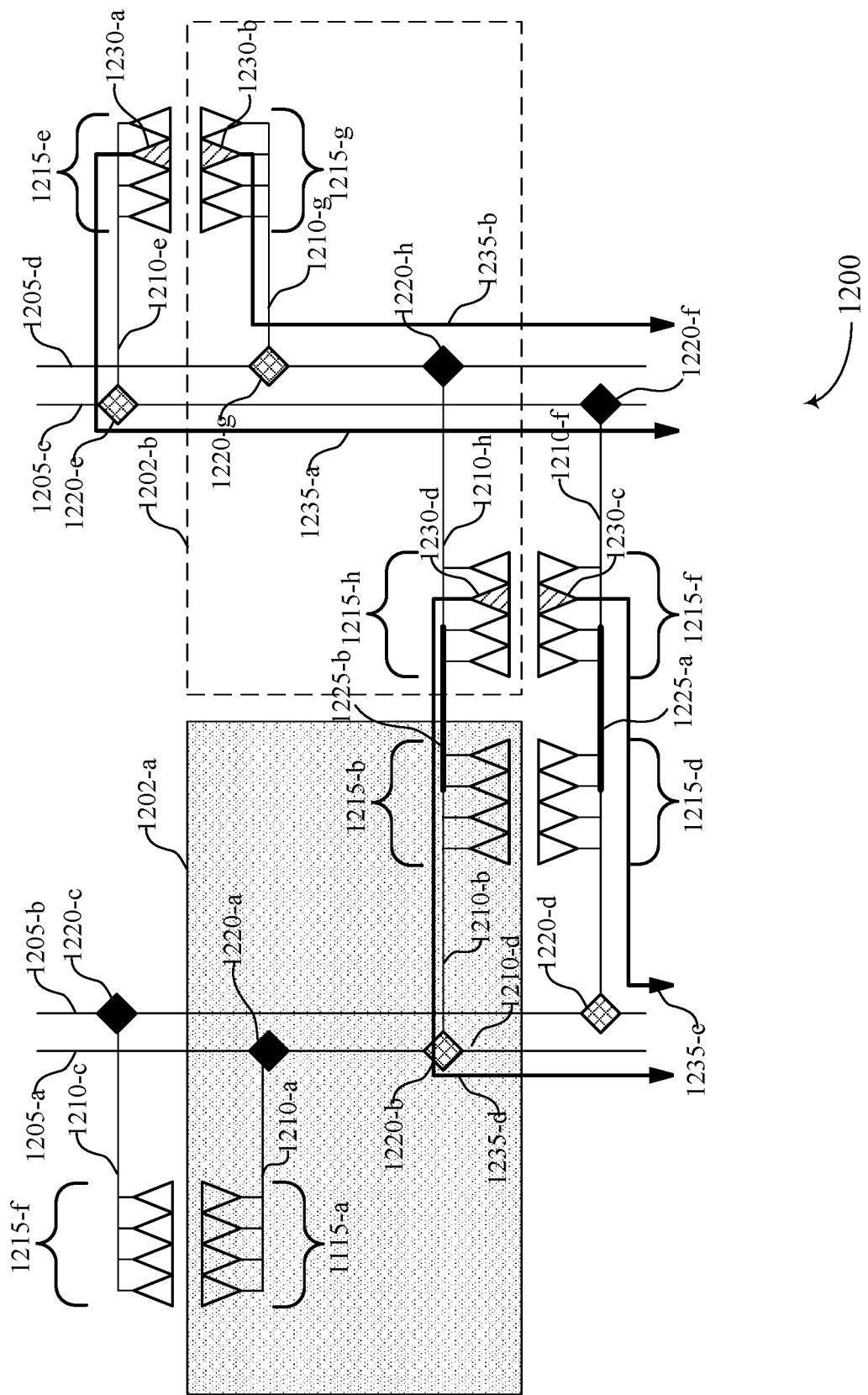
FIG. 12 illustrates an example of aspects of a memory array that supports input/output line sharing for memory subarrays in accordance with examples as disclosed herein.

FIG. 12 illustrates an example of aspects of a memory array 1200 that supports input/output line sharing for memory subarrays in accordance with examples as disclosed herein. The memory array 1200 may include subarray 1202-*a* and subarray 1202-*b*, main I/O lines 1205, local I/O lines 1210, pluralities of sense components 1215, and drivers 1220. The memory array 1200 may also include shunts 1225. Subarrays 1202, main I/O lines 1205, local I/O lines 1210, sense components 1215, and drivers 1220 may be examples of subarray and main I/O line, local I/O line, sense components, and drivers, respectively, as described with reference to FIGS. 5 through 11. Aspects of the memory array 1200 may be similar to the subsets of a memory array 700, 800, 900, or 1000, or the memory array 1100. The memory array 1200 may illustrate operation according to an alternative configuration or mode (e.g., compared to the configurations or modes of the subsets of a memory array 700, 800, 900, or 1000, or the memory array 1100) for at least the reasons described herein.

FIG. 12 may illustrate data flows and activated sense components 1230 and drivers 1220 in an example in which the address indicates a column select value of two (e.g., column address of two), which may be generally representative of data flows and activated sense components 1230 and drivers 1220 when a column address corresponds to subarray 1202-*b*, and may be identical to those described with reference to FIG. 10. Based on the reduced power mode, however, as well as the column address corresponding to subarray 1202-*b* (e.g., based on an indicated address range including column addresses corresponding to subarray 1202-*b*), subarray 1202-*b* may be activated, and subarray 1202-*a* may be deactivated or (e.g., if already deactivated) maintained in a deactivated mode. Other pairs of subarrays coupled via respective shunts 1225 and within the same bank as subarrays 1202-*a* and 1202-*b* may be similarly operated, with one of the coupled subarrays activated and the other deactivated, such that half of the subarrays in the bank are activated and half are deactivated.

By activating the subarray 1202-*b* and deactivating the subarray 1202-*a*, the memory array 1200 may reduce the page size by half as compared to the page size of the memory array 1000 as described with reference to FIG. 10. For example, the memory array 1200 may sense half of the amount of bits as compared to the number of bits sensed by the memory array 1000 (e.g., not sensing memory cells of the deactivated subarray 1202-*a* that would otherwise be commonly or simultaneously sensed or accessed with the activated subarray 1202-*b*). This, along with the deactivation of various circuitry or other components associated with the deactivated subarray 1002-*a*, may provide power saving and other benefits.

Thus, in some cases, the sharing of one or more local I/O lines by adjacent (e.g., neighboring) subarrays—whether or not combined with the sharing of one or more sense component including with subarrays in adjacent (e.g., neighboring) banks—may support the use of a reduced page size, which may correspond to a reduced page mode or reduced power mode, in which one or more unaccessed subarrays within an activated bank may remain deactivated.

Figure 13:
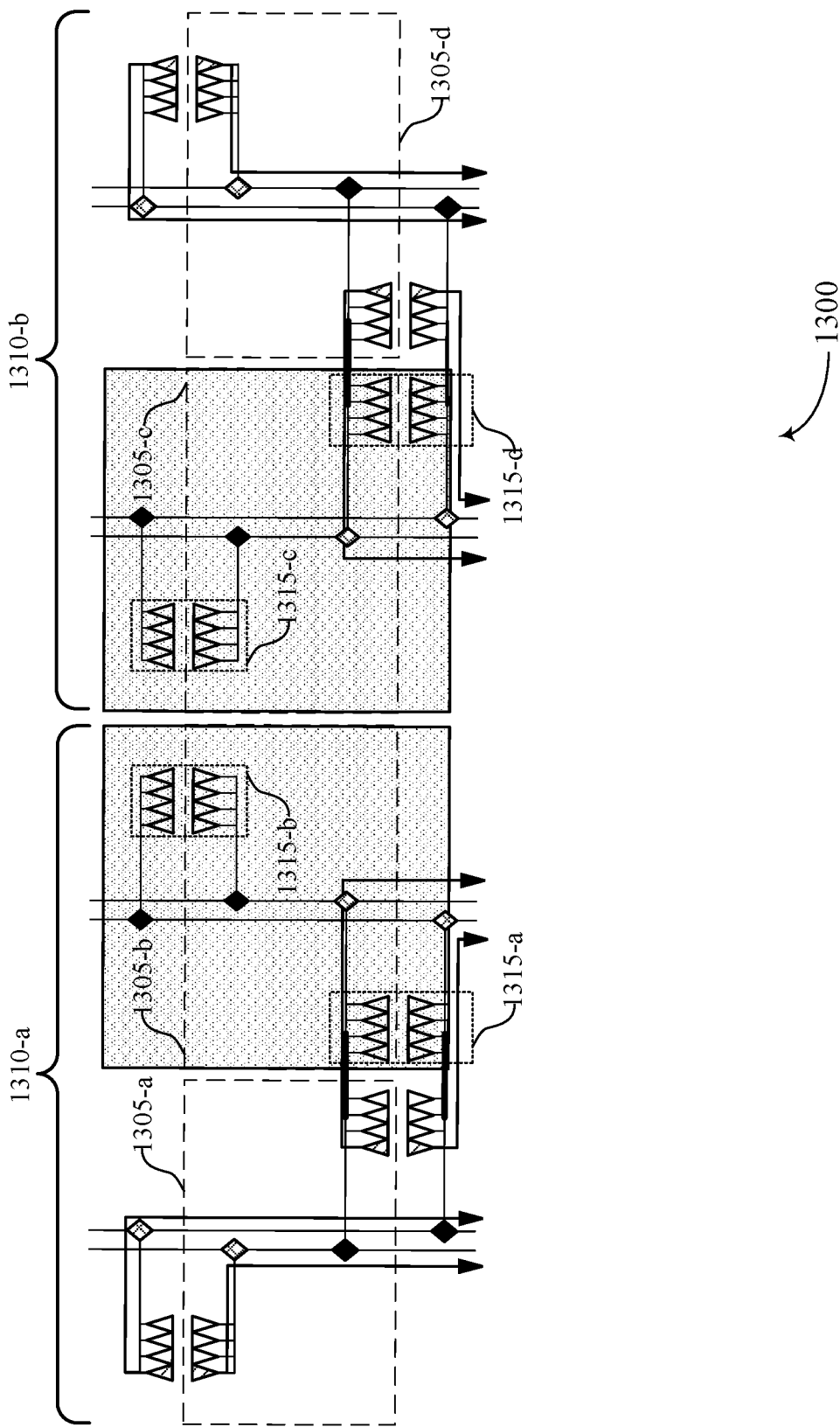
FIG. 13 illustrates an example of aspects of a memory array that supports input/output line sharing for memory subarrays in accordance with examples as disclosed herein.

FIG. 13 illustrates an example of aspects of a memory array 1300 that supports input/output line sharing for memory subarrays in accordance with examples as disclosed herein. The memory array 1300 may include subarrays 1305-*a*, 1305-*b*, 1305-*c*, and 1305-*d*. The subarrays 1305 may be examples of the subarrays or tiles described with reference to FIGS. 3 through 12. For example, the subarrays 1305 may be an example of, or otherwise share certain characteristics with the memory tiles 400 described with reference to FIG. 4.

The subarray 1305-*a* and the subarray 1305-*b* may be included in a subset 1310-*a* of a bank. Aspects of the subset 1310-*a* may be similar to the memory array 1100, and operation of the subset 1310-*a* may be similar to operations of the memory array 1100 (e.g., as described with reference to FIG. 11). The subarray 1305-*c* and the subarray 1305-*d* may be included in a subset 1310-*b* of the bank. Aspects of the subset 1310-*b* may be similar to the memory array 1200, and operations of the subset 1310-*b* may be similar to operations of the memory array 1200 (e.g., as described with reference to FIG. 12).

In some memory arrays, subarrays in different subsets may alternate within a bank, such that subarrays in the bank corresponding to a lower half of an overall address range (e.g., 0:3) may be between immediately adjacent subarrays in the bank both corresponding to an upper half of an overall address range (e.g., 4:7). Thus, when operating in a reduced power mode, the subarrays may be operated according to an every-other or alternating activation pattern (e.g., on, off, on, off, on, off, on, off . . . across the bank).

FIG. 13 may illustrate an example, however, in which subarrays 1305 in different subsets 1310 but corresponding to a same address range (e.g., a same range of column select values) are located adjacent to each other. For example, subarrays 1305-*b* and 1305-*c* may both correspond to a same address range (e.g., a lower half of an overall address range, such as 0:3). Subarrays 1305-*a* and 1305-*d* may also both correspond to a same address range (e.g., an upper half of an overall address range, such as 4:7), and one or both may also be adjacent another subarray (not shown) within the bank that also corresponds to the same address range (e.g., 4:7).

Because subarrays corresponding to a same address range may be activated or deactivated concurrently, locating subarrays 1305 in different subsets 1310 but corresponding to a same address range adjacent to each other may allow for increased power savings and other benefits. For example, in some cases, adjacent subarrays such as subarrays 1305-*b* and 1305-*c* may share (e.g., borrow, both access, be selectively coupled to, or otherwise leverage) one or more components. For example, a set of sense components 1315-*b* and a set of sense components 1315-*c* may share one or more common circuit aspects, such as drivers, voltage references, latches, or other components. As another example, one or more timing circuits may be configured to generate timing signals (which may, in some cases, be referred to as phases) for operating aspects of subarrays 1305-*b* and 1305-*c* (e.g., for executing activation, access, precharge, or other commands on subarrays 1305-*b* and 1305-*c*, and subarrays 1305-*b* and 1305-*c* may share one or more aspects of such timing circuits). As another example, subarrays 1305-*b* and 1305-*c* may share word line drivers for activating (e.g., increasing the voltage of) word lines (e.g., as indicated to be activated by activation commands) within the subarrays 1305-*b* and 1305-*c*. Thus, locating subarrays 1305 in different subsets 1310 but corresponding to a same address range adjacent to each other may allow for an increased amount of components to be deactivated when in the reduced power mode (e.g., as compared to an alternating pattern in which no two adjacent subarrays are concurrently deactivated), and thus for increased power savings, among other benefits.

FIG. 13 may illustrate data flows and activated sense components and drivers in an example in which the address indicates a column select value of seven (e.g., column address of seven), which may be generally representative of data flows and activated sense components and drivers when a column address corresponds to subarrays 1305-*a* and 1305-*d*. The data flows for subset 1310-*a* may be identical to those described with reference to FIG. 9, and the data flows for subset 1310-*b* may be mirrored version thereof. Based on the reduced power mode, however, as well as column address corresponding to subarrays 1305-*a* and 1305-*d* (e.g., based on an indicated address range including column addresses corresponding to subarrays 1305-*a* and 1305-*d*), subarrays 1305-*a* and 1305-*d* may be activated, and subarrays 1305-*b* and 1305-*c* may be deactivated or (e.g., if already deactivated) maintained in a deactivated mode. Other pairs of subarrays coupled via respective shunts and within the same bank as subarrays 1305-*a*, 1305-*b*, 1305-*c*, and 1305-*d* may be similarly operated, with one of the coupled subarrays activated and the other deactivated, such that half of the subarrays in the bank are activated and half are deactivated, with deactivated subarrays adjacent to one other deactivated subarray.

For example, the subarray 1305-*b* and the subarray 1305-*c* may be deactivated based on the access command corresponding to the subarray 1305-*a*, the subarray 1305-*d*, or both. In some cases, the deactivated subarray 1305-*b* may be adjacent to the deactivated subarray 1305-*c*. In such cases, common circuitry shared between the subarray 1305-*b* and the subarray 1305-*c* may be deactivated. In such examples, a set of sense components 1315-*a* and a set of sense components 1315-*b*, each associated with the subarray 1305-*b*, may be deactivated. A set of sense components 1315-*c* and a set of sense components 1315-*d*, each associated with the subarray 1305-*c*, may also be deactivated. In some examples, a single control signal (e.g., of a control bus 366) may support deactivating the set of sense components 1315-*a*, 1315-*b*, 1315-*c*, and 1315-*d*.

Figure 14:
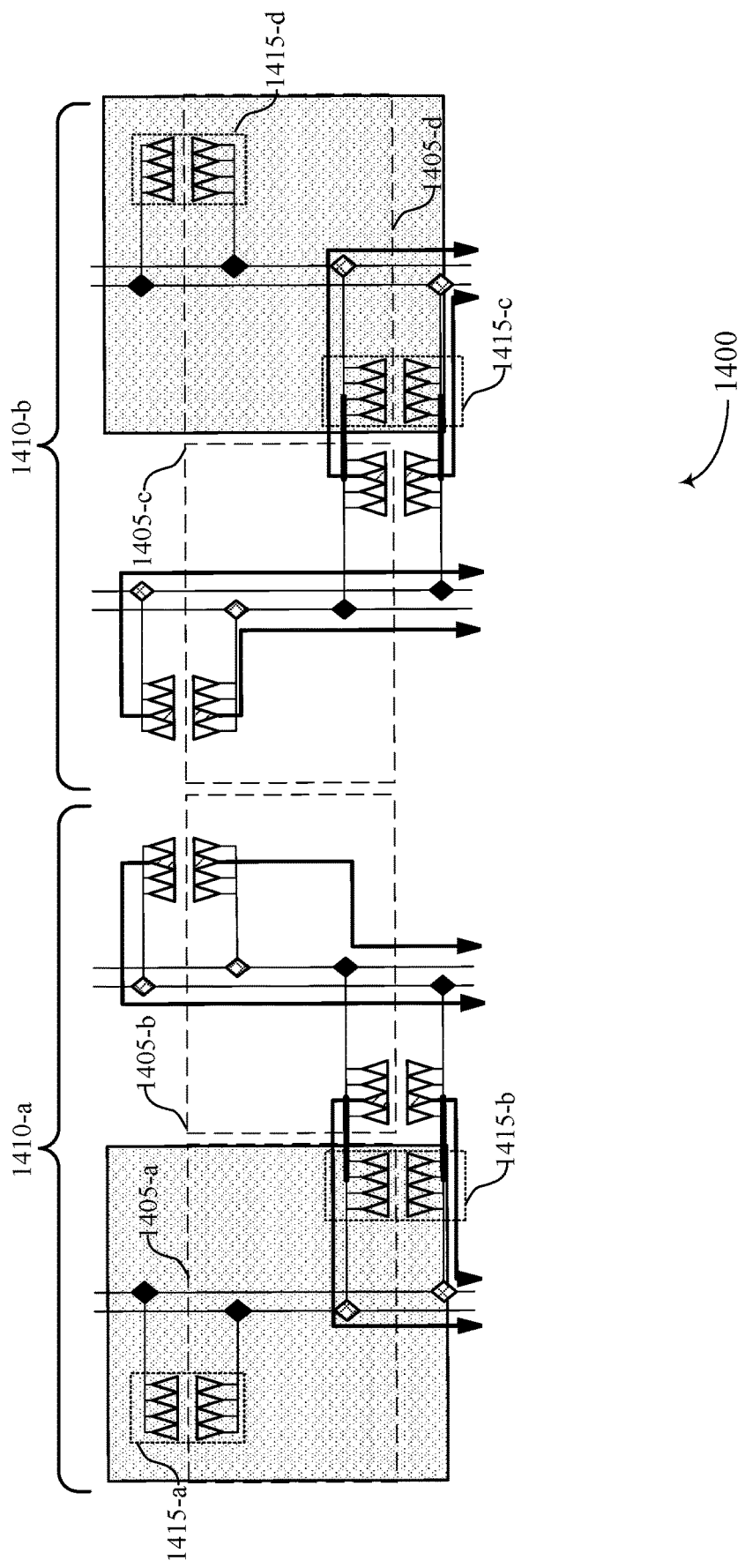
FIG. 14 illustrates an example of aspects of a memory array that supports input/output line sharing for memory subarrays in accordance with examples as disclosed herein.

FIG. 14 illustrates an example of aspects of a memory array 1400 that supports input/output line sharing for memory subarrays in accordance with examples as disclosed herein. The memory array 1400 may include subarrays 1405-*a*, 1405-*b*, 1405-*c*, and 1405-*d*. The subarrays 1405 may be examples of the subarrays or tiles described with reference to FIGS. 3 through 13. For example, the subarrays 1405 may be an example of, or otherwise share certain characteristics with the memory tiles 400 described with reference to FIG. 4.

A subset 1410-*a* may include the subarray 1405-*a* and the subarray 1405-*b*. Aspects of the subset 1410-*a* may be similar to the memory array 1200, and operation of the subset 1410-*a* may be similar to operations of the memory array 1200 (e.g., as described with reference to FIG. 12). A subset 1410-*b* may include the subarray 1405-*c* and the subarray 1405-*d*. Aspects of the subset 1410-*b* may be similar to the memory array 1100, and operation of the subset 1310-*b* may be similar to operation of the memory array 1100 (e.g., as described with reference to FIG. 11).

FIG. 14 may illustrate data flows and activated sense components and drivers in an example in which the address indicates a column select value of two (e.g., column address of two), which may be generally representative of data flows and activated sense components and drivers when a column address corresponds to subarrays 1405-*b* and 1405-*c*. The data flows for subset 1410-*a* may be identical to those described with reference to FIG. 10, and the data flows for subset 1410-*b* may be mirrored version thereof. Based on the reduced power mode, however, as well as the column address corresponding to subarrays 1405-*b* and 1405-*c* (e.g., based on an indicated address range including column addresses corresponding to subarrays 1405-*b* and 1405-*c*), subarrays 1405-*b* and 1405-*c* may be activated, and subarrays 1405-*a* and 1405-*d* may be deactivated or (if already deactivated) maintained in a deactivated mode. Other pairs of subarrays coupled via respective shunts and within the same bank as subarrays 1405-*a*, 1405-*b*, 1405-*c*, and 1405-*d* may be similarly operated, with one of the coupled subarrays activated and the other deactivated, such that half of the subarrays in the bank are activated and half are deactivated, with deactivated subarrays adjacent to one other deactivated subarray.

For example, subarray 1405-*a* and the subarray 1405-*d* may be deactivated based on the access command corresponding to the subarray 1405-*b*, the subarray 1405-*c*, or both. In some cases, the deactivated subarray 1405-*a* may not be adjacent to the deactivated subarray 1405-*d* (i.e., subarray 1405-*a* may be adjacent to activated subarray 1405-*b* and subarray 1405-*d* may be adjacent to activated subarray 1405-*c*). In such examples, a set of sense components 1415-*a* and a set of sense components 1415-*b*, each associated with the subarray 1405-*a* may be deactivated. A set of sense components 1415-*c* and a set of sense components 1415-*d*, each associated with the subarray 1405-*d* may also be deactivated. In some examples, a single control signal (e.g., of a control bus 366) may support deactivating the set of sense components 1415-*a*, 1415-*b*, 1415-*c*, and 1415-*d*.

Figure 15:
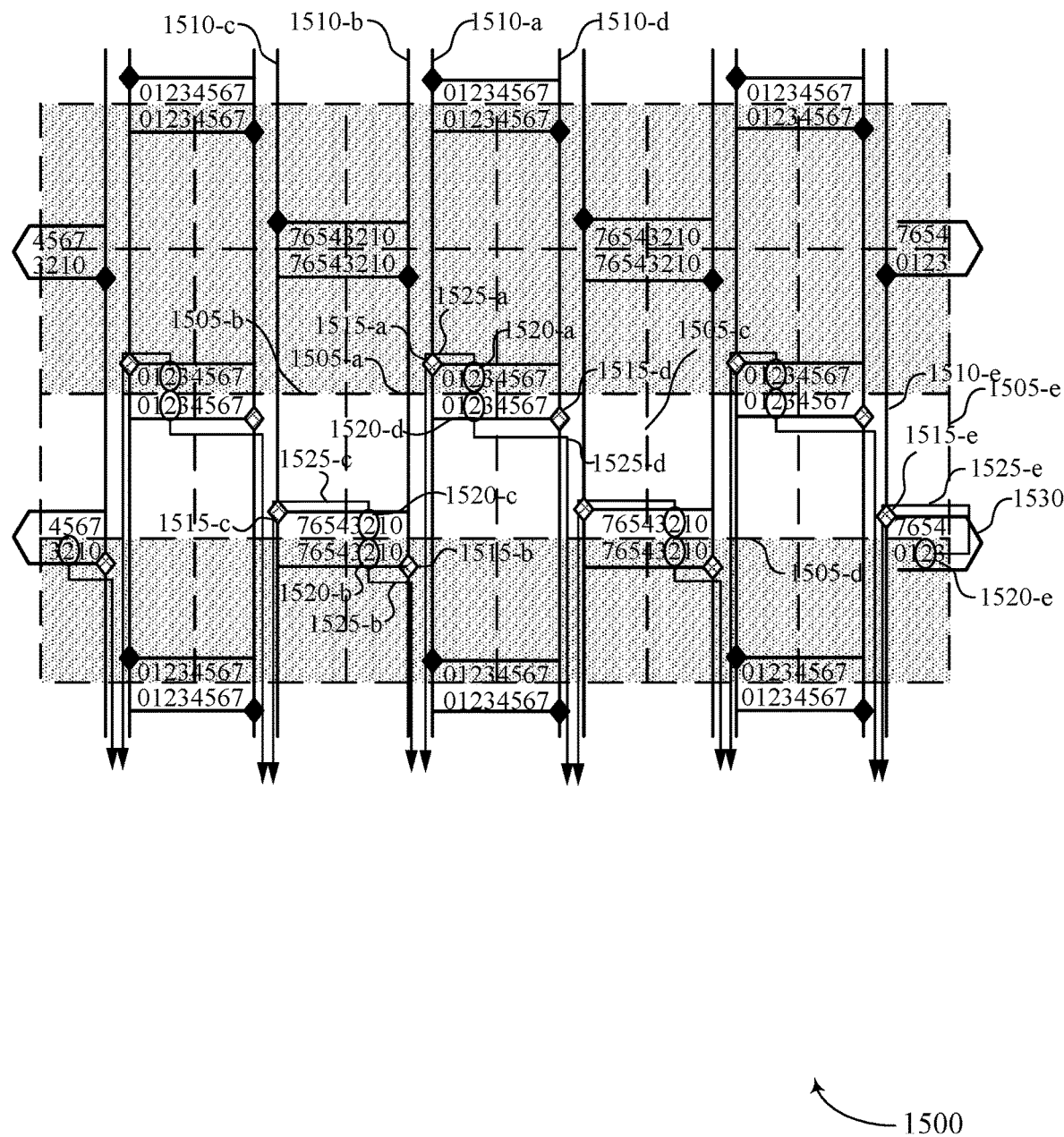
FIG. 15 illustrates an example of aspects of a memory array that supports input/output line sharing for memory subarrays in accordance with examples as disclosed herein.

FIG. 15 illustrates an example of aspects of a memory array 1500 that supports input/output line sharing for memory subarrays in accordance with examples as disclosed herein. The memory array 1500 may include subarrays 1505, main I/O lines 1510, drivers 1515, and sense components 1520. Subarrays 1505, main I/O lines 1510, drivers 1515, and sense components 1520 may be examples of subarrays, main I/O lines, drivers, and sense components, respectively, as described with reference to FIGS. 5 through 14. For example, the subarrays 1505 may be an example of, or otherwise share certain characteristics with the memory tiles 400 described with reference to FIG. 4.

The subarray 1505-*b* may be adjacent to the subarray 1505-*a*, and the subarray 1505-*a* may be adjacent to the subarray 1505-*c*. In such cases, the subarray 1505-*a* may be between the subarray 1505-*b* and the subarray 1505-*c*. The subarrays 1505-*a*, 1505-*b*, and 1505-*c* may each be in a different column of the memory array 1500, and in the same row (e.g., bank, section) of the memory array 1500. In some cases, when the bank that includes subarrays 1505-*a*, 1505-*b*, and 1505-*c* is activated, the entire row of the memory array 1500 including the subarrays 1505-*a*, 1505-*b*, and 1505-*c* may be activated while the other rows (e.g., banks) of the memory array 1500 may be deactivated.

Each column of subarrays 1505 may be associated with (e.g., configured to be selectively coupled with) a corresponding pair of main I/O lines 1510, which both may traverse the column of subarrays 1505. For example, the subarray 1505-*a* may be associated with (e.g., configured to be selectively coupled with) a main I/O line 1510-*a* and a main I/O line 1510-*b* traversing the subarray 1505-*a*. In some cases, a main I/O line 1510 may be representative of a single I/O line (e.g., a portion of a tile multiplexer bus 341, or a line of bus configured to be selectively coupled with or mapped to a tile multiplexer bus 341).

Each subarray 1505 may be associated with (e.g., include, overlie, underlie) a pair of drivers 1515 and a pair of local I/O lines. A first driver 1515 of the pair may be coupled with a first local I/O line that is shared by (e.g., at least partially traverses and may be used to carry data for) the corresponding subarray 1505 and a first neighbor subarray 1505 within the same bank. A second driver 1515 of the pair may be coupled with a second local I/O line that is shared by (e.g., at least partially traverses and may be used to carry data for) the corresponding subarray 1505 and a second neighbor subarray 1505 within the same bank. The corresponding subarray 1505 may be located between the first neighbor subarray 1505 and the second neighbor subarray 1505. Thus, a for example, subarray 1505 may share at least one local I/O line with a left neighbor subarray 1505 and at least one local I/O line with a right neighbor subarray 1505.

Each of the shared local I/O lines may be coupled with two pluralities of sense components, one plurality of sense components configured to be used when accessing the corresponding subarray 1505, and another plurality of sense components configured to be used when accessing the neighbor subarray 1505.

Further, in some cases, a plurality of sense components may be shared by the corresponding (e.g., overlying, underlying) subarray 1505 and a neighbor subarray 1505 in an adjacent bank (e.g., above or below, on the page as illustrated in FIG. 15). Thus, the plurality of sense components may be operable (e.g., using multiplexing or other switching circuitry and interconnects) to support access operations in either the corresponding subarray 1505 or the neighbor subarray 1505 in the adjacent bank.

These and other concepts may be illustrated and explained using subarrays 1505-a, 1505-b, and 1505-c as examples. The driver 1515-a may correspond to a subarray 1505 above subarray 1505-a and may be coupled with the main I/O line 1510-a. The driver 1515-a may be coupled with a local I/O line, which may in turn be coupled with a plurality of sense components including sense component 1520-a (e.g., a plurality of sense components corresponding to column select values of zero, one, two, or three). The plurality of sense components including sense component 1520-a may be associated with the subarray above subarray 1505-a, but may be configured to sense data from the subarray above subarray 1505-a or from subarray 1505-a. The local I/O line may also be coupled with a different plurality of sense components (e.g., corresponding to column select values of four, five, six, or seven). The different plurality of sense components may be associated with the subarray above subarray 1505-c, but may be configured to sense data from the subarray above subarray 1505-c or from subarray 1505-c.

The driver 1515-b may correspond to a subarray 1505 below subarray 1505-a and may be coupled with the main I/O line 1510-b. The driver 1515-b may be coupled with a local I/O line, which may in turn be coupled with a plurality of sense components including sense component 1520-b (e.g., a plurality of sense components corresponding to column select values of zero, one, two, or three). The plurality of sense components including sense component 1520-b may be associated with the subarray below subarray 1505-a, but may be configured to sense data from the subarray 1505 below subarray 1505-a or from subarray 1505-a. The local I/O line may also be coupled with a different plurality of sense components (e.g., corresponding to column select values of four, five, six, or seven). The different plurality of sense components may be associated with the subarray below subarray 1505-a, but may be configured to sense data from the subarray 1505 below subarray 1505-b or from the subarray 1505-b.

The pluralities of sense components (e.g., including the sense component 1520-a and the sense component 1520-b) may each be associated with an address range indicating a column select value of zero, one, two, or three (e.g., a first subset of a range of column addresses). For example, the sense component 1520-a and the sense component 1520-b may each be activated in response to a column select value of two.

The subarray 1505-b may be associated with (e.g., traversed by) at least a main I/O line 1510-c. The driver 1515-c may be coupled with the main I/O line 1510-c. The driver 1515-c may be coupled with a local I/O line, which may in turn be coupled with a plurality of sense components including sense component 1520-c. The plurality of sense components including sense component 1520-c may be associated with subarray 1505-a, but may be configured to sense data from subarray 1505-a or from the subarray below subarray 1505-a. The plurality of sense components may each be associated with an address range indicating a column select value of zero, one, two, or three (e.g., a first subset of a range of column addresses). For example, the sense component 1520-c may indicate a column select value of two. In some cases, the main I/O line 1510-c may also be coupled with a different plurality of sense components (e.g., indicating a column select value of four, five, six, or seven). The different plurality of sense components may be associated with subarray 1505-b, but may be configured to sense data from the subarray 1505-b or from the subarray below subarray 1505-b.

The subarray 1505-c may be associated with (e.g., traversed by) at least a main I/O line 1510-d. The driver 1515-d may be coupled with the main I/O line 1510-d. The driver 1515-d may be coupled with a local I/O line, which may in turn be coupled with a plurality of sense components including sense component 1520-d. The plurality of sense components including sense component 1520-d may be associated with subarray 1505-a, but may be configured to sense data from subarray 1505-a or from the subarray above subarray 1505-a. The plurality of sense components may each be associated with an address range indicating a column select value of zero, one, two, or three (e.g., a first subset of a range of column addresses). For example, the sense component 1520-d may indicate a column select value of two. In some cases, the main I/O line 1510-d may also be coupled with a different plurality of sense components (e.g., indicating a column select value of four, five, six, or seven). The different plurality of sense components may be associated with subarray 1505-c, but may be configured to sense data from the subarray 1505-c or from the subarray above subarray 1505-c.

A column address (e.g., column select value) may be included in, or otherwise determined based on an access command, and the column address may be used to couple a particular sense component 1520 with a main I/O line 1510. FIG. 15 may illustrate data flows and activated sense component 1520 and drivers 1515 in an example in which the address indicates a column select value of two, and the sense component 1520-a, 1520-b, 1520-c, and 1520-d of the pluralities of sense components may be activated.

In the example of a column select value of two, sense component 1520-a may be coupled with the main I/O line 1510-a, and the data associated with sense component 1520-a may be exchanged with the host device based on coupling the sense component 1520-a with the main I/O line 1510-a. The sense component 1520-a may be included in the tile (e.g., subarray) above the subarray 1505-a, but the sense component 1520-a may be borrowed when the subarray 1505-a is activated (e.g., accessed). In some cases, the driver 1515-a may be activated based on the access command corresponding to a column select value of two. In some examples, the driver 1515-a may be activated based on bank activation (e.g., based on an activation command for the bank that includes the subarray 1505-a), borrowing activation, or a combination thereof. The sense component 1520-a and the main I/O line 1510-a may be coupled based on activating the driver 1515-a. In such cases, sense component 1520-a may exchange data with the host device via activated path 1525-a.

Continuing the example of a column select value of two, sense component 1520-b may be coupled with the main I/O line 1510-b, and the data associated with sense component 1520-b may be exchanged with the host device based on coupling the sense component 1520-b with the main I/O line 1510-b. The sense component 1520-b may be included in the tile (e.g., subarray) below the subarray 1505-a, but the sense component 1520-b may be borrowed when the subarray 1505-a is activated (e.g., accessed). In some cases, the driver 1515-b may be activated based on the access command corresponding to a column select value of two. In some examples, the driver 1515-b may be activated based on bank activation (e.g., based on an activation command for the bank that includes the subarray 1505-a), borrowing activation, or a combination thereof. The sense component 1520-b and the main I/O line 1510-b may be coupled based on activating the driver 1515-b. In such cases, sense component 1520-b may exchange data with the host device via activated path 1525-b.

Further continuing the example of a column select value of two, the sense component 1520-c may be coupled with the main I/O line 1510-c, and the data associated with sense component 1520-c may be exchanged with the host device based on coupling the sense component 1520-c with the main I/O line 1510-c. In some cases, the driver 1515-c may be activated based on the access command corresponding to a column select value of two. In some examples, the driver 1515-c may be activated based on bank activation (e.g., based on an activation command for the bank that includes the subarray 1505-a), borrowing activation, or a combination thereof. The sense component 1520-c and the main I/O line 1510-c may be coupled based on activating the driver 1515-c. In such cases, sense component 1520-c may exchange data with the host device via activated path 1525-c. For example, the sense component 1520-c may sense data from the subarray 1505-a and route the data to adjacent subarray 1505-b via activated path 1525-c.

Further continuing the example of a column select value of two, sense component 1520-d may be coupled with the main I/O line 1510-d, and the data associated with sense component 1520-d may be exchanged with the host device based on coupling the sense component 1520-d with the main I/O line 1510-d. In some cases, the driver 1515-d may be activated based on the access command corresponding to a column select value of two. In some examples, the driver 1515-d may be activated based on bank activation (e.g., based on an activation command for the bank that includes the subarray 1505-a), borrowing activation, or a combination thereof. The sense component 1520-d and the main I/O line 1510-d may be coupled based on activating the driver 1515-d. In such cases, sense component 1520-d may exchange data with the host device via activated path 1525-d. For example, the sense component 1520-d may sense data from the subarray 1505-d and route the data to adjacent subarray 1505-c via activated path 1525-d.

The configuration of the memory array 1500 may illustrate a reduction in a number of drivers in the memory array 1500 (e.g., relative to configurations illustrated in FIGS. 7 through 14). For example, each main I/O line may be coupled to one driver 1515 per traversed subarray 1505, rather than two. For some column select values, the driver 1515-a may be activated based on a plurality of sense components including sense component 1520-a being activated in which sense component 1520-a may be configured to sense data from the subarray 1505-a. For other column select values, the driver 1515-a may be activated based on a different plurality of sense components (e.g., indicating column select values four, five, six, and seven) being activated, where the different plurality of sense components may be configured to sense data from the subarray 1505-c.

Thus, a single driver (e.g., driver 1515-a) may be activated based on data sensed from more than one subarray (e.g., the subarray 1505-a and the subarray 1505-c). In various other examples, driver 1515-b may be activated based on data sensed from the subarray 1505-a and the subarray 1505-b, driver 1515-c may be activated based on data sensed from the subarray 1505-a and the subarray 1505-b, and driver 1515-d may be activated based on data sensed from the subarray 1505-a and the subarray 1505-c.

In some cases, the subarray 1505-e may be adjacent to subarray 1505-d on one side and not adjacent to another subarray on the other side. Because there may be an absence of drivers or I/O lines coupled with the subarray 1505-e on one side, a loop 1530 may be implemented. In such cases, the loop 1530 may be implemented to loop or route a plurality of sense components including sense component 1520-e with the driver 1515-e. Implementing loop 1530 may reduce the number of drivers in the memory array 1500 and allow the driver 1515-e to be activated regardless if the plurality of sense components including sense component 1520-e is activated or if a different plurality of sense components (e.g., indicating a column select value of four, five, six, and seven) is activated. The loop 1530 may be implemented in alternating subarrays present in the column of the memory array 1500 that may be adjacent to a single subarray in the adjacent column.

The edge of the subarray 1505-e not adjacent to another subarray may be configured to loop the sense component to a driver to sense data from the subarray 1505-e. For example, the sense component 1520-e may be coupled with the main I/O line 1510-e, and the data associated with sense component 1520-e may be exchanged with the host device based on coupling the sense component 1520-e with the main I/O line 1510-e via loop 1530. In some cases, the driver 1515-e may be activated based on the access command corresponding to a column select value of two. In some examples, the driver 1515-e may be activated based on bank activation (e.g., based on an activation command for the bank that includes the subarray 1505-e), borrowing activation, or a combination thereof. The sense component 1520-e and the main I/O line 1510-e may be coupled based on activating the driver 1515-e. In such cases, sense component 1520-e may exchange data with the host device via activated path 1525-e.

Thus, each column of subarrays 1505—and thus each subarray 1505 within a bank—may be traversed by a respective pair of main I/O lines. Within the respective pair of main I/O lines, a first main I/O line may be coupled with two sets of sense components, one set of sense components configured to sense data from the traversed subarray 1505 (and possibly also a neighboring subarray 1505 in a neighboring bank), and the other set of sense components configured to sense data from an adjacent subarray 1505 in the same bank (and possibly also a subarray 1505 in a neighboring bank that is adjacent to the adjacent subarray 1505).

Figure 16:
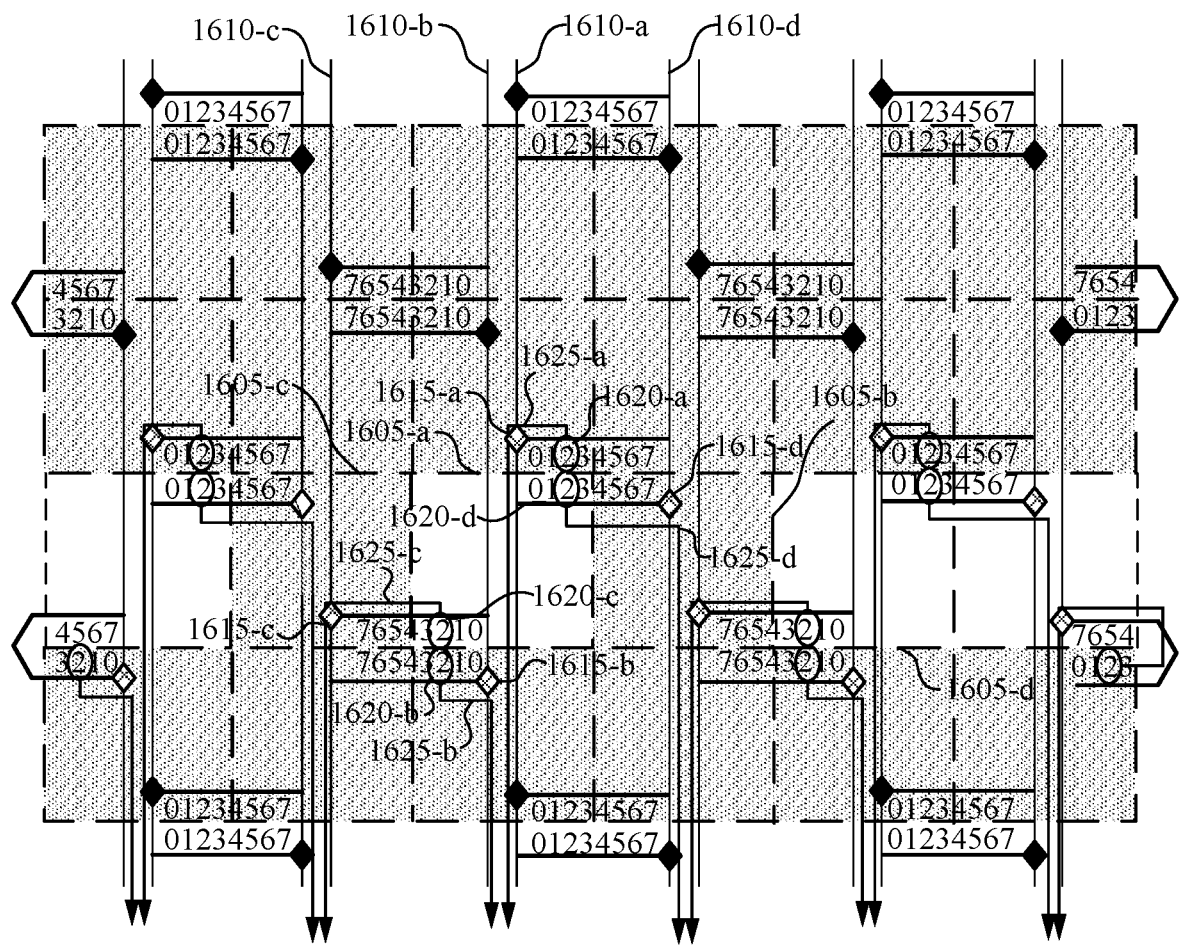
FIG. 16 illustrates an example of aspects of a memory array that supports input/output line sharing for memory subarrays in accordance with examples as disclosed herein.

FIG. 16 illustrates an example of aspects of a memory array 1600 that supports input/output line sharing for memory subarrays in accordance with examples as disclosed herein. The memory array 1600 may include subarrays 1605, main I/O lines 1610, drivers 1615, and sense components 1620. Subarrays 1605, main I/O lines 1610, drivers 1615, and sense components 1620 may be examples of subarrays, main I/O lines, drivers and sense components, respectively, as described with reference to FIGS. 5 through 15. Aspects of the memory array 1600 may be similar or identical to the memory array 1500. The memory array 1600 may illustrate operation according to an alternative configuration (e.g., compared to the configuration of the memory array 1500) for at least the reasons described herein.

In some cases, a memory device that includes the memory array 1600 may receive a command to operate the memory array 1600 in a reduced power mode. The subarray 1605-b and the subarray 1605-c may be deactivated based on operating the memory array 1600 in the reduced power mode. In some cases, the reduced power mode may correspond to a reduced page size and may be referred to as a reduced page mode. When operating in the reduced power mode, the memory device may be configured to activate only a subset of the subarrays in an activated bank, while deactivating other subarrays in the activated bank or (e.g., if already deactivated) maintaining such other subarrays in a deactivated mode. For example, the memory device may be configured to activate only half (or some other fraction) of the subarrays in an activated bank.

For example, for a column select value of two, data flows and driver activations may be the same as described with reference to FIG. 15. However, when the memory array 1600 is in the reduced power mode, the subarray 1605-b and the subarray 1605-c (and other subarrays 1605 associated with a same column address range as the subarray 1605-b and the subarray 1605-c) may be configured to remain deactivated while the subarray 1605-a (and other subarrays 1605 associated with a same column address range as the subarray 1605-a) may be activated. Some subarrays 1605 in the activated bank remaining deactivated may save power during the reduced page mode (e.g., reduced power mode).

By activating some subarrays 1605 and deactivating some subarrays 1605 (e.g., of a row of subarrays 1605), the memory array 1600 may reduce the page size by half as compared to the page size of the memory array 1500 as described with reference to FIG. 15. For example, the memory array 1600 may sense half of the amount of bits as compared to the number of bits sensed by the memory array 1500 (e.g., not sensing memory cells of the deactivated subarrays 1605 that would otherwise be commonly or simultaneously sensed or accessed with the activated subarrays 1605).

In some cases, the memory array 1500 may receive an activation command that indicates an address range for the access command corresponding to the subarray 1605-a. The activation command may be received after the memory array 1500 receives the command to operate in a reduced power mode. A set of subarrays 1605 that includes the subarray 1605-a may be activated based on the address range for an access command corresponding to the subarray 1605-a.

In some examples, a set of subarrays 1605 that includes the subarray 1605-b and the subarray 1605-c may each be maintained in a deactivated mode based on the address range for the access command corresponding to the subarray 1605-a. In such cases, data may not be sensed from the plurality of sense components associated with the subarray 1605-b and the subarray 1605-c. For example, the address range indicated in the access command may not indicate a column select value of four, five, six, or seven.

However, the driver 1615-c and the driver 1615-d may be activated when the subarray 1605-a is activated in the reduced power mode, even though the subarray 1605-c and the subarray 1605-b, respectively, are deactivated. In such cases, the main I/O line 1610-c and the main I/O line 1610-d may still be activated to exchange data with the host device via the driver 1615-c coupled with the main I/O line 1610-c and via the driver 1615-d coupled with the main I/O line 1610-d. Accordingly, despite deactivating some number of subarrays 1605, the memory array 1600 may still support a same quantity of bits of data exchange (e.g., via a data path 350) as a configuration where subarrays 1605 are not deactivated.

Figure 17:
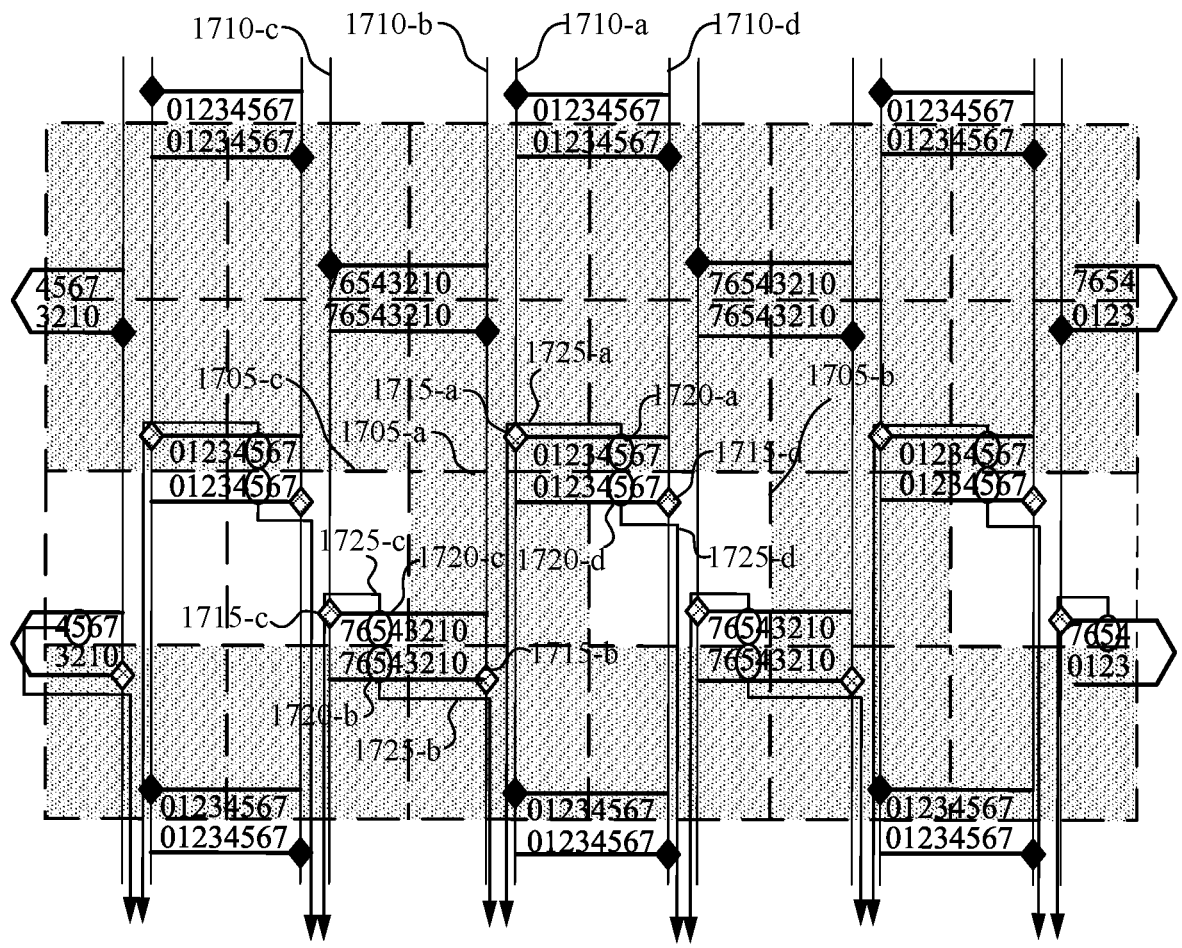
FIG. 17 illustrates an example of aspects of a memory array that supports input/output line sharing for memory subarrays in accordance with examples as disclosed herein.

FIG. 17 illustrates an example of aspects of a memory array 1700 that supports input/output line sharing for memory subarrays in accordance with examples as disclosed herein. The memory array 1500 may include subarrays 1705, main I/O lines 1710, drivers 1715, and sense components 1720. Subarrays 1705, main I/O lines 1710, drivers 1715, and sense components 1720 may be examples of subarrays, main I/O lines, drivers and sense components, respectively, as described with reference to FIGS. 5 through 16. Aspects of the memory array 1700 may be similar or identical to the memory array 1500. The memory array 1700 may illustrate operation according to an alternative configuration (e.g., compared to the configuration of the memory arrays 1500 or 1600) for at least the reasons described herein.

FIG. 17 may illustrate data flows and activated sense components 1720 and drivers 1715 in an example in which the address range indicates a column select value of five, and the sense components 1720-a, 1720-b, 1720-c, and 1720-d of the of sense components may be activated.

In the example of a column select value of five, the drivers 1715-a, 1715-b, 1715-c, and 1715-d may be activated based on the access command corresponding to a column select value of five. In some examples, the drivers 1715-a, 1715-b, 1715-c, and 1715-d may be activated based on bank activation (e.g., based on an activation command for the bank that includes the subarrays 1705-b, 1705-c), borrowing activation, or a combination thereof. The sense component 1720-a and the main I/O line 1710-a may be coupled based on activating the driver 1715-a. In such cases, sense component 1720-a may exchange data with the host device via activated path 1725-a. For example, the sense component 1720-a may sense data from the subarray 1705-b and route the data to adjacent subarray 1705-a via activated path 1725-a.

Continuing the example of a column select value of five, the sense component 1720-b and the main I/O line 1710-b may be coupled based on activating the driver 1715-b. In such cases, sense component 1720-b may exchange data with the host device via activated path 1725-b. For example, the sense component 1720-b may sense data from the subarray 1705-c and route the data to adjacent subarray 1705-a via activated path 1725-b.

Further continuing the example of a column select value of five, the sense component 1720-c and the main I/O line 1710-c may be coupled based on activating the driver 1715-c. In such cases, sense component 1720-c may exchange data with the host device via activated path 1725-c. For example, the sense component 1720-c may sense data from the subarray 1705-c and route the data through subarray 1705-c via activated path 1725-c.

Further continuing the example of a column select value of five, the sense component 1720-d and the main I/O line 1710-d may be coupled based on activating the driver 1715-d. In such cases, sense component 1720-d may exchange data with the host device via activated path 1725-d. For example, the sense component 1720-d may sense data from the subarray 1705-b and route the data through subarray 1705-b via activated path 1725-d.

In some cases, a memory device that includes the memory array 1700 may receive a command to operate the memory array 1700 in a reduced power mode. The subarray 1705-a may be deactivated based on operating the memory array 1700 in the reduced power mode. In some cases, the reduced power mode may correspond to a reduced page size and may be referred to as a reduced page mode. When operating in the reduced power mode, the memory device may be configured to activate only a subset of the subarrays in an activated bank, while deactivating other subarrays in the activated bank or (e.g., if already deactivated) maintaining such other subarrays in a deactivated mode. For example, the memory device may be configured to activate only half (or some other faction) of the subarrays in an activated bank.

For example, when the memory array 1700 is in the reduced power mode, the subarray 1705-b and the subarray 1705-c (and other subarrays 1705 associated with a same column address range as the subarray 1705-b and the subarray 1705-c) may be configured to be activated when the memory array 1700, while the subarray 1705-a (and other subarrays 1705 associated with a same column address range as the subarray 1705-a) may be configured to remain deactivated. Some subarrays 1705 in the activated bank remaining deactivated may save power during the reduced page mode (e.g., reduced power mode).

By activating some subarrays 1705 and deactivating some subarrays 1705 (e.g., of a row of subarrays 1705), memory array 1700 may reduce the page size by half as compared to the page size of the memory array 1500 as described with reference to FIG. 15. For example, the memory array 1700 may sense half of the amount of bits as compared to the number of bits sense by the memory array 1500 (e.g., not sensing memory cells of the deactivated subarrays 1705 that would otherwise be commonly or simultaneously sensed or accessed with the activated subarrays 1705).

In some cases, the memory array 1700 may receive an activation command that indicates an address range for the access command corresponding to the subarray 1705-b and the subarray 1705-c. The activation command may be received after the memory array 1700 receives the command to operate in a reduced power mode. A set of subarrays 1605 that includes the A set of subarrays 1605 that includes the subarray 1705-b and the subarray 1705-c may be activated based on the address range for an access command corresponding to the subarray 1705-b and the subarray 1705-c.

In some examples, a set of subarrays 1605 that includes the subarray 1705-a be maintained in a deactivated mode based on the address range for the access command corresponding to the subarray 1705-b and the subarray 1705-c. In such cases, data may not be sensed from the plurality of sense components associated with the subarray 1705-a. For example, the address range indicated in the access command may not indicate a column select value of zero, one, two, or three.

However, the driver 1715-a and the driver 1715-b may be activated when the subarrays 1705-b and the subarray 1705-c are activated in the reduced power mode, even though the subarray 1705-a is deactivated. In such cases, the main I/O line 1710-a and the main I/O line 1710-b may still be activated to exchange data with the host device via the driver 1715-a coupled with the main I/O line 1710-a and via the driver 1715-b coupled with the main I/O line 1710-b. Accordingly, despite deactivating some number of subarrays 1705, the memory array 1700 may still support a same quantity of bits of data exchange (e.g., via a data path 350) as a configuration where subarrays 1705 are not deactivated.

Thus, when a column select value is within one range within an overall range of column addresses, a main I/O line may carry data for a subarray traversed by the main I/O line, but when the column select value is within a second range within the overall range of column addresses, the main I/O line may carry data for a neighbor subarray. A local I/O line may be coupled with the main I/O line (e.g., via a corresponding driver), and the local I/O line may be coupled with at least two sets of sense components—one set of sense components configured to sense data from the traversed subarray, and one set of sense components configured to sense data from the neighbor subarray. Further, in some cases, when the main I/O line carries data for the neighbor subarray, the traversed subarray may be deactivated for power savings and other benefits.

Figure 18:
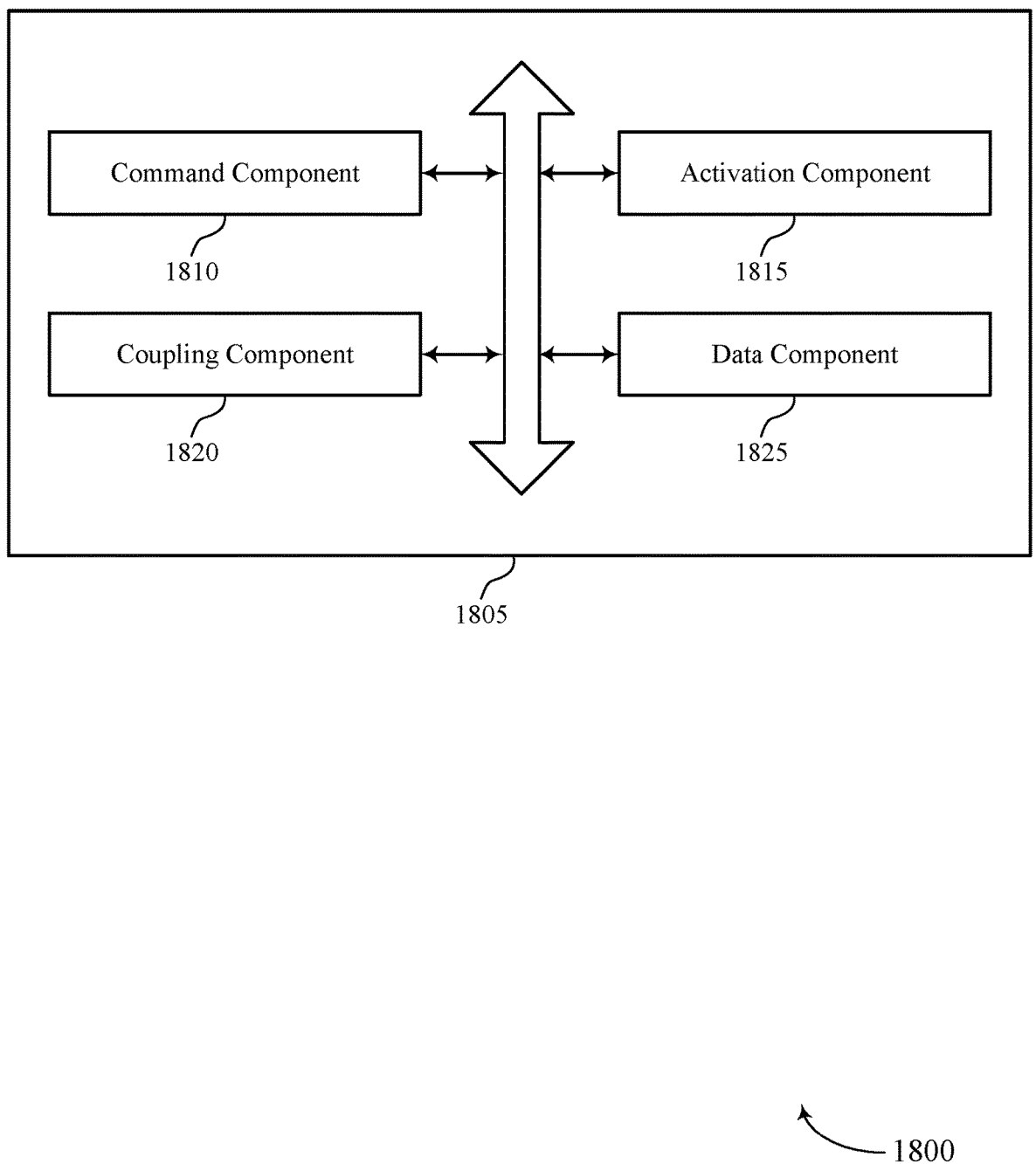
FIG. 18 shows a block diagram of a memory device that supports input/output line sharing for memory subarrays in accordance with the present disclosure.

FIG. 18 shows a block diagram 1800 of a memory device 1805 that supports input/output line sharing for memory subarrays in accordance with examples as disclosed herein. The memory device 1805 may be an example of a memory array as described with reference to FIGS. 5 through 17. The memory device 1805 may include a command component 1810, an activation component 1815, a coupling component 1820, and a data component 1825. Each of these modules may communicate, directly or indirectly, with one another (e.g., via one or more buses).

The command component 1810 may receive, at a memory device including a first subarray and a second subarray, an access command associated with data for the first subarray. In some examples, the command component 1810 may receive, before receiving the access command, an activation command that indicates an address range for the access command as corresponding to the first subarray. In some examples, the command component 1810 may receive, before receiving the activation command, a command to operate the memory device in a reduced power mode. In some examples, the command component 1810 may identify a column address included in the access command, where coupling the first sense component with the first I/O line and the second sense component with the second I/O line is based on identifying the column address.

The activation component 1815 may activate, based on receiving the access command, a first sense component coupled with the first subarray and a second sense component coupled with the first subarray. In some examples, the activation component 1815 may activate a first driver coupled with the first I/O line, where coupling the first sense component with the first I/O line is based on activating the first driver. In some examples, the activation component 1815 may activate a second driver coupled with the second I/O line, where coupling the second sense component with the second I/O line is based on activating the second driver. In some examples, the activation component 1815 may activate the first subarray based on the address range for the access command corresponding to the first subarray.

In some examples, the activation component 1815 may activate a first driver coupled with the first I/O line based on the address range corresponding to the first subarray, where coupling the first sense component with the first I/O line is based on activating the first driver. In some examples, the activation component 1815 may activate a second driver coupled with the second I/O line based on the address range corresponding to the first subarray, where coupling the second sense component with the second I/O line is based on activating the second driver. In some cases, the address range corresponds to a subset of the set of subarrays within the bank for activation, the subset including the first subarray. In some examples, the activation component 1815 may activate the first sense component and the second sense component based on identifying the column address.

The activation component 1815 may maintain the second subarray in a deactivated mode, based at least in part on the address range for the access command corresponding to the first subarray, while coupling the first sense component with the first I/O line and the second sense component with the second I/O line. In some examples, the activation component 1815 may maintain the second subarray in a deactivated mode based on operating the memory device in the reduced power mode.

In some examples, the activation component 1815 may maintain a third driver in a deactivated mode based on the address range corresponding to the first subarray, where the third driver is coupled with the first I/O line and with the second driver. In some examples, the activation component 1815 may maintain one or more sense components coupled with the second subarray, timing circuitry coupled with the second subarray, one or more access line drivers coupled with the second subarray, or any combination thereof in a deactivated mode, based on the access command corresponding to the first subarray.

The coupling component 1820 may couple, based on receiving the access command, the first sense component with a first I/O line that at least partially traverses the first subarray of the memory device and the second sense component with a second I/O line that at least partially traverses the second subarray of the memory device. In some cases, the first subarray and the second subarray are included in a set of subarrays within a bank of the memory device. In some cases, the first I/O line does not traverse the second subarray, and where the second I/O line does not traverse the first subarray.

The data component 1825 may receive or transmit the data for the first subarray based on coupling the first sense component with the first I/O line and the second sense component with the second I/O line. In some examples, the data component 1825 may exchange data between the second sense component and the second I/O line based on activating the second driver and deactivating the third driver. In some cases, the shunt includes a bidirectional data path configured to carry data from the first subarray to the second I/O line when the second driver is activated and to carry data from the second subarray to the first I/O line when the third driver is activated.

Figure 19:
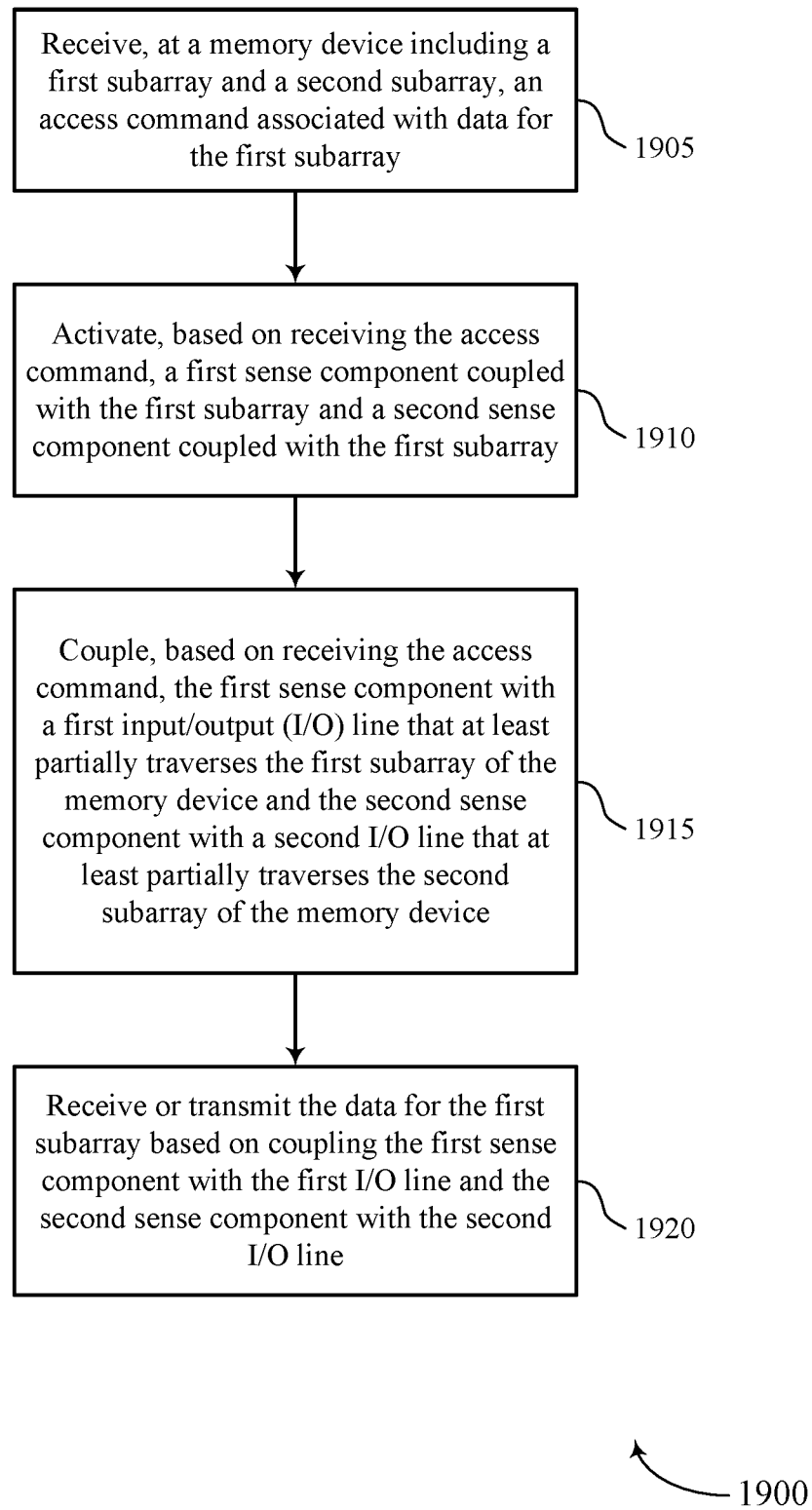
FIG. 19 shows a flowchart illustrating a method or methods that support input/output line sharing for memory subarrays in accordance with examples as disclosed herein.

FIG. 19 shows a flowchart illustrating a method or methods 1900 that supports input/output line sharing for memory subarrays in accordance with the present disclosure. The operations of method 1900 may be implemented by a memory array or its components as described herein. For example, the operations of method 1900 may be performed by a memory array as described with reference to FIG. 18. In some examples, a memory array may execute a set of instructions to control the functional elements of the memory array to perform the described functions. Additionally or alternatively, a memory array may perform the described functions using special-purpose hardware.

At 1905, the memory array may receive, at a memory device including a first subarray and a second subarray, an access command associated with data for the first subarray. The operations of 1905 may be performed according to the methods described herein. In some examples, the operations of 1905 may be performed by a command component as described with reference to FIG. 18.

At 1910, the memory array may activate, based on receiving the access command, a first sense component coupled with the first subarray and a second sense component coupled with the first subarray. The operations of 1910 may be performed according to the methods described herein. In some examples, the operations of 1910 may be performed by an activation component as described with reference to FIG. 18.

At 1915, the memory array may couple, based on receiving the access command, the first sense component with a first I/O line that at least partially traverses the first subarray of the memory device and the second sense component with a second I/O line that at least partially traverses the second subarray of the memory device. The operations of 1915 may be performed according to the methods described herein. In some examples, the operations of 1915 may be performed by a coupling component as described with reference to FIG. 18.

At 1920, the memory array may receive or transmit the data for the first subarray based on coupling the first sense component with the first I/O line and the second sense component with the second I/O line. The operations of 1920 may be performed according to the methods described herein. In some examples, the operations of 1920 may be performed by a data component as described with reference to FIG. 18.

In some examples, an apparatus as described herein may perform a method or methods, such as the method 1900. The apparatus may include features, means, or instructions (e.g., a non-transitory computer-readable medium storing instructions executable by a processor) for receiving, at a memory device including a first subarray and a second subarray, an access command associated with data for the first subarray, activating, based on receiving the access command, a first sense component coupled with the first subarray and a second sense component coupled with the first subarray, coupling, based on receiving the access command, the first sense component with a first I/O line that at least partially traverses the first subarray of the memory device and the second sense component with a second I/O line that at least partially traverses the second subarray of the memory device, and receiving or transmitting the data for the first subarray based on coupling the first sense component with the first I/O line and the second sense component with the second I/O line.

Some examples of the method 1900 and the apparatus described herein may further include operations, features, means, or instructions for activating a first driver coupled with the first I/O line, where coupling the first sense component with the first I/O line may be based on activating the first driver, and activating a second driver coupled with the second I/O line, where coupling the second sense component with the second I/O line may be based on activating the second driver.

Some examples of the method 1900 and the apparatus described herein may further include operations, features, means, or instructions for exchanging data between the second sense component and the second I/O line based on activating the second driver and deactivating the third driver.

In some examples of the method 1900 and the apparatus described herein, the shunt includes a bidirectional data path configured to carry data from the first subarray to the second I/O line when the second driver may be activated and to carry data from the second subarray to the first I/O line when the third driver may be activated.

Some examples of the method 1900 and the apparatus described herein may further include operations, features, means, or instructions for receiving, before receiving the access command, an activation command that indicates an address range for the access command as corresponding to the first subarray, activating the first subarray based on the address range for the access command corresponding to the first subarray, and maintaining the second subarray in a deactivated mode, based at least in part on the address range for the access command corresponding to the first subarray, while coupling the first sense component with the first I/O line and the second sense component with the second I/O line.

Some examples of the method 1900 and the apparatus described herein may further include operations, features, means, or instructions for receiving, before receiving the activation command, a command to operate the memory device in a reduced power mode, wherein maintaining the second subarray in the deactivated mode is based on operating the memory device in the reduced power mode.

In some examples of the method 1900 and the apparatus described herein, the first subarray and the second subarray may be included in a set of subarrays within a bank of the memory device, and the address range may correspond to a subset of the set of subarrays within the bank for activation, the subset including the first subarray.

Some examples of the method 1900 and the apparatus described herein may further include operations, features, means, or instructions for activating a first driver coupled with the first I/O line based on the address range corresponding to the first subarray, where coupling the first sense component with the first I/O line may be based on activating the first driver, and activating a second driver coupled with the second I/O line based on the address range corresponding to the first subarray, where coupling the second sense component with the second I/O line may be based on activating the second driver.

Some examples of the method 1900 and the apparatus described herein may further include operations, features, means, or instructions for maintaining a third driver in a deactivated mode based on the address range corresponding to the first subarray, where the third driver may be coupled with the first I/O line and with the second driver.

Some examples of the method 1900 and the apparatus described herein may further include operations, features, means, or instructions for maintaining a sense component coupled with the second subarray, timing circuitry coupled with the second subarray, an access line driver coupled with the second subarray, or any combination thereof in a deactivated mode, based at least in part on the address range corresponding to the first subarray.

Some examples of the method 1900 and the apparatus described herein may further include operations, features, means, or instructions for identifying a column address included in the access command, where coupling the first sense component with the first I/O line and the second sense component with the second I/O line may be based on identifying the column address.

Some examples of the method 1900 and the apparatus described herein may further include operations, features, means, or instructions for activating the first sense component and the second sense component may be based on identifying the column address.

In some examples of the method 1900 and the apparatus described herein, the first I/O line does not traverse the second subarray, and where the second I/O line does not traverse the first subarray.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array including a first subarray and a second subarray, a first I/O line at least partially traversing the first subarray, a second I/O line at least partially traversing the second subarray, a first driver coupled with the first I/O line, a second driver coupled with the second I/O line, and a shunt coupled with the first driver and the second driver and configured to carry data from the first subarray to the second I/O line when the second driver is activated and to carry data from the second subarray to the first I/O line when the first driver is activated.

In some examples, a first sense component coupled with the shunt and configured to sense data from the first subarray, where the second driver may be configured to be activated based on the first sense component being activated, and a second sense component coupled with the shunt and configured to sense data from the second subarray, where the first driver may be configured to be activated based on the second sense component being activated.

In some examples, the first driver may be configured to be activated based on commands indicating column addresses within a first range, and the second driver may be configured to be activated based on commands indicating column addresses within a second range.

Some examples may further include one of the first subarray or the second subarray may be configured to be activated when the device may be in a reduced power mode, and another of the first subarray or the second subarray may be configured to be deactivated when the device may be in the reduced power mode.

In some examples, the first driver may be configured to be activated when the second subarray may be activated in the reduced power mode, and the second driver may be configured to be activated when the first subarray may be activated in the reduced power mode.

In some examples, the device may be configured to enter the reduced power mode based on a command indicating a reduced page size.

In some examples, the first subarray and the second subarray may be in a bank of the memory array, and where the device may be configured to deactivate a fraction of subarrays included in the bank when the device may be in the reduced power mode.

In some examples, the memory array includes a set of subarrays arranged as rows and columns, the first I/O line traverses a first set of subarrays in a first column that includes the first subarray, the second I/O line traverses a second set of subarrays in a second column that includes the second subarray, and the first subarray and the second subarray may be in a same row.

In some examples, the shunt may be configured to carry data from the first subarray to the second I/O line when the first driver may be deactivated and to carry data from the second subarray to the first I/O line when the second driver may be deactivated.

An apparatus is described. The apparatus may include a memory array including a set of subarrays, where a first subarray of the set is between a second subarray of the set and a third subarray of the set and a set of I/O lines, where a first I/O line of the set and a second I/O line of the set at least partially traverse the first subarray, the first I/O line is coupled with a first set of sense components configured to sense data from the first subarray and a second set of sense components configured to sense data from the second subarray, and the second I/O line is coupled with a third set of sense components configured to sense data from the first subarray and a fourth set of sense components configured to sense data from the third subarray.

In some examples, the apparatus may include a plurality of pairs of I/O lines, wherein each pair of I/O lines of the plurality traverses at least a respective subarray of the plurality, and wherein a first I/O line of each pair is coupled with a first respective set of sense components configured to sense data from the respective subarray and a second set of sense components configured to sense data from a first other subarray of the plurality, and wherein a second I/O line of each pair is coupled with a third respective set of sense components configured to sense data from the respective subarray and a fourth set of sense components configured to sense data from a second other subarray of the plurality.

In some examples, the first and third sets of sense components correspond to a first subset of a range of column addresses, and the second and fourth sets of sense components correspond to a second subset of the range of column addresses.

In some examples, the device may be configured to activate one of a first subset of the set of subarrays or a second subset of the set of subarrays when the device may be in a first power mode, the device may be configured to deactivate the other of the first subset of the set of subarrays or the second subset of the set of subarrays when the device may be in a first power mode, the first subarray may be in the first subset, and the second subarray and the third subarray may be in the second subset.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, from a host device and at a memory device comprising a first subarray and a second subarray, a single access command associated with data for the first subarray;
   activating, based at least in part on receiving the single access command, a first sense component coupled with the first subarray and a second sense component coupled with the first subarray;
   coupling, based at least in part on receiving the single access command, the first sense component with a first input/output (I/O) line that at least partially traverses the first subarray of the memory device and the second sense component with a second I/O line that at least partially traverses the second subarray of the memory device; and
   receiving or transmitting the data for the first subarray based at least in part on coupling the first sense component with the first I/O line and the second sense component with the second I/O line.

2. The method of claim 1, further comprising:
   activating a first driver coupled with the first I/O line, wherein coupling the first sense component with the first I/O line is based at least in part on activating the first driver; and
   activating a second driver coupled with the second I/O line, wherein coupling the second sense component with the second I/O line is based at least in part on activating the second driver.

3. The method of claim 2, wherein the second driver is coupled with a third driver via a shunt, and wherein the third driver is coupled with the first I/O line, further comprising:
   exchanging data between the second sense component and the second I/O line based at least in part on activating the second driver and deactivating the third driver.

4. The method of claim 3, wherein the shunt comprises a bidirectional data path configured to carry data from the first subarray to the second I/O line when the second driver is activated and to carry data from the second subarray to the first I/O line when the third driver is activated.

5. The method of claim 1, further comprising:
receiving, before receiving the single access command, an activation command that indicates an address range for the single access command as corresponding to the first subarray;
activating the first subarray based at least in part on the address range for the single access command corresponding to the first subarray; and
maintaining the second subarray in a deactivated mode, based at least in part on the address range for the single access command corresponding to the first subarray, while coupling the first sense component with the first I/O line and the second sense component with the second I/O line.

6. The method of claim 5, further comprising:
receiving, before receiving the activation command, a command to operate the memory device in a reduced power mode, wherein maintaining the second subarray in the deactivated mode is based at least in part on operating the memory device in the reduced power mode.

7. The method of claim 5, wherein:
the first subarray and the second subarray are included in a plurality of subarrays within a bank of the memory device; and
the address range corresponds to a subset of the plurality of subarrays within the bank for activation, the subset including the first subarray.

8. The method of claim 5, further comprising:
activating a first driver coupled with the first I/O line based at least in part on the address range corresponding to the first subarray, wherein coupling the first sense component with the first I/O line is based at least in part on activating the first driver; and
activating a second driver coupled with the second I/O line based at least in part on the address range corresponding to the first subarray, wherein coupling the second sense component with the second I/O line is based at least in part on activating the second driver.

9. The method of claim 8, further comprising:
maintaining a third driver in the deactivated mode based at least in part on the address range corresponding to the first subarray, wherein the third driver is coupled with the first I/O line and with the second driver.

10. The method of claim 5, further comprising:
maintaining a sense components coupled with the second subarray, timing circuitry coupled with the second subarray, an access line driver coupled with the second subarray, or any combination thereof in the deactivated mode, based at least in part on the address range corresponding to the first subarray.

11. The method of claim 1, further comprising:
identifying a column address included in the single access command, wherein coupling the first sense component with the first I/O line and the second sense component with the second I/O line is based at least in part on identifying the column address.

12. The method of claim 11, wherein:
activating the first sense component and the second sense component is based at least in part on identifying the column address.

13. The method of claim 1, wherein the first I/O line does not traverse the second subarray, and wherein the second I/O line does not traverse the first subarray.

14. A device, comprising:
a memory array comprising a first subarray and a second subarray;
a first input/output (I/O) line at least partially traversing the first subarray;
a second I/O line at least partially traversing the second subarray;
a first driver coupled with the first I/O line;
a second driver coupled with the second I/O line; and
a shunt coupled with the first driver and the second driver and configured to carry data from the first subarray to the second I/O line when the second driver is activated and to carry data from the second subarray to the first I/O line when the first driver is activated.

15. The device of claim 14, further comprising:
a first sense component coupled with the shunt and configured to sense data from the first subarray, wherein the second driver is configured to be activated based at least in part on the first sense component being activated; and
a second sense component coupled with the shunt and configured to sense data from the second subarray, wherein the first driver is configured to be activated based at least in part on the second sense component being activated.

16. The device of claim 14, wherein:
the first driver is configured to be activated based at least in part on commands indicating column addresses within a first range; and
the second driver is configured to be activated based at least in part on commands indicating column addresses within a second range.

17. The device of claim 14, wherein:
one of the first subarray or the second subarray is configured to be activated when the device is in a reduced power mode; and
another of the first subarray or the second subarray is configured to be deactivated when the device is in the reduced power mode.

18. The device of claim 17, wherein:
the first driver is configured to be activated when the second subarray is activated in the reduced power mode; and
the second driver is configured to be activated when the first subarray is activated in the reduced power mode.

19. The device of claim 17, wherein the device is configured to enter the reduced power mode based at least in part on a command indicating a reduced page size.

20. The device of claim 17, wherein the first subarray and the second subarray are in a bank of the memory array, and wherein the device is configured to deactivate a fraction of subarrays included in the bank when the device is in the reduced power mode.

21. The device of claim 14, wherein:
the memory array comprises a plurality of subarrays arranged as rows and columns;
the first I/O line traverses a first plurality of subarrays in a first column that includes the first subarray;
the second I/O line traverses a second plurality of subarrays in a second column that includes the second subarray; and
the first subarray and the second subarray are in a same row.

22. The device of claim 14, wherein the shunt is configured to carry data from the first subarray to the second I/O line when the first driver is deactivated and to carry data from the second subarray to the first I/O line when the second driver is deactivated.

23. A device, comprising:
- a memory array comprising a plurality of subarrays, wherein a first subarray of the plurality is between a second subarray of the plurality and a third subarray of the plurality;
- a plurality of input/output (I/O) lines, wherein;
- a first I/O line of the plurality and a second I/O line of the plurality at least partially traverse the first subarray;
- the first I/O line is coupled with a first set of sense components configured to sense data from the first subarray and a second set of sense components configured to sense data from the second subarray; and
- the second I/O line is coupled with a third set of sense components configured to sense data from the first subarray and a fourth set of sense components configured to sense data from the third subarray.

24. The device of claim 23, wherein:
- the first and third sets of sense components correspond to a first subset of a range of column addresses; and
- the second and fourth sets of sense components correspond to a second subset of the range of column addresses.

25. The device of claim 23, wherein:
- the device is configured to activate one of a first subset of the plurality of subarrays or a second subset of the plurality of subarrays when the device is in a first power mode;
- the device is configured to deactivate the other of the first subset of the plurality of subarrays or the second subset of the plurality of subarrays when the device is in the first power mode;
- the first subarray is in the first subset; and
- the second subarray and the third subarray are in the second subset.

* * * * *